United States Patent
Ohkawa

(10) Patent No.: US 7,391,453 B2
(45) Date of Patent: Jun. 24, 2008

(54) SOLID-STATE IMAGE SENSOR AND IMAGE READING METHOD

(75) Inventor: Narumi Ohkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 725 days.

(21) Appl. No.: 10/623,418

(22) Filed: Jul. 21, 2003

(65) Prior Publication Data

US 2004/0141077 A1    Jul. 22, 2004

(30) Foreign Application Priority Data

Sep. 2, 2002    (JP) .............................. 2002-257131

(51) Int. Cl.
*H04N 3/14*    (2006.01)
*H04N 5/335*    (2006.01)
*H01L 31/062*    (2006.01)
*H01L 27/00*    (2006.01)

(52) U.S. Cl. .................. 348/302; 348/294; 257/291; 250/208.1

(58) Field of Classification Search ............. 348/302, 348/308; 257/291
See application file for complete search history.

(56) References Cited

U.S. PATENT DOCUMENTS

| | | | |
|---|---|---|---|
| 6,005,619 A | 12/1999 | Fossum | 348/315 |
| 6,160,281 A * | 12/2000 | Guidash | 257/292 |
| 6,466,266 B1 * | 10/2002 | Guidash et al. | 348/308 |
| 6,657,665 B1 * | 12/2003 | Guidash | 257/E27.132 |
| 6,956,605 B1 * | 10/2005 | Hashimoto | 257/E27.132 |
| 6,977,684 B1 * | 12/2005 | Hashimoto et al. | 250/208.1 |
| 7,081,607 B1 * | 7/2006 | Koizumi | 348/302 |

FOREIGN PATENT DOCUMENTS

| | | |
|---|---|---|
| JP | 2000-152086 | 5/2000 |
| JP | 2000-201300 | 7/2000 |
| JP | 2000-260971 | 9/2000 |
| JP | 2001-177765 | 6/2001 |
| JP | 2002-077731 | 3/2002 |

OTHER PUBLICATIONS

Office Action dated Nov. 22, 2005 issued in corresponding Japanese Application No. 2002-257131.

* cited by examiner

*Primary Examiner*—Nhan T. Tran
(74) *Attorney, Agent, or Firm*—Westerman, Hattori, Daniels & Adrian, LLP.

(57) ABSTRACT

In the solid-state image sensor comprising 4-Tr-pixels, TG lines connecting the gate electrodes $28_{TG}$ of the transfer transistors of the pixel units of the $n^{th}$ row, and select lines connecting the gate electrodes $28_{SEL}$ of the select transistors of the pixel units of the $n+1^{th}$ row are formed of a common signal line, and the gate electrodes $28_{TG}$ of the pixels of the $n^{th}$ row and the gate electrodes $28_{SEL}$ of the pixel units of the $n+1^{th}$ row are formed in one continuous pattern of the same conducting layer. Whereby allowance can be given to layouts of the metal interconnection layers. Accordingly, the floating diffusions FD can be effectively shielded from light. Furthermore, allowance can be given to the area. Accordingly, the floating diffusions FD can have the area increased, whereby the junction leakage can be reduced.

7 Claims, 63 Drawing Sheets

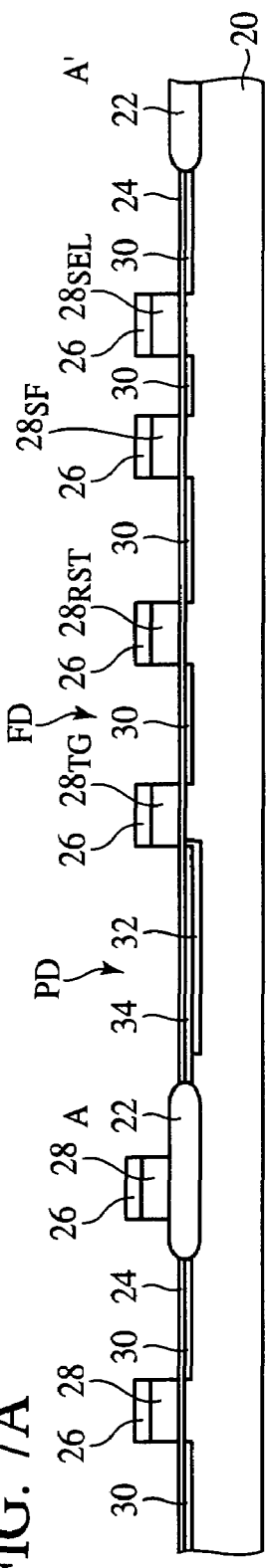
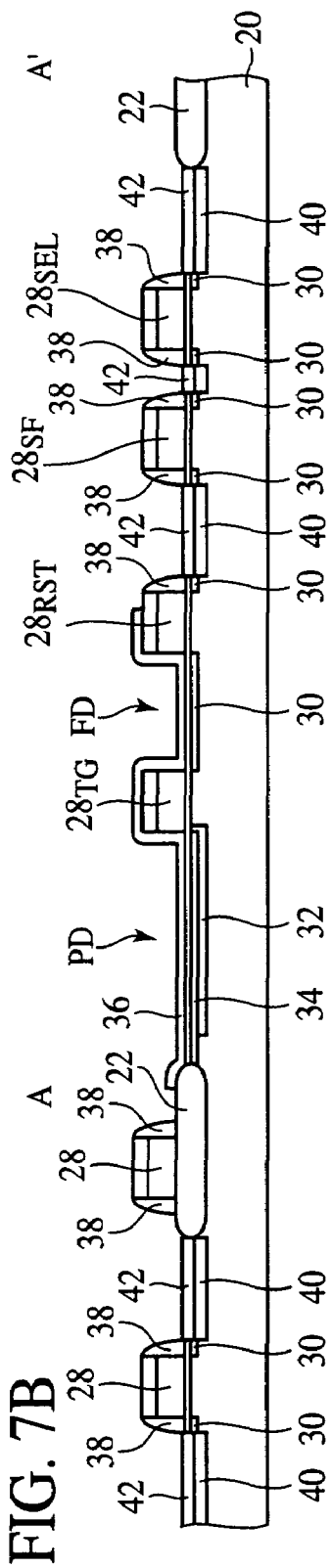
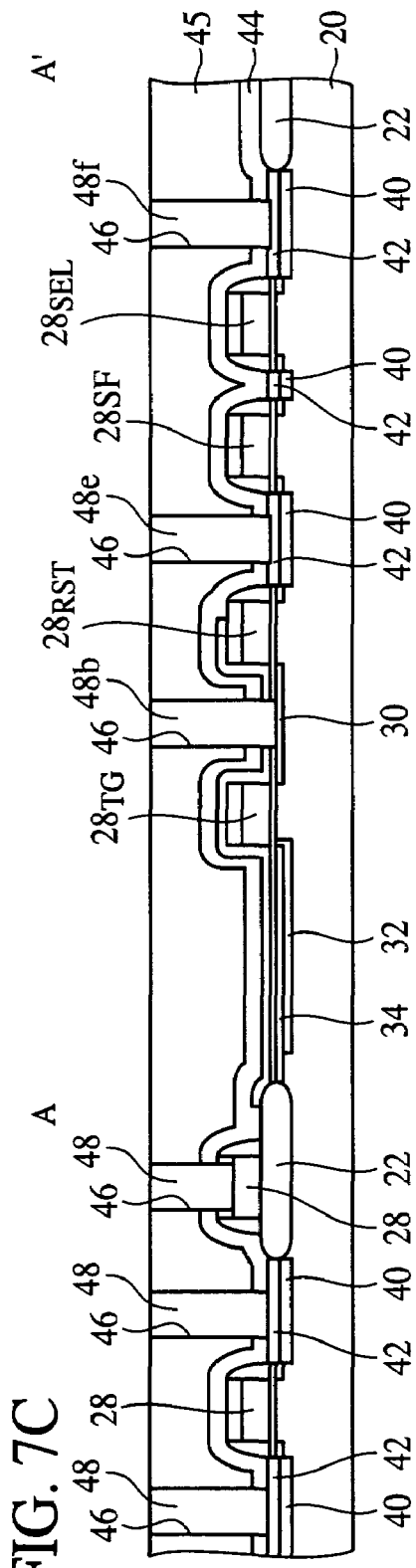
FIG. 7A
FIG. 7B
FIG. 7C

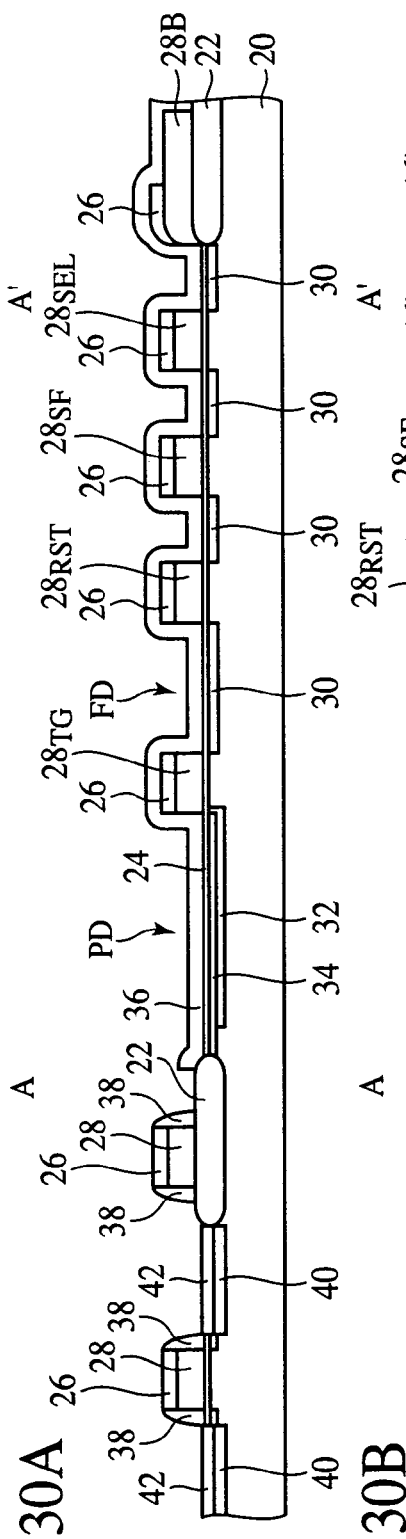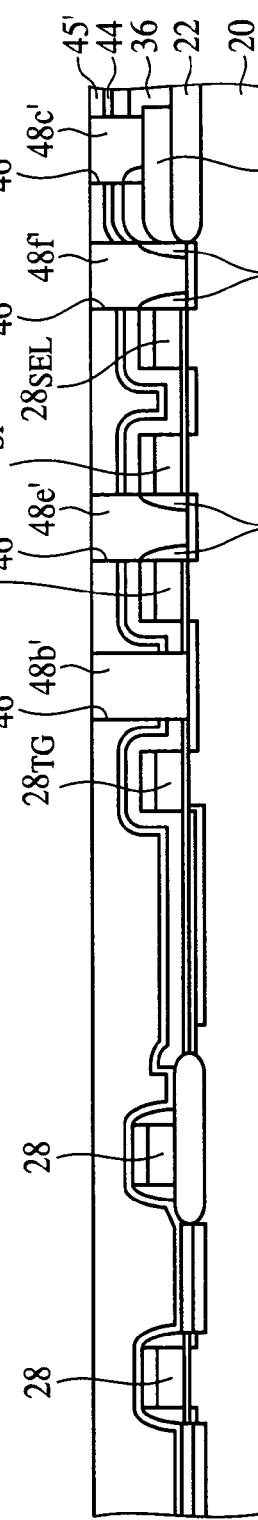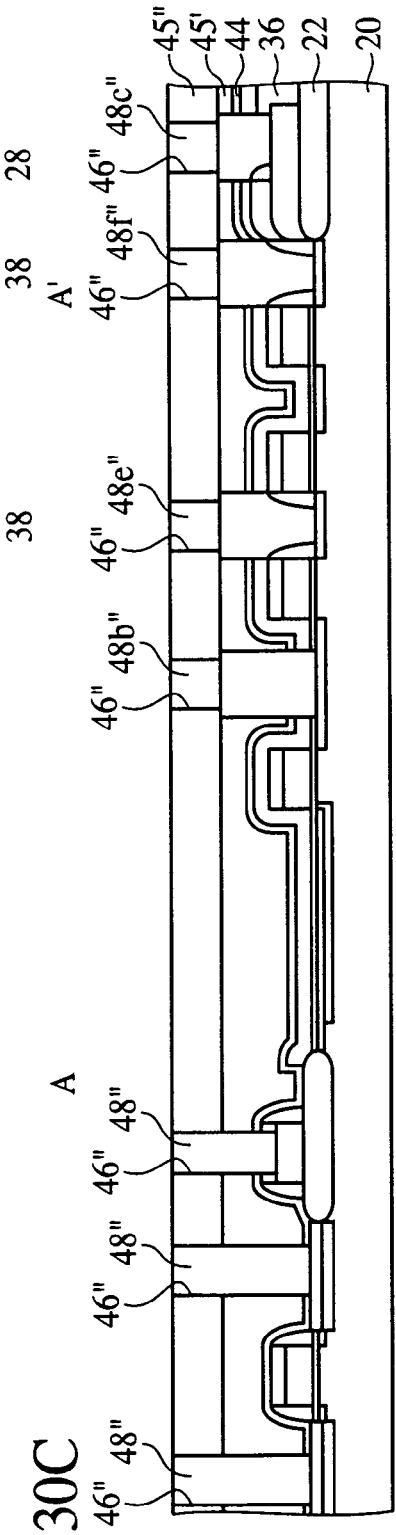

SOLID-STATE IMAGE SENSOR AND IMAGE READING METHOD

CROSS-REFERENCE TO RELATED APPLICATIONS

This application is based upon and claims the benefit of priority from the prior Japanese Patent Application No. 2002-257131, filed in Sep. 2, 2002, the entire contents of which are incorporated herein by reference.

BACKGROUND OF THE INVENTION

The present invention relates to a solid-state image sensor and an image reading method, more specifically a solid-state image sensor having 4-Tr-pixels and an image reading method for the solid-state image sensor.

Solid-state image sensors basically formed of CMOS generally use the structure called APS (Active Pixel Sensor), which comprises photodiodes for converting optical signals to electric signals, reset transistors for resetting the photodiodes, source follower transistors for converting signal charges of the photodiodes to voltages to output the signal charges in voltage, and select transistors for connecting/selecting pixels and signal lines. Solid-state image sensors formed of the above-described three kinds of transistors, the so-called 3-Tr-pixel solid-state image sensors are described in, e.g., Reference 1 (Japanese published unexamined patent application No. 2002-077731), etc.

It is said that the solid-state image sensors having 3-Tr-pixels are vulnerable to noises due to thermal noises (kTC noises). The structure called 4-Tr-pixel which can remove even the kTC noises has been proposed. The solid-state image sensor having 4-Tr-pixels has the structure further comprising transfer transistors (transfer gates) between the reset transistors and the photodiodes, and an n-type diffused layer (FD: Floating Diffusion) between the reset transistors and the transfer transistors is connected to the gates of the source follower transistors. The solid-state image sensors having the 4-Tr-pixels are described in, e.g., Reference 2 (Japanese published unexamined patent application No. 2000-201300), Reference 3 (Japanese published unexamined patent application No. 2000-260971), and Reference 4 (Japanese published unexamined patent application No. 2001-177765). Solid-state image sensors having other pixel structures are described in, e.g., Reference 5 (Japanese published unexamined patent application No. 2000-152086) and Reference 6 (Specification of U.S. Pat. No. 6,005,619).

FIG. 62 is a circuit diagram of the solid-state image sensor having 4-Tr-pixels. In FIG. 62, a pixel array unit 100 is represented by 2×2 unit pixels.

Each pixel is formed of a photodiode PD, a transfer transistor TG, a reset transistor RST, a source follower transistor SF-Tr, and a select transistor SELECT.

The cathode terminal of the photodiode PD is connected to the source terminal of the transfer transistor TG. The anode terminal of the photodiode PD is grounded. The drain terminal of the transfer transistor TG is connected to the source terminal of the reset transistor RST and the gate terminal of the source follower transistor SF-Tr. An impurity diffused region which stores charges transferred from the photodiode PD is present in the region where the drain terminal of the transfer transistor TG is connected to the source terminal of the reset transistor RST and the gate terminal of the source follower transistor SF-Tr. The impurity diffused region will be hereinafter called a floating diffusion FD. The source terminal of the source follower transistor SF-Tr is connected to the drain terminal of the select transistor SELECT.

The respective pixels adjacent to each other in the row direction are connected to a transfer gate (TG) line which commonly connects the gate terminals of the transfer transistors TG, to a reset (RST) line which commonly connects the gate terminals of the reset transistors RST, and to a select line which commonly connects the gate terminals of the select transistor SELECT.

The respective pixels adjacent to each other in the column direction are connected to a signal read line which commonly connects the source terminals of the select transistors SELECT and to a VR (reset voltage) line which commonly connects the drain terminals of the reset transistors RST and the drain terminals of the source follower transistors SF-Tr.

The TG lines, the RST lines and the select lines are connected to a row selecting circuit 102. The signal read lines are connected to a signal read/noise canceller circuit 104. The signal read/noise canceller circuit 104 is connected to an output circuit 108 via an AD converter 106. The VR lines are connected to an electric power source whose voltage is substantially a source voltage or an electric power source whose voltage is decreased in the chip.

Then, the image reading method of the solid-state image sensor shown in FIG. 62 will be explained with reference to FIG. 63. FIG. 63 is a timing chart explaining the image reading method of the solid-state image sensor. Positive voltages are taken on the vertical axis, and time is taken on the horizontal axis.

In the reset state, the photodiode PD has a prescribed reference voltage reflecting a reset voltage VR. When light is incident on the photodiode PD, electrons are generated, and the voltage of the photodiode PD is gradually decreased.

Then, when the reset signal is applied to the RST line, the floating diffusions FD are reset, and voltage of the floating diffusions FD is stabilized at a prescribed value. This voltage is applied to the gate terminal of the source follower transistor SF-Tr. In this state, the select signal is applied to the select line, and a voltage corresponding to the reset voltage VR−the threshold voltage $V_{th}$ is outputted to the signal read line (VR read).

Next, a signal is applied to the TG line to turn on the transfer transistor TG, and the electrons stored in the photodiode PD are transferred to the floating diffusion FD. Thus, the voltage of the floating diffusion FD is lowered while potential of the photodiode PD becomes said reference voltage.

The voltage of the floating diffusion FD is lowered to thereby lower voltage to be applied to the gate terminal of the source follower transistor SF-Tr. In this state, when a select signal is again applied to the select line, a voltage decreased by voltage change amounts $\Delta V$ corresponding to electron amounts stored in the photodiode PD, i.e., the reset voltage VR−the threshold voltage $V_{th}$−the voltage change amounts $\Delta V$ is outputted to the signal read line ($V_{signal}$ read).

Next, difference between the VR read voltage (VR−$V_{th}$) and the $V_{signal}$ read voltage (VR−$V_{th}$−$\Delta V$) is given by the signal read/noise canceller circuit 102 to thereby give the voltage change amounts $\Delta V$. Thus, output voltage variations of the source follower transistors SF-Tr of the respective pixels due to the threshold voltage variations are cancelled, and voltage variation amounts $\Delta V$ corresponding to the electron amounts stored in the photodiodes PD can be correctly read.

A string of the reading operations described above is made sequentially on the respective pixels, and optical signals detected by the photodiodes PD can be read.

The solid-state image sensor having 4-Tr-pixels, which has more constituent elements than the solid-state image sensor having 3-Tr-pixels has risks of lower yields, etc. An area occupied by the photodiode PD in a pixel is decreased. From these viewpoints, Reference 4 proposes that signal lines are commonly used by adjacent pixels. In Reference 4, the RST line and the select line, the RST line and the TG line, or the TG line and the select line are commonly used by adjacent pixels for a decreased number of lines and higher yields.

However, Reference 4 neither teaches nor suggests a specific layout of pixels. In the above-described image reading method, charges from the photodiode PD of each row are transferred to the floating diffusion FD and read. This operation is made sequentially for the other rows, which often causes "deflections" and "distortions" due to detection time lags among the rows.

SUMMARY OF THE INVENTION

An object of the present invention is to provide a solid-state image sensor having 4-Tr-pixels which has high freedom of laying out interconnection layers and can readily increase the area of the photodiodes and the floating diffusions.

Another object of the present invention is to provide a solid-state image sensor having 4-Tr-pixels and an image reading method which can obtain good images without "deflections" and "distortions".

According to one aspect of the present invention, there is provided a solid-state image sensor comprising: a plurality of pixel units arranged in a row direction and a column direction, each of the plurality of pixel units including a photoelectric converter, a first transistor for transferring a signal generated by the photoelectric converter, a second transistor for amplifying the signal, a third transistor for resetting an input terminal of the second transistor, and a fourth transistor for reading the signal outputted by the second transistor; a plurality of first signal lines extended in the row direction, each of the first signal lines being connected to gate electrodes of the first transistors of the pixel units arranged in the row direction; and a plurality of second signal lines extended in the row direction, each of the second signal lines being connected to gate electrodes of the fourth transistors of the pixel units arranged in the row direction, the first signal line connected to the gate electrodes of the first transistors of the pixel units of an $n^{th}$ row, and the second signal line connected to the gate electrodes of the fourth transistors of the pixel units of an $n+1^{th}$ row being formed of a common signal line, and in each pairs of the pixel units of the $n^{th}$ row and the $n+1^{th}$ row corresponding to each other, the gate electrode of the first transistor of the pixel unit of the $n^{th}$ row and the gate electrode of the fourth transistor of the pixel unit of the $n+1^{th}$ row being formed in one continuous pattern of the same conducting layer.

According to another aspect of the present invention, there is provided a solid-state image sensor comprising: a plurality of pixel units arranged in a row direction and a column direction, each of the plurality of pixel units including a photoelectric converter, a first transistor for transferring a signal generated by the photoelectric converter, a second transistor for amplifying the signal, a third transistor for resetting an input terminal of the second transistor, and a fourth transistor for reading the signal outputted by the second transistor; a plurality of first signal lines extended in the row direction, each of the first signal lines being connected to gate electrodes of the third transistors of the pixel units arranged in the row direction; and a plurality of second signal lines extended in the row direction, each of the second signal lines being connected to gate electrodes of the fourth transistors of the pixel units arranged in the row direction, the first signal line connected to the gate electrodes of the third transistors of the pixel units of an $n^{th}$ row, and the second signal line connected to the gate electrodes of the fourth transistors of the pixel units of an $n+1^{th}$ row being formed of a common signal line, and in each pairs of the pixel units of the $n^{th}$ row and the $n+1^{th}$ row corresponding to each other, the gate electrode of the third transistor of the pixel unit of the $n^{th}$ row and the gate electrode of the fourth transistor of the pixel unit of the $n+1^{th}$ row being formed in one continuous pattern of the same conducting layer.

According to further another aspect of the present invention, there is provided a solid-state image sensor comprising: a plurality of pixel units arranged in a row direction and a column direction, each of the plurality of pixel units including a photoelectric converter, a first transistor for transferring a signal generated by the photoelectric converter, a second transistor for amplifying the signal, a third transistor for resetting an input terminal of the second transistor, and a fourth transistor for reading the signal outputted by the second transistor; a plurality of first signal lines extended in the row direction, each of the first signal lines being connected to gate electrodes of the first transistors of the pixel units arranged in the row direction; and a plurality of second signal lines extended in the row direction, each of the second signal lines being connected to gate electrodes of the third transistors of the pixel units arranged in the row direction, the first signal line connected to the gate electrodes of the first transistors of the pixel units of an $n^{th}$ row, and the second signal line connected to the gate electrodes of the third transistors of the pixel units of an $n+1^{th}$ row being formed of a common signal line, and in each pairs of the pixel units of the $n^{th}$ row and the $n+1^{th}$ row corresponding to each other, the gate electrode of the first transistor of the pixel unit of the $n^{th}$ row and the gate electrode of the third transistor of the pixel unit of the $n+1^{th}$ row being formed in one continuous pattern of the same conducting layer.

According to further another aspect of the present invention, there is provided a solid-state image sensor comprising: a plurality of pixel units arranged in a row direction and a column direction, each of the plurality of pixel units including a photoelectric converter, a first transistor for transferring a signal generated by the photoelectric converter, a second transistor for amplifying the signal, a third transistor for resetting an input terminal of the second transistor, and a fourth transistor for reading the signal outputted by the second transistor, the photoelectric converter and the first transistor being adjacent to each other in the column direction, the second transistor, the third transistor, and the fourth transistor being adjacent to each other in the column direction, a gate electrode of the first transistor, a gate electrode of the second transistor, a gate electrode of the third transistor, and a gate electrode of the fourth transistor being extended in the row direction, and a first region where the photoelectric converter and the first transistor are formed, and a second region where the second to the fourth transistors are formed are relatively diagonally adjacent to each other.

According to further another aspect of the present invention, there is provided an image reading method for a solid-state image sensor comprising: a plurality of pixel units arranged in a row direction and a column direction, each of the plurality of pixel units including a photoelectric converter, a first transistor for transferring a signal generated by the photoelectric converter, a second transistor for amplifying the signal, a third transistor for resetting an input terminal of the second transistor, and a fourth transistor for reading the signal outputted by the second transistor; a plurality of first signal lines extended in the row direction, each of the first signal lines being connected to gate electrodes of the first transistors of the pixel units arranged in the row direction; and a plurality of second signal lines extended in the row direction, each of the second signal lines being connected to gate electrodes of the fourth transistors of the pixel units arranged in the row direction, the first signal line connected to the gate electrodes of the first transistors of the pixel units of an $n^{th}$ row, and the second signal line connected to the gate electrodes of the fourth transistors of the pixel units of an $n+1^{th}$ row being formed of a common signal line, the method comprising the steps of: globally resetting the photoelectric converters and the second transistors in all the rows; after a period of a photo detection time, globally transferring charges from the photoelectric converters to the gate terminals of the second transistors via the first transistors in all the rows; and reading signals and reading reset voltages in each of the rows.

According to further another aspect of the present invention, there is provided an image reading method for a solid-state image sensor comprising: a plurality of pixel units arranged in a row direction and a column direction, each of the plurality of pixel units including a photoelectric converter, a first transistor for transferring a signal generated by the photoelectric converter, a second transistor for amplifying the signal, a third transistor for resetting an input terminal of the second transistor, and a fourth transistor for reading the signal outputted by the second transistor; a plurality of first signal lines extended in the row direction, each of the first signal lines being connected to gate electrodes of the third transistors of the pixel units arranged in the row direction; and a plurality of second signal lines extended in the row direction, each of the second signal lines being connected to gate electrodes of the fourth transistors of the pixel units arranged in the row direction, the first signal line connected to the gate electrodes of the third transistors of the pixel units of an $n^{th}$ row, and the second signal line connected to the gate electrodes of the fourth transistors of the pixel units of an $n+1^{th}$ row being formed of a common signal line, the method comprising the steps of: globally resetting the photoelectric converters and the second transistors in all the rows; after a period of a photo detection time, globally transferring charges from the photoelectric converters to the gate terminals of the second transistors via the first transistors in all the rows; and reading signals and reading reset voltages in each of the rows.

According to further another aspect of the present invention, there is provided an image reading method for a solid-state image sensor comprising: a plurality of pixel units arranged in a row direction and a column direction, each of the plurality of pixel units including a photoelectric converter, a first transistor for transferring a signal generated by the photoelectric converter, a second transistor for amplifying the signal, a third transistor for resetting an input terminal of the second transistor, and a fourth transistor for reading the signal outputted by the second transistor; a plurality of first signal lines extended in the row direction, each of the first signal lines being connected to gate electrodes of the third transistors of the pixel units arranged in the row direction; and a plurality of second signal lines extended in the row direction, each of the second signal lines being connected to gate electrodes of the fourth transistors of the pixel units arranged in the row direction, the first signal line connected to the gate electrodes of the third transistors of the pixel units of an $n^{th}$ row, and the second signal line connected to the gate electrodes of the fourth transistors of the pixel units of an $n+1^{th}$ row being formed of a common signal line, the method comprising the steps of: globally resetting the photoelectric converters and the second transistors at first reset voltages in all the rows; after a period of a photo detection time, globally transferring charges from the photoelectric converters to the gate terminals of the second transistors via the first transistors in all the rows; and reading signals and reading second reset voltages which are higher than the first reset voltage in each of the rows.

In the solid-state image sensor according to the present invention, any two of the gate electrode of the transfer transistor, the gate electrode of the reset transistor and the gate electrode of the select transistor are formed of one continuous pattern of the same conducting layer, whereby allowance can be given to layouts of the metal interconnection layers. Accordingly, the floating diffusions can be effectively shielded from light. Furthermore, allowance can be given to the area. Accordingly, the floating diffusions can have the area increased, so that the electric field of PN junction of the floating diffusion FD can be reduced without decreasing the floating diffusion FD capacitance, whereby the junction leakage can be reduced. The transfer transistors can have the gate width increased.

The signal lines commonly connecting the gate electrodes can be formed of the gate interconnection, whereby layouts of the metal interconnection layers can have allowance. The third metal interconnection layer can be used exclusively as the light shield film, whereby the light shield of the floating diffusions can be further effective.

The above-described solid-state image sensor according to the present invention, which is superior in light shielding the floating diffusions, enables image reading by the global shutter mode. Accordingly, good images without "deflections" and "distortions" can be provided by the image reading method using the global shutter mode.

BRIEF DESCRIPTION OF THE DRAWINGS

FIGS. 7A-7C and 8 are sectional views of the solid-state image sensor according to the first embodiment of the present invention in the steps of the method for fabricating the same, which explain the method.

FIGS. 30A-30C are sectional views of the solid-state image sensor according to the sixth embodiment of the present invention in the steps of the method for fabricating the same, which show the method.

DETAILED DESCRIPTION OF THE INVENTION

A First Embodiment

The solid-state image sensor according to a first embodiment of the present invention will be explained with reference to FIGS. 1 to 8.

Figure 1:
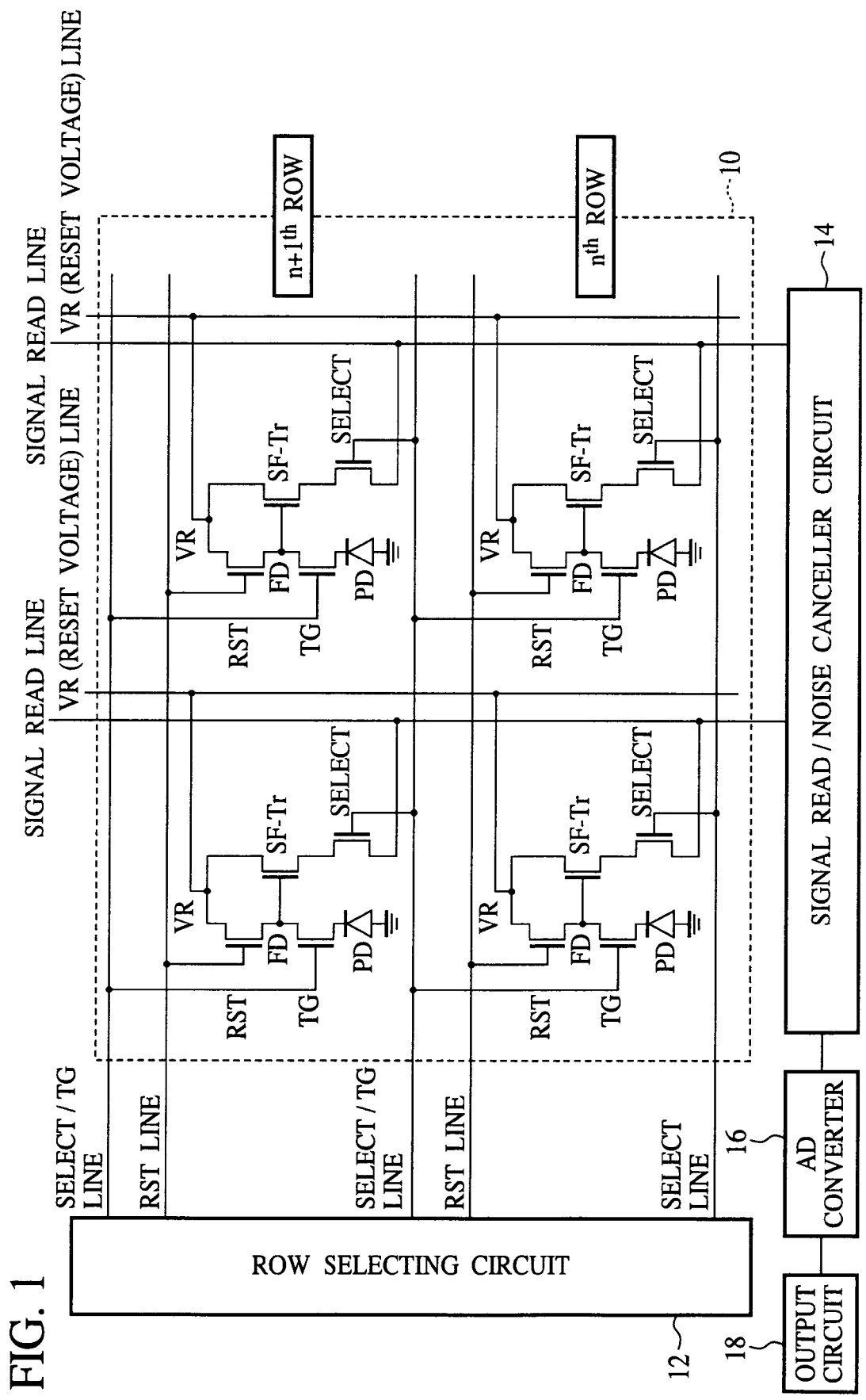
FIG. 1 is a circuit diagram of the solid-state image sensor according to a first embodiment of the present invention.
Figure 4:
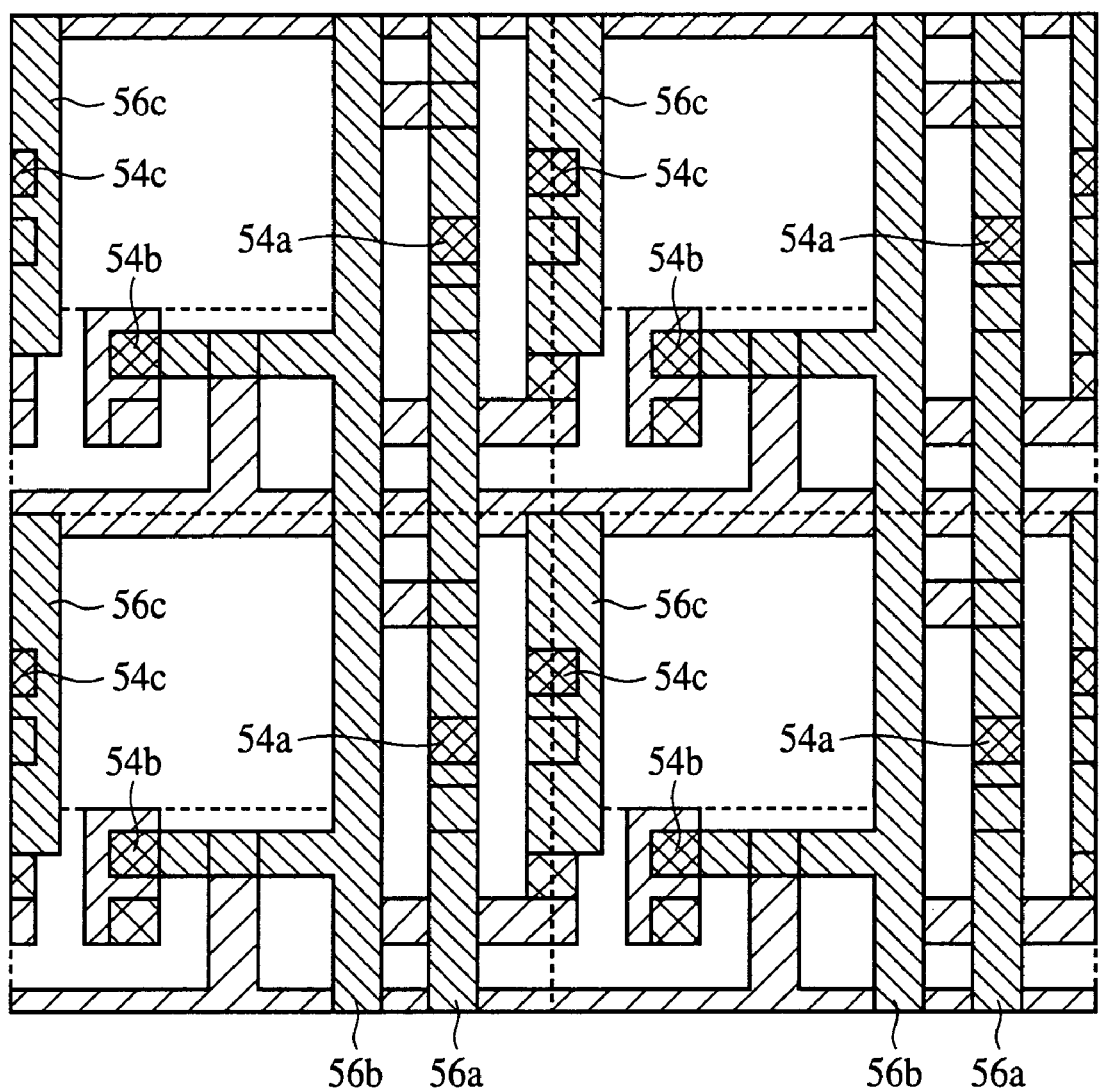
Figure 5:
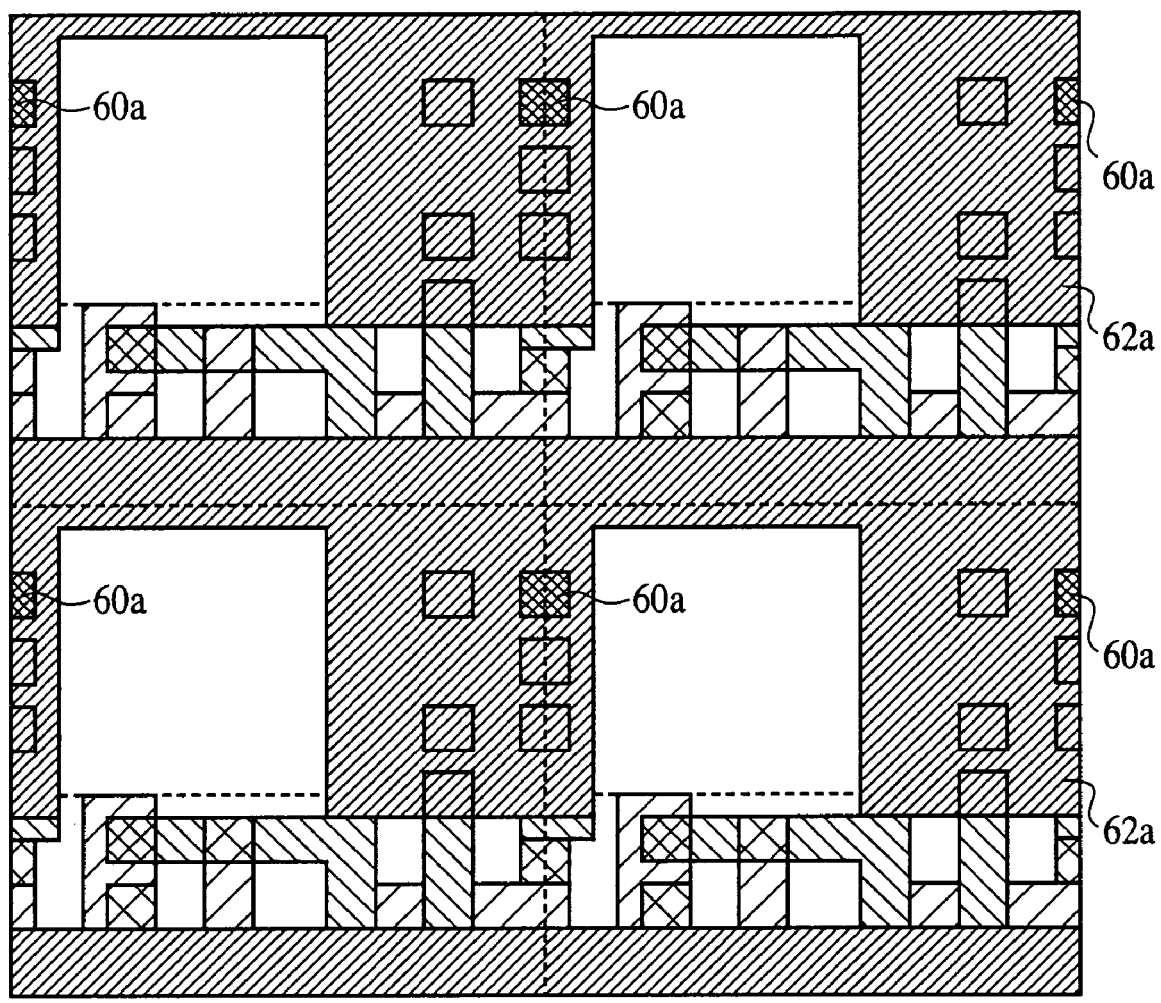
Figure 6A:
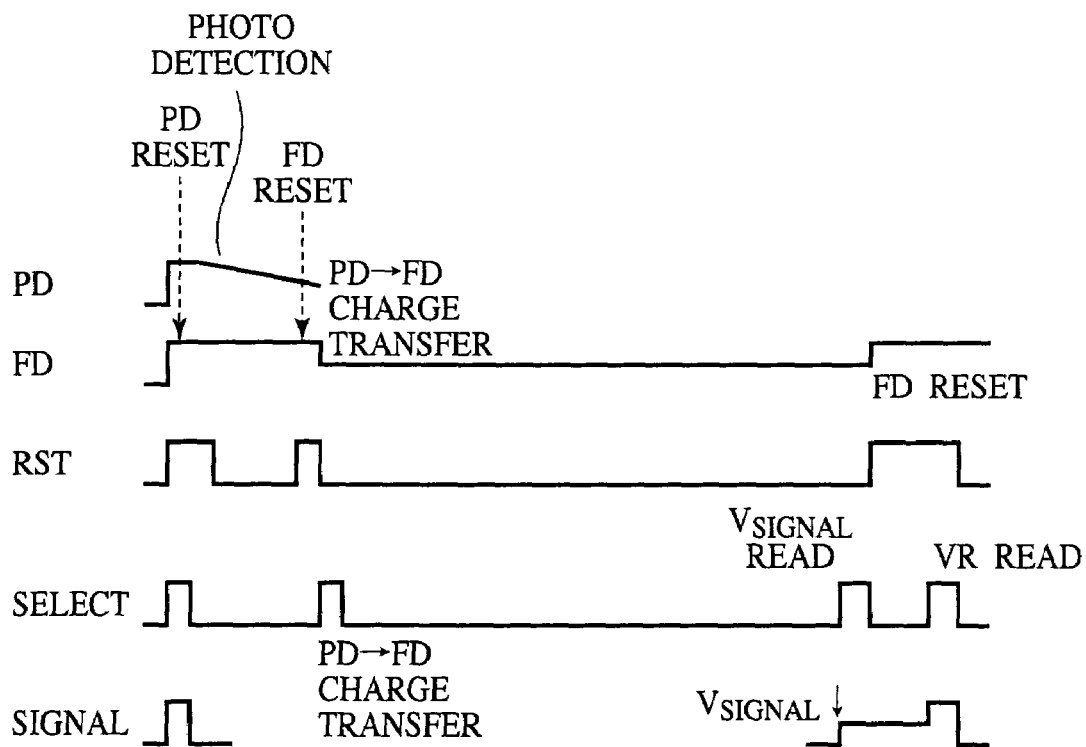
FIGS. 6A and 6B are timing charts explaining the image reading method for the solid-state image sensor according to the first embodiment of the present invention.
Figure 6B:
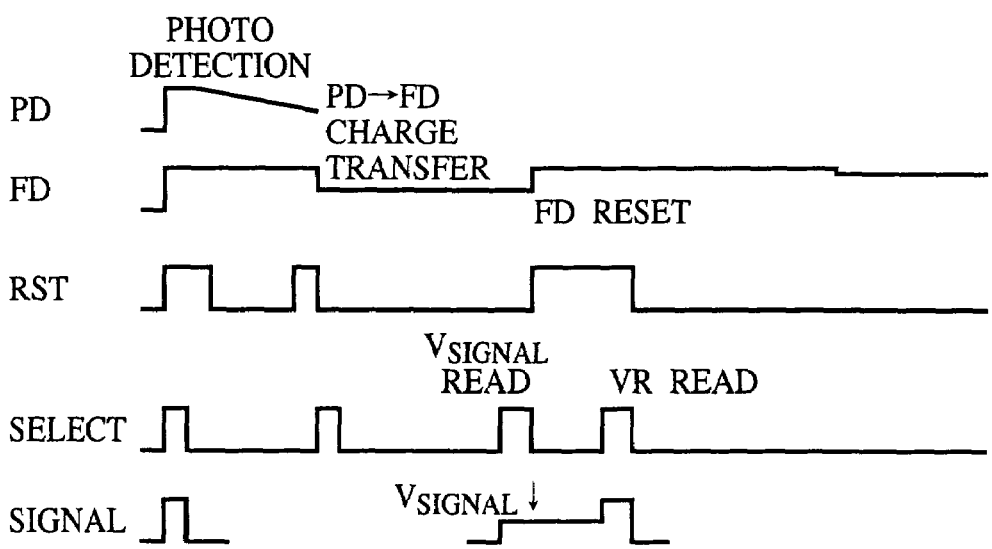

FIG. 1 is a circuit diagram of the solid-state image sensor according to the present embodiment. FIGS. 2 to 5 are plan views of the solid-state image sensor according to the present embodiment, which show a structure thereof. FIGS. 6A and 6B are timing charts explaining the image reading method of the solid-state image sensor according to the present embodiment. FIGS. 7A-7C and 8 are sectional views of the solid-state image sensor according to the present embodiment in the steps of the method for fabricating the same, which show the method.

First, the structure of the solid-state image sensor according to the present embodiment will be explained with reference to FIGS. 1 to 5. FIG. 1 is a circuit diagram of the solid-state image sensor according to the present embodiment. In FIG. 1, a pixel array unit 10 is represented by 2×2 unit pixels.

Each pixel comprises a photodiode PD, a transfer transistor TG, a reset transistor RST, a source follower transistor SF-Tr and a select transistor SELECT. That is, the solid-state image sensor according to the present embodiment is a solid-state image sensor having 4-Tr-pixels.

The source terminal of the transfer transistor TG is connected to the cathode terminal of the photodiode PD. The anode terminal of the photodiode PD is grounded. The drain terminal of the transfer transistor TG is connected to the source terminal of the reset transistor RST and the gate terminal of the source follower transistor SF-Tr. The source terminal of the source follower transistor SF-Tr is connected to the drain terminal of the select transistor SELECT.

The respective pixels adjacent to each other in the row direction are connected to a reset (RST) line which commonly connects the gate terminals of the reset transistors RST. The respective pixels are connected to a select/TG line which commonly connects the gate terminals of the transfer transistors TG of the pixels of the $n^{th}$ row and the gate terminals of the select transistors SELECT of the pixels of the $n+1^{th}$ row.

The respective pixels adjacent to each other in the column direction are connected to a signal read line which commonly connects the source terminals of the select transistors SELECT and to a VR (reset voltage) line which commonly connects the drain terminals of the reset transistors RST and the drain terminals of the source follower transistors SF-Tr.

The RST lines and the select/TG lines are connected to a row selecting circuit 12. The signal read lines are connected to the signal read/noise canceller circuit 14. An output circuit 18 is connected to the signal read/noise canceller circuit 14 via an AD converter 16. The VR lines are connected to a power source of a substantially source voltage or a power source of a voltage which is decreased from the source voltage in the chip.

As described above, in the solid-state image sensor according to the present embodiment, a TG line commonly connecting the gate terminals of the transfer transistors TG of the respective pixels positioned in the $n^{th}$ row, and a select line commonly connecting the gate terminals of the select transistors SELECT of the respective pixels positioned in the $n+1^{th}$ row are formed of a common signal line (select/TG line).

Figure 2:
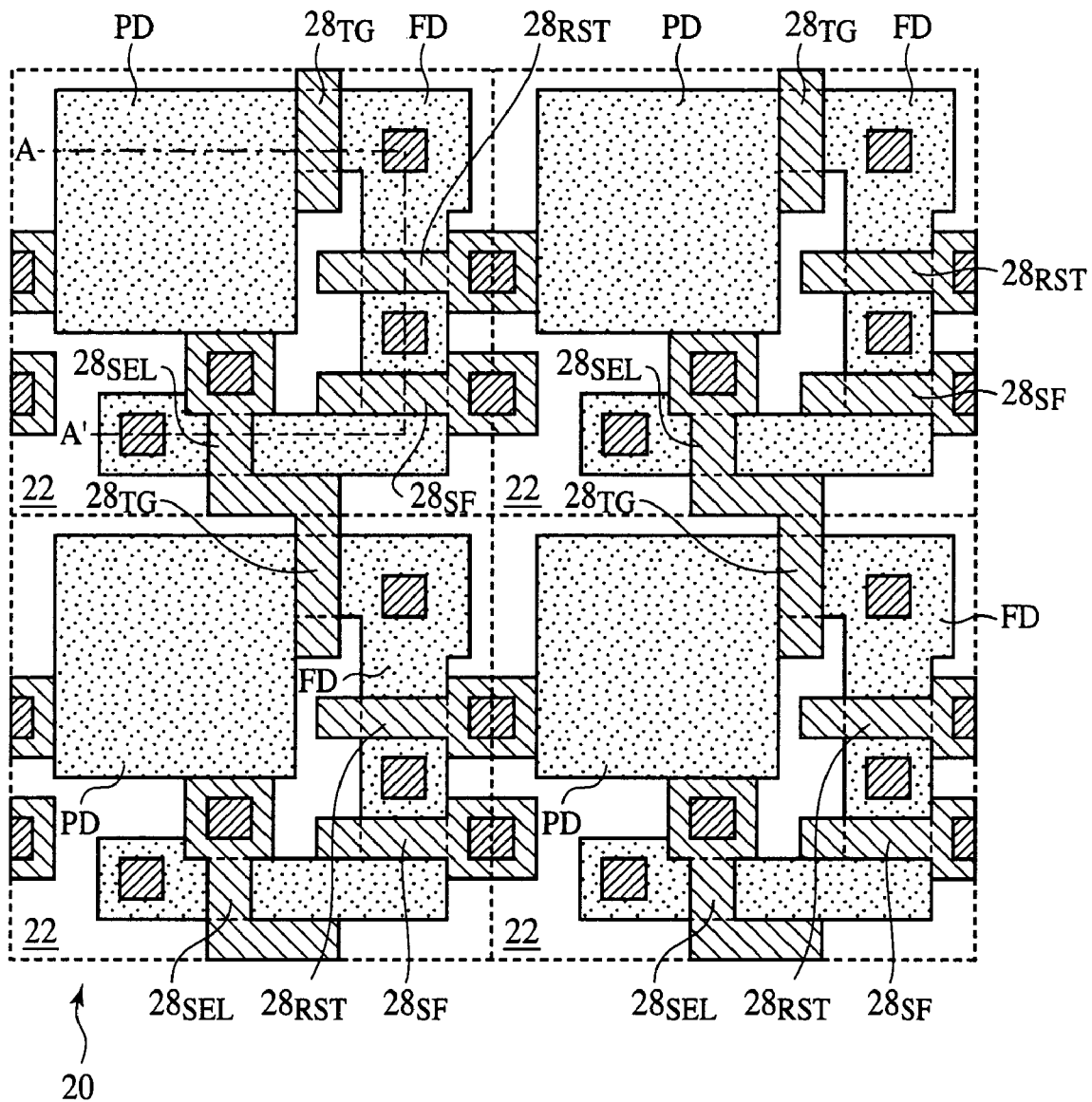
FIGS. 2-5 are plan views of the solid-state image sensor according to the first embodiment of the present invention, which show a structure thereof.
Figure 3:
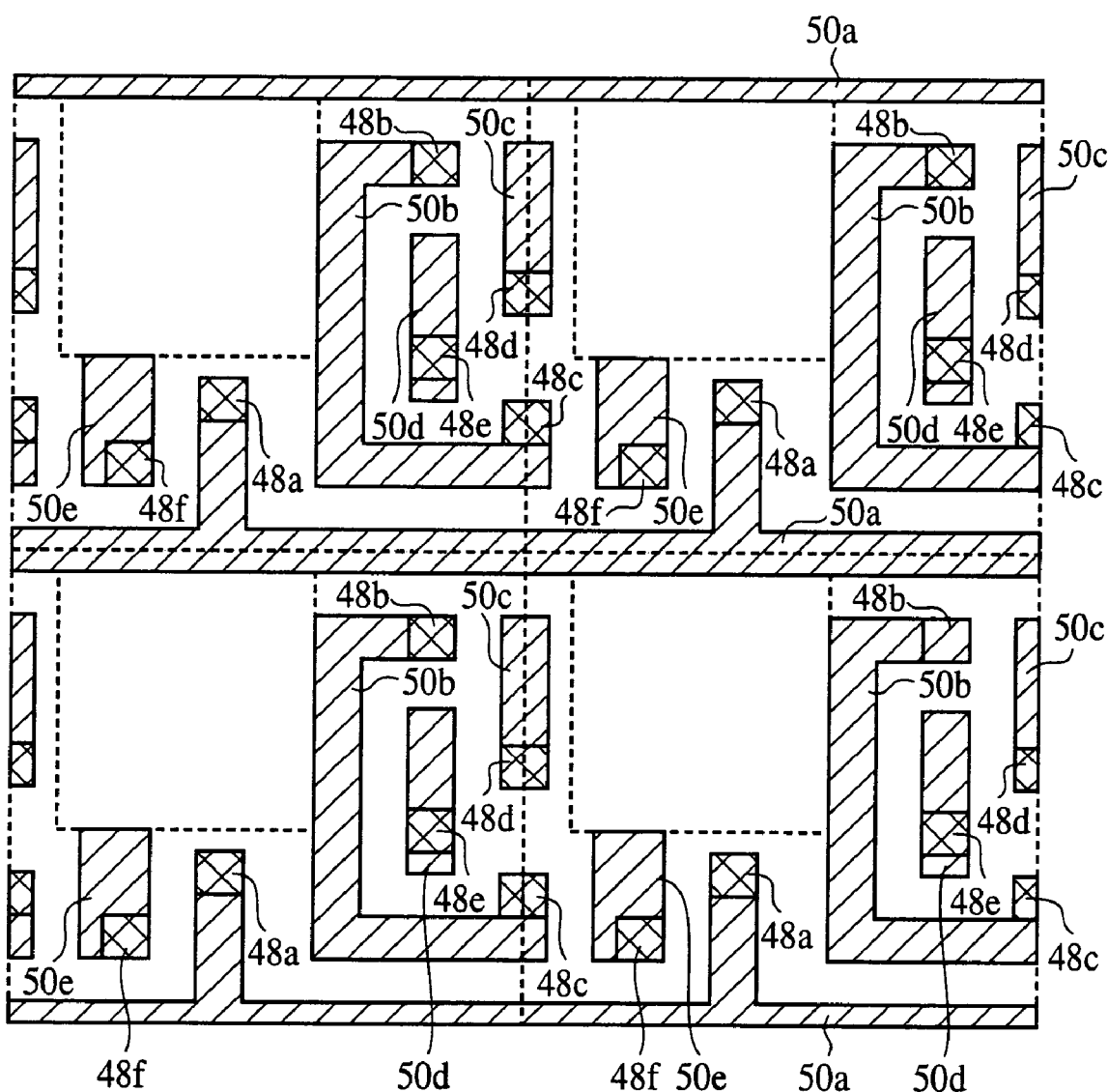

Next, a specific structure forming the circuit shown in FIG. 1 will be explained with reference to FIGS. 2 to 5. FIG. 2 is a plan view of a layout of the active regions and the gate interconnection in the pixel array unit. FIG. 3 is a plan view of a layout of first metal interconnection in the pixel array unit. FIG. 4 is a plan view of a layout of second metal interconnection in the pixel array unit. FIG. 5 is a plan view of a layout of third metal interconnection in the pixel array unit.

As shown in FIG. 2, the active regions are defined on a silicon substrate 20 by a device isolation film 22. Each active region has a wide rectangular region as a region for the photodiode and a substantially bracket-shaped region connected to the photodiode region.

Four gate electrodes 28 are formed bridging above the active region. These gate electrodes 28 are respectively from the side of the photodiode PD, the gate electrode $28_{TG}$ of the transfer transistor TG, the gate electrode $28_{RST}$ of the reset transistor RST, the gate electrode $28_{SF}$ of the source follower transistor, and the gate electrode $28_{SEL}$ of the select transistor SELECT. The gate electrode $28_{TG}$ is formed in one pattern continuous to the gate electrodes $28_{SEL}$ of the pixels adjacent to each other in the column direction. The active region between the gate electrode $28_{TG}$ and the gate electrode $28_{RST}$ is the floating diffusion FD.

As shown in FIG. 3, a first metal interconnection layer 50 includes a select/TG line 50a connected to the gate electrode $28_{TG}$ and the gate electrode $28_{SEL}$ via a contact plug 48a, an interconnection layer 50b interconnecting the floating diffusion FD and the gate electrode $28_{SF}$ via contact plugs 48b, 48c, outgoing lines 50c, 50d, 50e connected respectively to the gate electrode $28_{RST}$, the drain regions of the reset transistor RST and the source follower transistor SF-Tr, and the source region of the select transistor SELECT respectively via contact plugs 48d, 48e, 48f.

As shown in FIG. 4, a second metal interconnection layer 56 includes a VR line 56a electrically connected to the drain regions of the reset transistor RST and the source follower transistor SF-Tr via a contact plug 54a, a signal read line 56b electrically connected to the source region of the select transistor SELECT via a contact plug 54b, and an outgoing line 56c electrically connected to the gate electrode $28_{RST}$ via contact plug 54c.

As shown in FIG. 5, a third metal interconnection layer 62 includes an RST line 62a electrically connected to the gate electrode $28_{RST}$ via a contact plug 60a.

As described above, the solid-state image sensor according to the present embodiment is characterized mainly in that the gate electrodes $28_{TG}$ of the transfer transistors TG of the pixels positioned on the $n^{th}$ row, and the gate electrodes $28_{SEL}$ of the select transistors SELECT of the pixels positioned in the $n+1^{th}$ row are formed in one pattern, and the select/TG line 50a is formed of the first metal interconnection layer 50, and the VR line 56a and the signal read line 56b are formed of the second metal interconnection layer 56, and the RST line 62a is formed of the third metal interconnection layer 62.

Thus, even in the case where the select line and the TG line are formed of the common interconnection layer, the gate electrode $28_{TG}$ and the gate electrode $28_{SEL}$, which are spaced from each other, do not have to be interconnected by the metal interconnection layer. One contact hole through which the first metal interconnection layer 50 is connected to the lower layer can be saved, which gives allowance to the layout of the metal interconnection layers spacious.

Accordingly, allowance is given to the area, and a sufficient area can be allocated to the floating diffusion FD. The floating diffusion FD having a sufficiently large area can have the well concentration decreased to thereby mitigate the electric field, whereby the junction leakage can be decreased. The gate width of the transfer transistor TG can be larger, whereby the characteristics of the transfer transistor TG can have small deflections, and the charge transfer from the photodiode PD to the floating diffusion FD can be stable.

Only the RST line 62a can be formed of the third metal interconnection layer 62, whereby the pattern is made thicker on the floating diffusion FD for sufficient shade of the floating diffusion FD. The necessity of the shade of the floating diffusion FD will be described later.

Then, the image reading method for the solid-state image sensor according to the present embodiment will be explained with reference to FIG. 6. In the present embodiment, the image reading method called the global shutter mode will be explained. In the global shutter mode no photo detecting time difference takes place among the pixels, as does in the rolling shutter mode, and accordingly good images without "deflections" and "distortions" can be obtained. The solid-state image sensor according to the present embodiment can be used for the rolling shutter mode as described in, e.g., Reference 4.

FIGS. 6A and 6B are timing charts of the image reading method for the solid-state image sensor according to the present embodiment. FIG. 6A is a timing chart of the pixels of the $n+1^{th}$ row. FIG. 6B is a timing chart of the pixels of the $n^{th}$ row. In the respective timing charts, positive voltages are taken on the vertical axis, and time is taken on the horizontal axis.

First, a signal is applied to the RST lines and the select/TG lines of all the rows to globally reset the photodiodes PD and the floating diffusions FD of all the rows. Thus, the photodiodes PD and the floating diffusions FD are reset, and their voltages are increased to prescribed values.

Then, the select/TG lines are turned off, and the photo detection by the photodiodes PD is started. In the photodiodes PD electrons are generated, and the voltage of the photodiodes PD is gradually decreased.

Next, a reset signal is applied to the RST lines of all the rows, and the floating diffusions FD alone are globally reset. When the reset signal is applied to the RST lines, the floating diffusions FD are reset, and voltages of the floating diffusions FD become stable at a prescribed value reflecting the reset voltage VR.

Next, the select/TG lines of all the rows are turned on to transfer charges in the photodiodes PD to the floating diffusions FD. Thus, the voltages of the floating diffusions FD are decreased by amount corresponding to the transferred charges. At this time, the select transistors SELECT as well as the transfer transistors TG are turned on, and preferably the signal read lines are shut off from peripheral reading circuits to be in high impedance.

Then, the reading operation is made sequentially first on the first row. In the present embodiment, the reading operation is made first on the $n^{th}$ row and then on the $n+1^{th}$ row.

First, to read the $n^{th}$ row, a select signal is applied to the select/TG line of the $n^{th}$ row. Voltages decreased by voltage change amounts $\Delta V$ corresponding to amounts of electrons stored in the photodiodes PD, i.e., voltages corresponding to (a reset voltage VR)–(a threshold voltage $V_{th}$)–(voltage change amounts $\Delta V$) are outputted to the signal read lines ($V_{singal}$ read).

Then, a reset signal is applied to the $n^{th}$ RST line, and the floating diffusions FD are reset. Voltages of the floating diffusions FD become stable at a prescribed value reflecting the reset voltage VR. The voltages are applied to the gate terminals of the source follower transistors SF-Tr.

In this state, a select signal is applied to the select line of the $n^{th}$ row, and voltages corresponding to (the reset voltage VR)–(the threshold voltage $V_{th}$) is outputted to the signal read lines (VR read).

Then, differences between the VR read voltages (VR–$V_{th}$) and the $V_{signal}$ read voltage (VR–$V_{th}$–$\Delta V$) are given by the signal read/noise canceller circuit 12, and voltage change amounts $\Delta V$ are given. Thus, for the pixels of the $n^{th}$ row, output voltage changes due to variations of the threshold voltage of the source follower transistors SF-Tr of the respective pixels are cancelled, whereby voltage change amounts $\Delta V$ corresponding to electrons stored by the photodiodes PD can be correctly read.

Then, to read the $n+1^{th}$ row, a select signal is applied to the select/TG line of the $n+1^{th}$ line. Thus, voltages decreased by voltage change amounts $\Delta V$ corresponding to amounts of electrons stored in the photodiodes PD, i.e., (the reset voltage VR)–(the threshold voltage $V_{th}$)–(the voltage change amounts $\Delta V$) are outputted to the signal read lines ($V_{signal}$ read).

At this time, the transfer transistors of the $n^{th}$ row as well are turned on, and charges are transferred from the photodiodes PD to the floating diffusions FD. Without any inconvenience, the global reset described above is performed before the next image detection.

Then, a reset signal is applied to the RST line of the $n+1^{th}$ row, and the floating diffusions FD are reset. Voltages of the floating diffusions FD become stable at the prescribed value reflecting the reset voltage VR. The voltages are applied to the gate terminals of the source follower transistors SF-Tr.

In this state, a select signal is applied to the select line of the n+1$^{th}$ row, and voltages corresponding to (the reset voltage VR)–(the threshold voltage V$_{th}$) are outputted to the signal read lines (VR read).

Then, differences between the VR read voltages (VR–V$_{th}$) and the V$_{signal}$ voltages (VR–V$_{th}$–ΔV) are outputted to the signal read lines to give voltage change amounts ΔV. Thus, for the pixels of the n+1$^{th}$ row, output voltage changes of the source follower transistors SF-Tr of the respective pixels due to variations of the threshold voltage are cancelled, whereby voltage change amounts ΔV corresponding to the amounts of electrons stored by the photodiodes PD can be correctly read.

The above-described string of read operations is made sequentially on the respective pixels, whereby optical signals detected by the photodiodes PD can be read for all the pixels.

In the global shutter mode described above, charges stored by the photodiodes PD of the respective pixels are globally transferred to the floating diffusions FD, and the charges of the floating diffusions FD of the respective pixels are sequentially read, which makes the time in which the floating diffusions FD hold charges longer by 10's msec. Accordingly, it is very important to cover the floating diffusions FD with a metal interconnection layer so that the change of the charge amounts held by the floating diffusions FD due to the photo detection during the time of the standby until the read are prevented.

As described above, in the solid-state image sensor according to the present embodiment, the gate electrodes 28$_{TG}$ of the transfer transistors TG of the pixels of the n$^{th}$ row and the gate electrodes 28$_{SEL}$ of the select transistors TG of the pixels of the n+1$^{th}$ row are formed in one pattern, which gives freedom to the layout of the upper metal interconnection layer. Accordingly, the third metal interconnection layer may form only the RST lines, and the third metal interconnection layer can also have the function as a light shield film. Thus, the floating diffusions FD can be sufficiently light shielded, and which is very effective to use the global shutter mode.

Then, the method for fabricating the solid-state image sensor according to the present embodiment will be explained with reference to FIGS. 7A-7C and 8. FIGS. 7A-7C and 8 are sectional views along the line A-A' in FIG. 2. For reference, regions for peripheral circuit transistors to be formed in are described on the side of the respective sectional views.

First, a device isolation film 22 of, e.g., an about 250~350 nm-thick is formed on a silicon substrate 20 in the same way as in the ordinary semiconductor device fabrication process, whereby the active regions of the substantially bracket-shaped pattern shown in FIG. 2 are formed in the pixel regions. In FIG. 2, the device isolation film 22 has the shape formed by LOCOS (LOCal Oxidation of Silicon) method but may be formed by STI (Shallow Trench Isolation) method.

Then, prescribed well regions (not shown) are formed in the silicon substrate 20. In the pixel array regions, where n-type transistors are to be formed, the p-type substrate is used as it is, or p-well is formed.

Next, a gate insulating film 24 of, e.g., an about 3~8 nm-thick is formed by thermal oxidation on the active regions defined by the device isolation film 22.

Then, by, e.g., CVD method, a polycrystalline silicon film of, e.g., 50~100 nm-thick (central condition: 50 nm) doped with phosphorus, a tungsten silicide film of, e.g., a 100~200 nm-thick (central condition: 150 nm), and a silicon oxide film of, e.g., 100~200 nm-thick (central condition: 150 nm) are sequentially deposited.

Next, the silicon oxide film, the tungsten silicide film and the polycrystalline silicon film are patterned by photolithography and dry etching to form the gate electrodes 28 of the polycide structure having the upper surfaces covered with the silicon oxide film 26. At this time, the gate electrodes 28$_{TG}$ of the transfer transistors TG are formed in one pattern which is continuous to the gate electrodes 28$_{SEL}$ of the select transistors SELECT of the pixels adjacent to each other in the column direction.

Then, with the gate electrodes 28 as a mask, phosphorus ions, for example, are implanted at a 10~30 keV acceleration energy (central condition: 20 keV) to a dose of $2\times10^{13}$~$1\times10^{14}$ cm$^{-2}$ (central condition: $4\times10^{3}$ cm$^{-2}$) to form an impurity diffused region 30 which is to be the LDD regions of the n-type transistors.

Next, in the regions where the photodiodes PD are to be formed, phosphorus ions, for example, are implanted at a 20~200 keV acceleration energy (central condition: 80 keV) to a dose of $1\times10^{12}$~$5\times10^{13}$ cm$^{-2}$ (central condition: $1\times10^{12}$ cm$^{-2}$) to form a buried n-type diffusion layer 32. The device isolation film 22 and the buried n-type diffusion layer 32 are spaced from each other by 0.2 μm. On the other hand, the buried n-type diffused layer 32 is formed by self-alignment with the gate electrodes 28$_{TG}$ of the transfer transistors.

In the floating diffusions FD, which are required to have small junction leakage, as the regions for the photodiodes PD to be formed in, the buried n-type diffused layer 32 may be formed. For further decrease of the junction leakage of the floating diffusions FD, phosphorus ions, for example, may be implanted under conditions of a 10~30 keV acceleration energy and a high concentration of a $1\times10^{14}$~$5\times10^{15}$ cm$^{-2}$ dose.

Then, in the regions where the photodiodes to be formed, boron ions, for example, are implanted at a 5~10 keV acceleration energy to a dose of $1\times10^{13}$~$1\times10^{14}$ cm$^{-2}$ or BF$_2$ ions are implanted at a 30 keV acceleration energy to a dose of $1\times10^{13}$~$1\times10^{14}$ cm$^{-2}$ to form a p$^+$-diffused layer 34 in the surface side of the photodiode-to-be-formed regions (FIG. 7A). The p$^+$-diffused layer 34 can be formed concurrently with the impurity diffused regions (not shown), which are to be the LDD regions of the p-type transistors.

Then, a silicon oxide film 36 of, e.g., a 50~150 nm-thick (central condition: 100 nm) is formed by, e.g., CVD method.

Next, a mask (not shown) for covering the photodiode regions and the floating diffusion regions are formed by photolithography, and then the silicon oxide film 36 is anisotropically etched. Thus, a sidewall insulating film 38 of the silicon oxide film 36 is formed on the side walls of the gate electrodes 28, while the silicon oxide film 36 is left in the photodiode regions and the floating diffusion regions.

Then, with the gate electrodes 28, the silicon oxide film 36 and the sidewall insulating film 38 as a mask, phosphorus ions, for example, are implanted at a 10~30 keV acceleration energy (central condition: 20 keV) to a dose of $1$~$5\times10^{15}$ cm$^{-2}$ (central condition: $2\times10^{15}$ cm$^{-2}$) to form a highly doped impurity diffused regions 40 which are to be the source/drain regions of the n-type transistors.

In regions not shown for the p-type transistors to be formed in, boron ions, for example, are implanted at a 5~10 keV acceleration energy (central condition: 7 keV) to a dose of $1$~$5\times10^{15}$ cm$^{-2}$ (central condition: $2\times10^{15}$ cm$^{-2}$) to form highly doped impurity diffused regions (not shown) which are to be the source/drain regions of the p-type transistors.

Then, a titanium film or a cobalt film is deposited by, e.g., sputtering method and then is subjected to RTA (rapid thermal annealing), and that of the titanium film or the cobalt film which has remained unreacted is removed so as to form the metal silicide film 42 selectively on the region where the silicon is exposed on the surface. At this time, the metal silicide film 42 is not formed on the photodiode regions and the floating diffusion regions where the silicon oxide film 36 is formed in (FIG. 7B).

Then, by, e.g., plasma CVD method, a silicon nitride film (or a silicon oxynitride film) 44 of, e.g., a 50~200 nm-thick, and a silicon oxide film 46 of, e.g., a 700~1500 nm-thick (central condition: 1000 nm) are deposited.

Next, the surface of the silicon oxide film 46 is polished by, e.g., CMP (chemical mechanical polishing) method to planarize the silicon oxide film 46.

Then, by photolithography and dry etching, the contact holes 46 are formed in the silicon oxide film 46 and the silicon nitride film 44 down to the gate electrodes 28 or the metal silicide film 42 formed on the source/drain diffused layer.

Then, by, e.g., CVD method, a titanium film of, e.g., a 10~50 nm-thick, a titanium nitride film of, e.g., a 10~100 nm-thick, and a tungsten film of, e.g., a 100~800 nm-thick are deposited and then are polished until the silicon oxide film 46 is exposed, to form contact plugs 48 buried in the contact holes 46 (FIG. 7C).

Next, a 400~1000 nm-thick aluminum alloy film is deposited by, e.g., sputtering method on the silicon oxide film 46 with the contact plugs 48 buried in and patterned to form the first metal interconnection layer 50.

Figure 8:
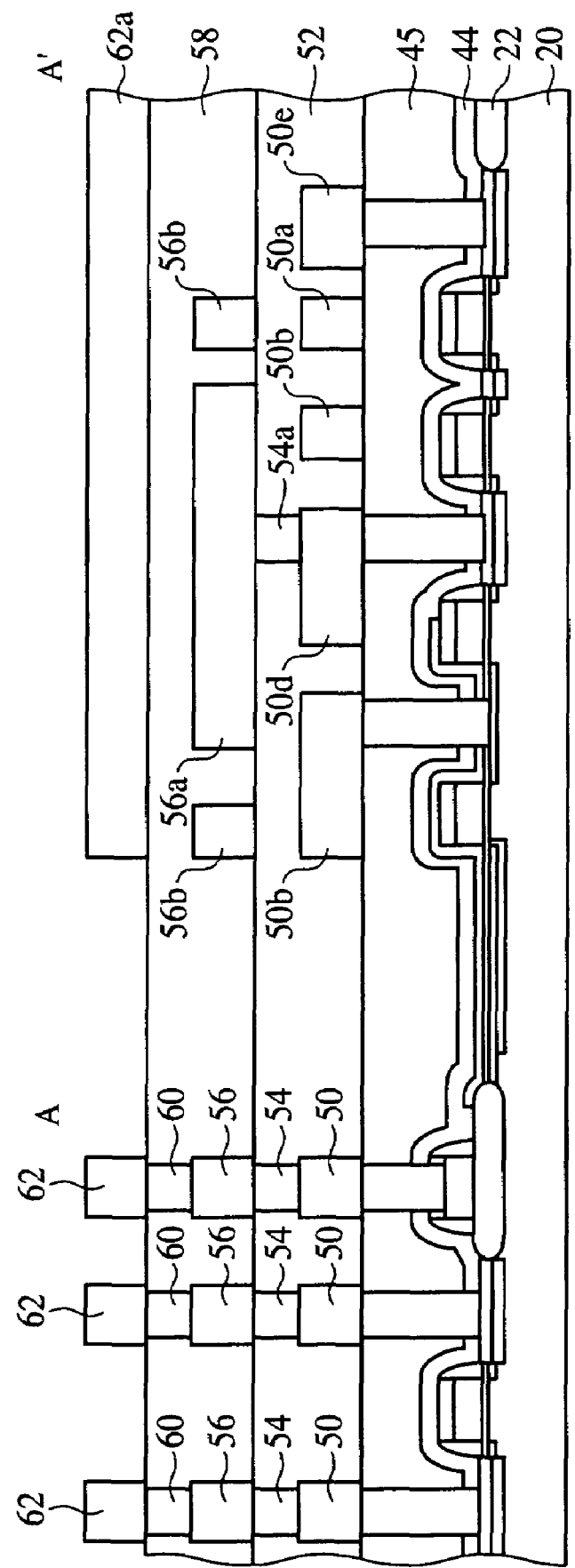

Then, the deposition of inter-layer insulating films, the formation of via holes and the formation of interconnection layers are repeated to form the second metal interconnection layer 56 connected to the first metal interconnection layer via the contact plugs 54 buried in the inter-layer insulating film 52 and the third metal interconnection layer 62 connected to the second metal interconnection layer 56 via the contact plugs 60 buried in the inter-layer insulating film 58 (FIG. 8).

As described above, according to the present embodiment, the gate electrode of the transfer transistor and the gate electrode of the select transistor are formed in one continuous pattern, whereby one contact hole through which the first metal interconnection layer is connected to the lower layer can be saved. Thus, the layout of the metal interconnection layers can have allowance. The area can have allowance, which allows the floating diffusions to have a larger area, the electric field of PN junction of the floating diffusion FD can be reduced without decreasing total floating diffusion FD capacitance, and the junction leakage can be decreased. The transfer transistors can have a large gate width.

The third metal interconnection layer, which forms only the RST lines, can be used as a light shield film for shielding the floating diffusions. Accordingly, even in the reading by the global shutter mode, good images without "deflections" and "distortions" can be obtained.

Figure 63:
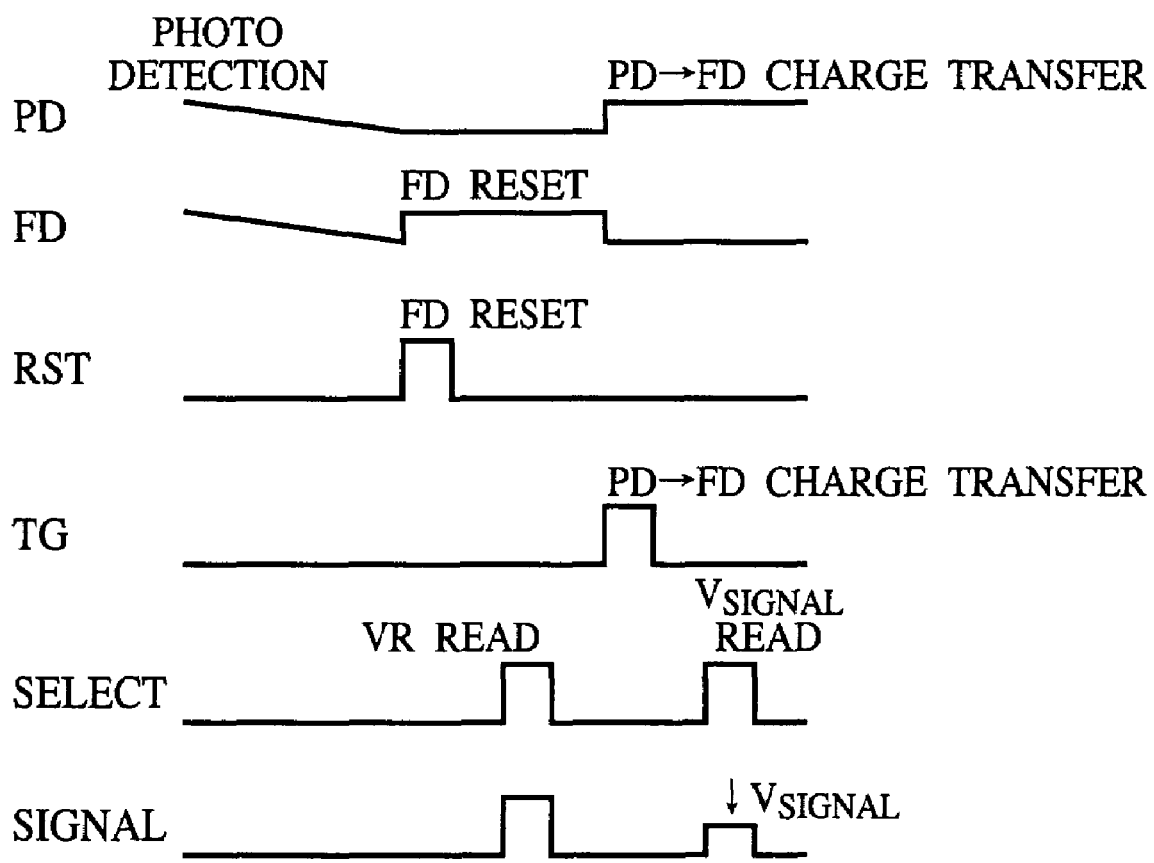
FIG. 63 is a timing chart explaining the image reading method of the conventional solid-state image sensor.

Furthermore, the solid-state image sensor according to the present embodiment, in which the select line and the TG line are common, has the following advantage in the global shutter operation. In the rolling shutter operation shown in FIG. 63, when charges are transferred from the photodiodes PD to the floating diffusions FD in reading each $n^{th}$ row, the select line of the $n+1^{th}$ row is also turned on to conduct the signal read line to the pixels of the $n+1^{th}$ row. Excessive current flows. Furthermore, this state occurs on reading each $n^{th}$ row, and excessive current corresponding to a number of the rows (hundreds times) flow for once image detection. On the other hand, in the global shutter mode, in which all of the TG lines (the select lines of the adjacent rows) are globally turned on, the excessive current occurs only twice on the global reset and on the global charge transfer (charge transfer from the photodiodes PD to the floating diffusions FD). Thus, the global shutter mode is a reading system having an advantage that the excessive current can be made small with the select line and the TG line made common with each other.

A Second Embodiment

The solid-state image sensor according to a second embodiment of the present invention will be explained with reference to FIGS. 9 to 12.

FIGS. 9 to 12 are plan views of the solid-state image sensor according to the present embodiment, which show a structure thereof. The same members of the present embodiment as those of the solid-state image sensor according to the first embodiment shown in FIGS. 1 to 8 are represented by the same reference numbers not to repeat or to simplify their explanation.

The solid-state image sensor according to the present embodiment is the same as the solid-state image sensor according to the first embodiment in the circuit diagram, the operation and the fabrication method except that the plane layouts of the respective layers are different from those of the solid-state image sensor according to the first embodiment. That is, in the solid-state image sensor according to the present embodiment as well, a TG line commonly connecting the gate terminals of the transfer transistors TG of the respective pixels of the $n^{th}$ row, and a select line commonly connecting the gate terminals of the select transistors SELECT of the respective pixels of the $n+1^{th}$ row are a common signal line (select/TG line).

Figure 9:
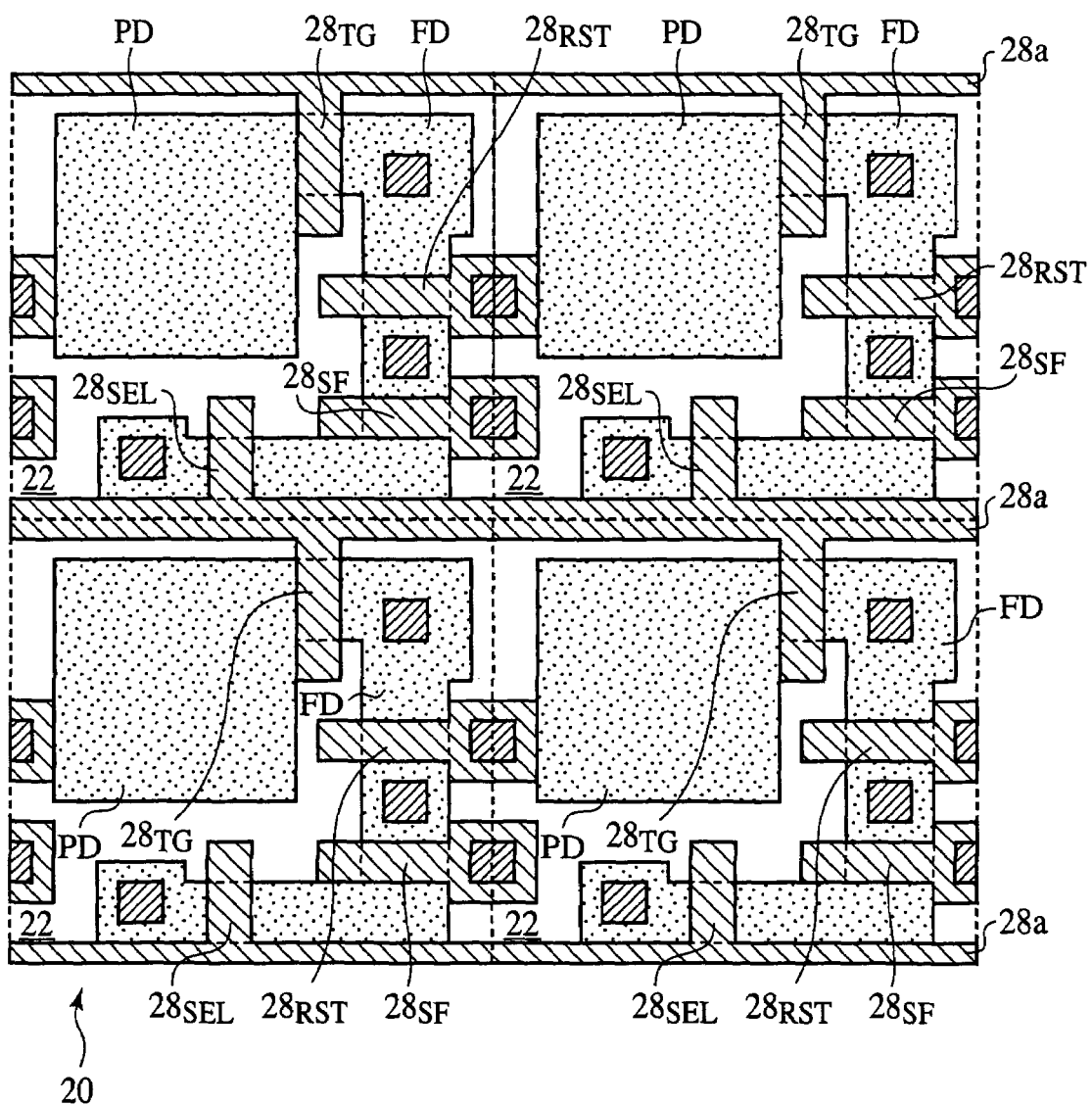
FIGS. 9-12 are plan views of the solid-state image sensor according to a second embodiment of the present invention which show a structure thereof.
Figure 10:
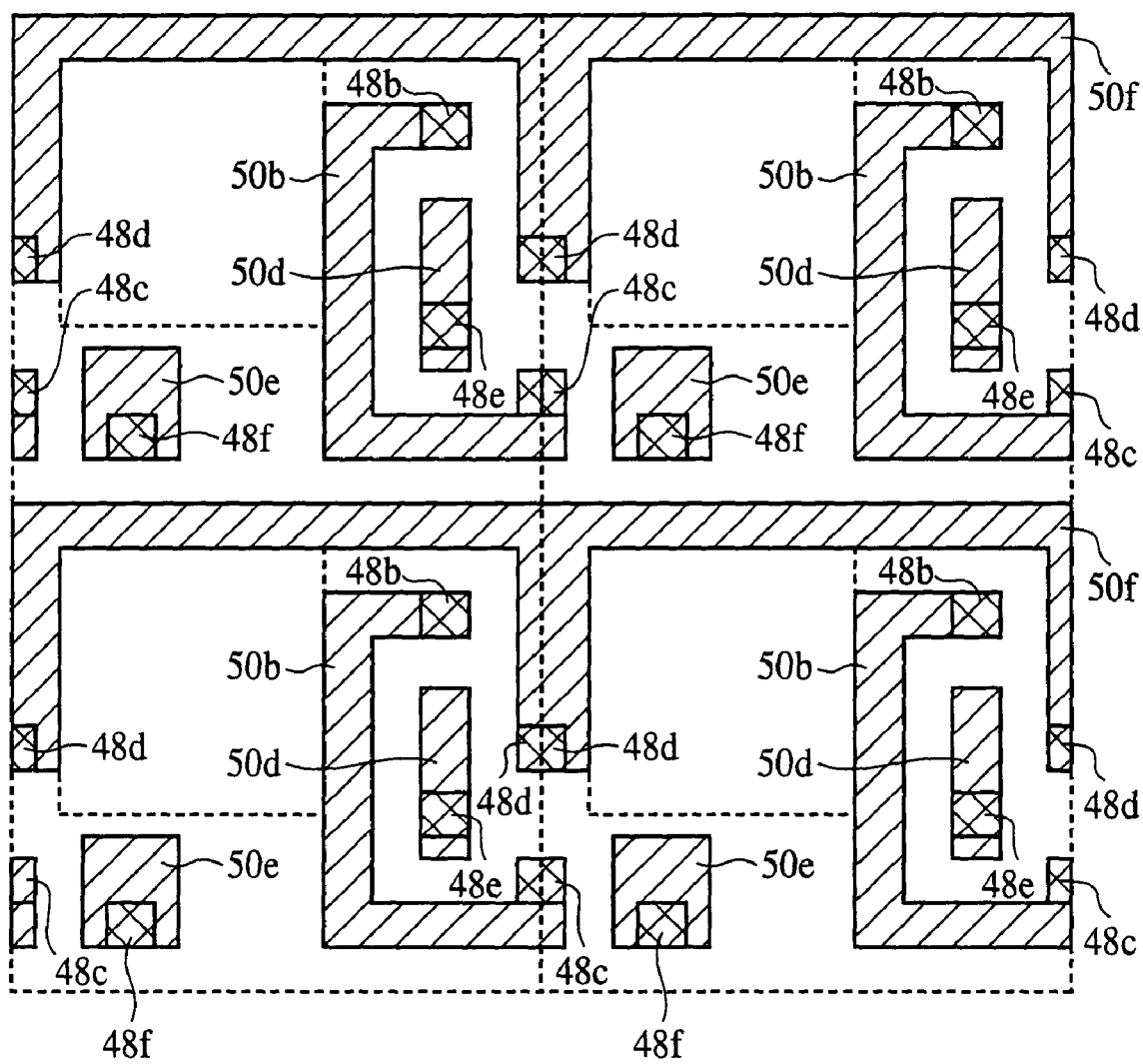
Figure 11:
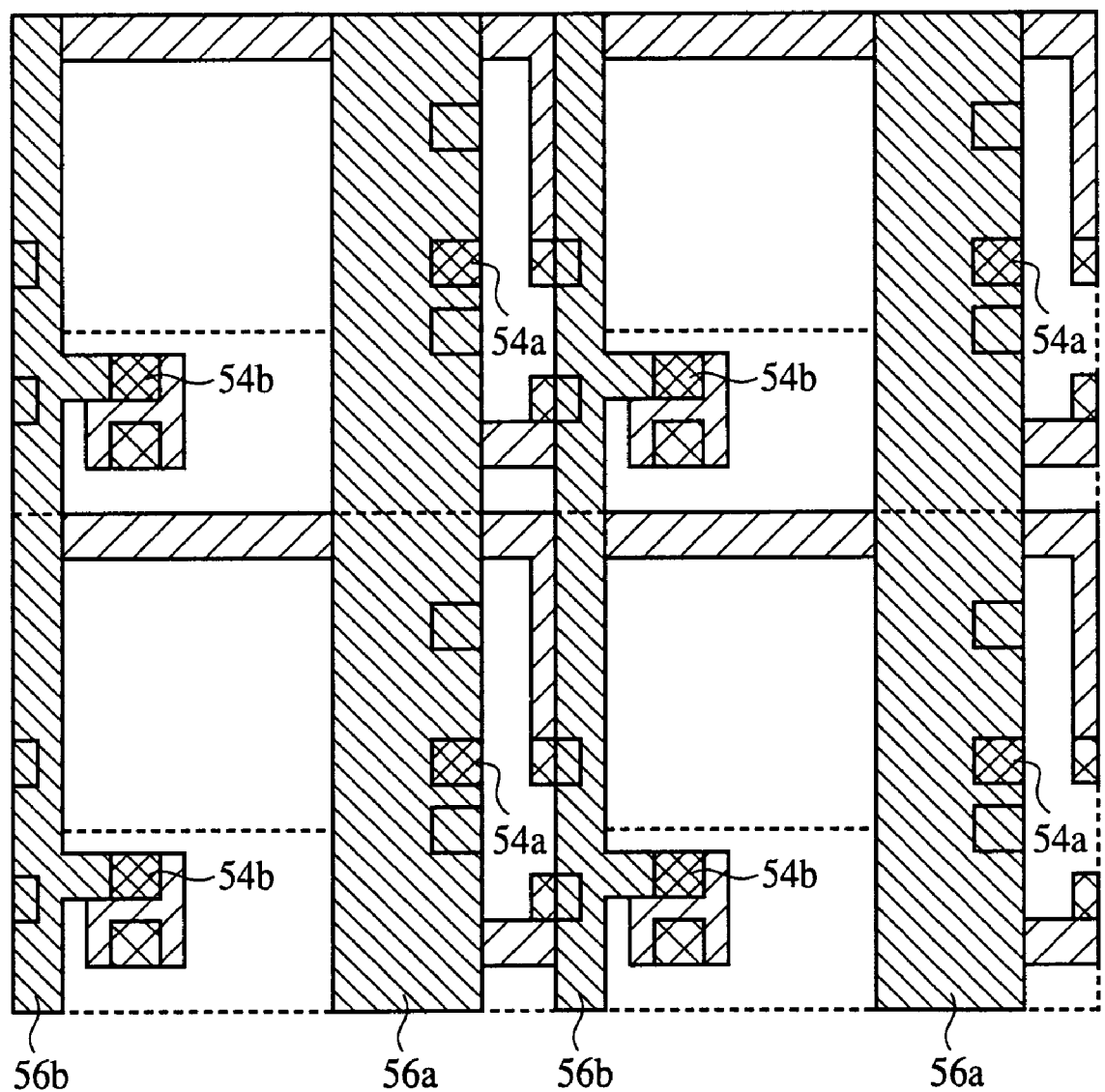
Figure 12:
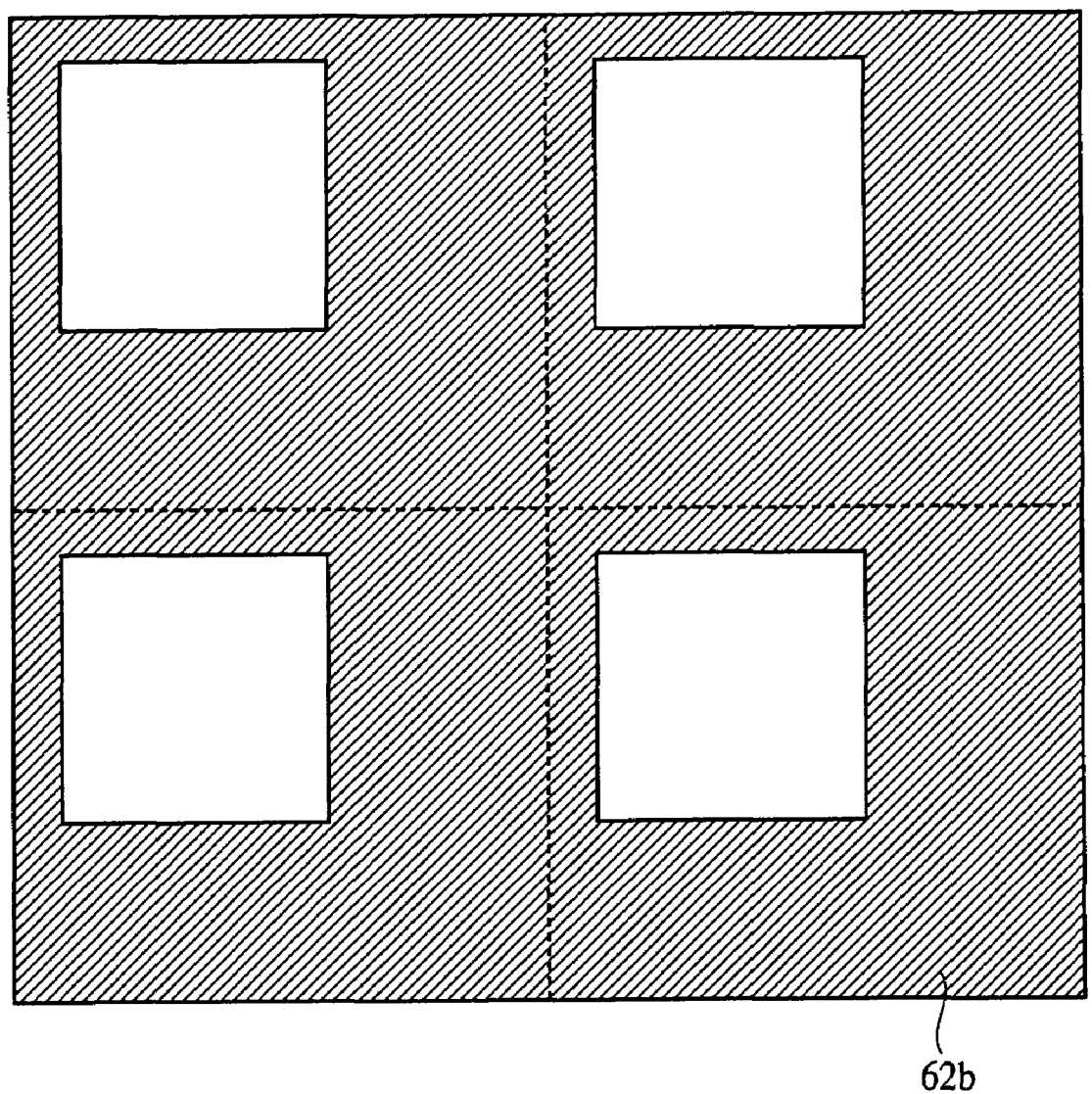

The structure of the solid-state image sensor according to the present embodiment will be specifically explained with reference to FIGS. 9 to 12. FIG. 9 is a plan view of a layout of the active regions and the gate interconnection in the pixel array unit. FIG. 10 is a plan view of a layout of the first metal interconnection in the pixel array unit. FIG. 11 is a plan view of a layout of the second metal interconnection in the pixel array unit. FIG. 12 is a plan view of a layout of the third metal interconnection in the pixel array unit.

As shown in FIG. 9, active regions are defined on a silicon substrate 10 by a device isolation film 22. Each active region contains a wide rectangular region as a photodiode region, and a substantially bracket-shaped region which is continuous to the photodiode region.

Four gate electrodes 28 are formed bridging above the active region. These gate electrodes 28 are, from the side of the photodiode region, the gate electrode $28_{TG}$ of a transfer transistor TG, the gate electrode $28_{RST}$ of a reset transistor RST, the gate electrode $28_{SF}$ of a source follower transistor SF-Tr, and the gate electrode $28_{SEL}$ of a select transistor SELECT. A select/TG line 28a is formed of the same conducting layer (gate interconnection) as the gate electrodes 28, and the select/TG line 28a, the gate electrode $28_{TG}$ connected to the select/TG line 28a and the gate electrode $28_{SEL}$ connected to the select/TG line 28a are formed in one pattern.

As shown in FIG. 10, the first metal interconnection layer 50 includes an RST line 50f connected to the gate electrode $28_{RST}$ via a contact plug 48d, an interconnection layer 50b connecting a floating diffusion FD region to the gate electrode $28_{SF}$ via a contact plug 48b and a contact plug 48c, and outgoing lines 50d, 50e respectively connected to the drain regions of the reset transistor RST and the source follower transistor SF-Tr, and the source region of the select transistor SELECT respectively via a contact plug 48e and a contact plug 48f.

As shown in FIG. 11, the second metal interconnection layer 56 includes a VR line 56a electrically connected to the drain regions of the reset transistor RST and the source follower transistor SF-Tr via a contact plug 54a, and a signal read line 56b electrically connected to the source region of the select transistor SELECT via a contact plug 54b.

As shown in FIG. 12, the third metal interconnection layer 62 forms no signal line but a light shield film 62 which covers the rest region of the pixel containing the floating diffusion FD region. In a case that the read is not performed by the global shutter mode, the light shield film 62b is not essentially formed.

As described above, the solid-state image sensor according to the present embodiment is characterized mainly in that the select/TG line 28a is formed of the gate interconnection, the gate electrodes $28_{TG}$ connected to the select/TG line 28a and the gate electrodes $28_{SEL}$ connected to the select/TG line 28a are formed in one continuous pattern, the RST line 50f is formed of the first interconnection layer 50, the VR line 56a and the signal read line 56b are formed of the second metal interconnection layer 56, and the light shield film 62b is formed of the third metal interconnection layer 62.

Thus, as in the first embodiment, the upper metal interconnection layers can have layout freedom. The third metal interconnection layer forms no signal line, and can be used as the light shield film alone. Accordingly, the floating diffusion FD can be effectively shielded, which is very effective to be used by the global shutter mode.

As described above, according to the present embodiment, the select/TG line, the gate electrode of the transfer transistor and the gate electrode of the select transistor are formed in one continuous pattern, which gives an allowance for the layout of the metal interconnection layers. The area can have allowance, which allows the floating diffusion to have a wider area, and the junction leakage can be reduced. The transfer transistor can have a larger gate width.

The third metal interconnection layer has to form no signal line and can be used to form the light shield film. Accordingly, the read by the global shutter mode can be enabled, and good images without "deflections" and "distortions" can be obtained.

A Third Embodiment

The solid-state image sensor according to a third embodiment of the present invention will be explained with reference to FIGS. 13 to 16.

FIGS. 13 to 16 are plan views of the solid-state image sensor according to the present embodiment, which show a structure thereof. The same members of the present embodiment as those of the solid-state image sensor according to the first and the second embodiments are represented by the same reference numbers not to repeat or to simplify their explanation.

The solid-state image sensor according to the present embodiment is the same as the solid-state image sensor according to the first embodiment in the circuit diagram, the operation and the fabrication method except that the layouts of the respective layers are different from those of the first embodiment. That is, in the solid-state image sensor according to the present embodiment as well, a TG line commonly connecting the gate terminals of the transfer transistors TG of the respective pixels of the $n^{th}$ row, and a select line commonly connecting the gate terminals of the select transistors SELECT of the respective pixels of the $n+1^{th}$ row are formed of a common signal line (select/TG line).

Figure 13:
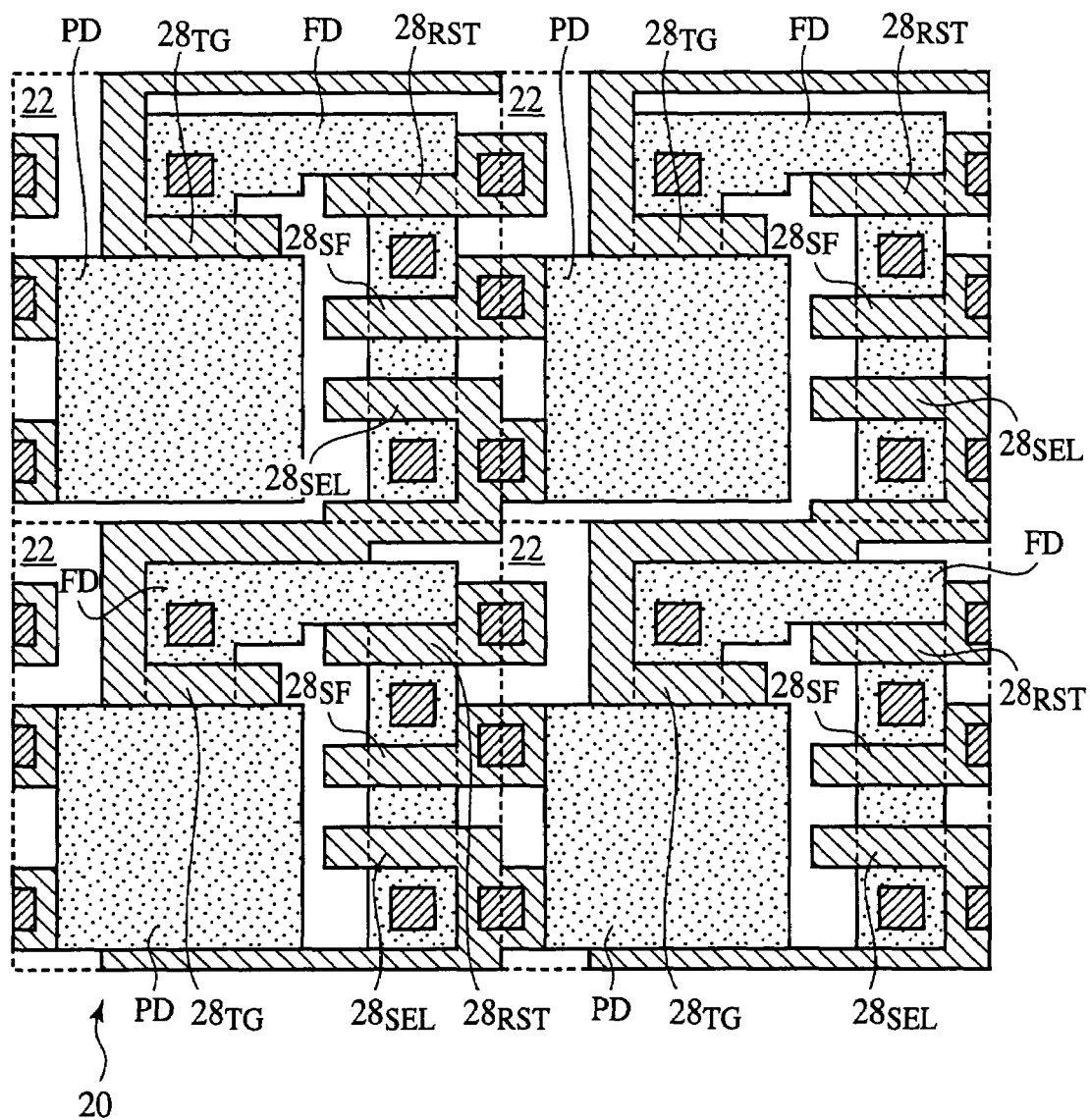
FIGS. 13-16 are plan views of the solid-state image sensor according to a third embodiment of the present invention which show a structure thereof.
Figure 14:
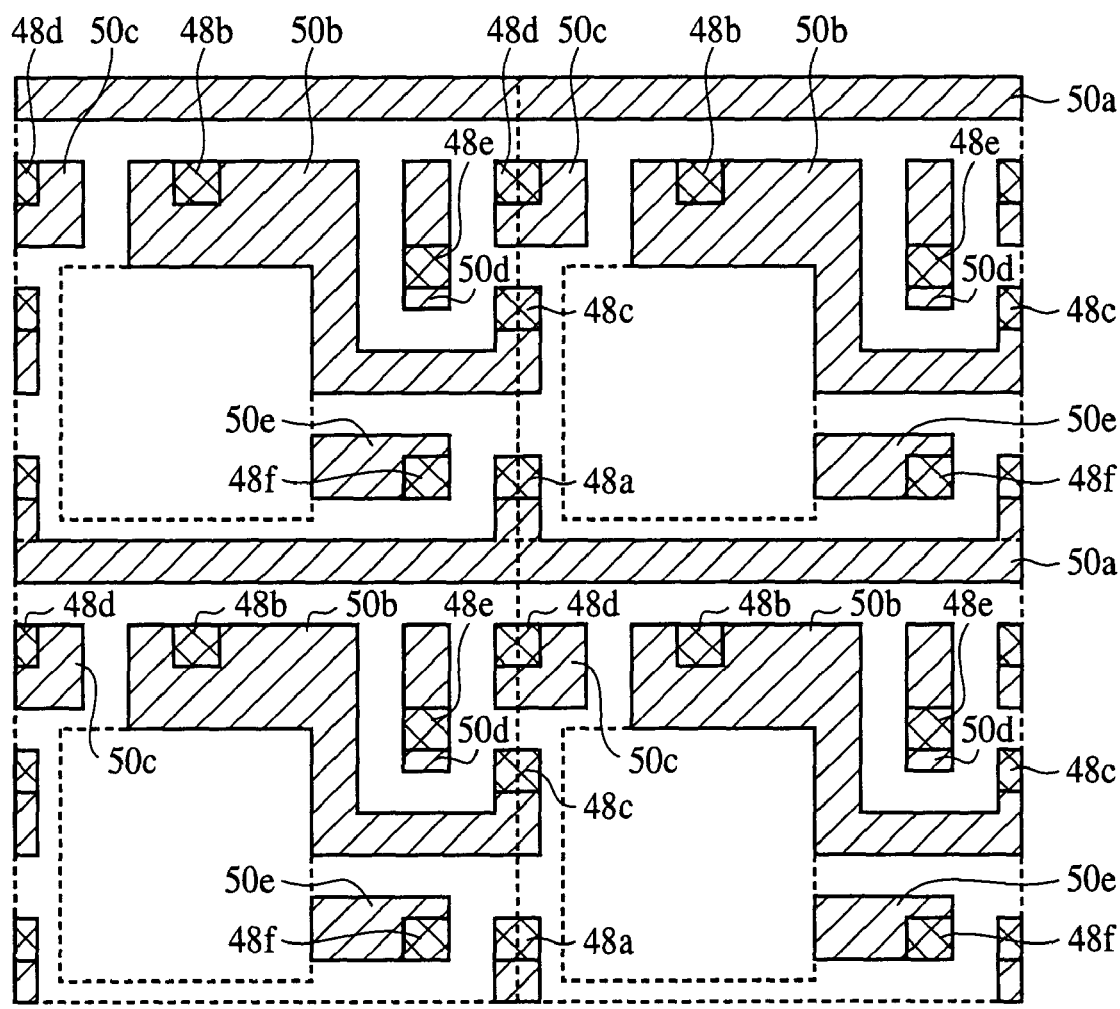
Figure 15:
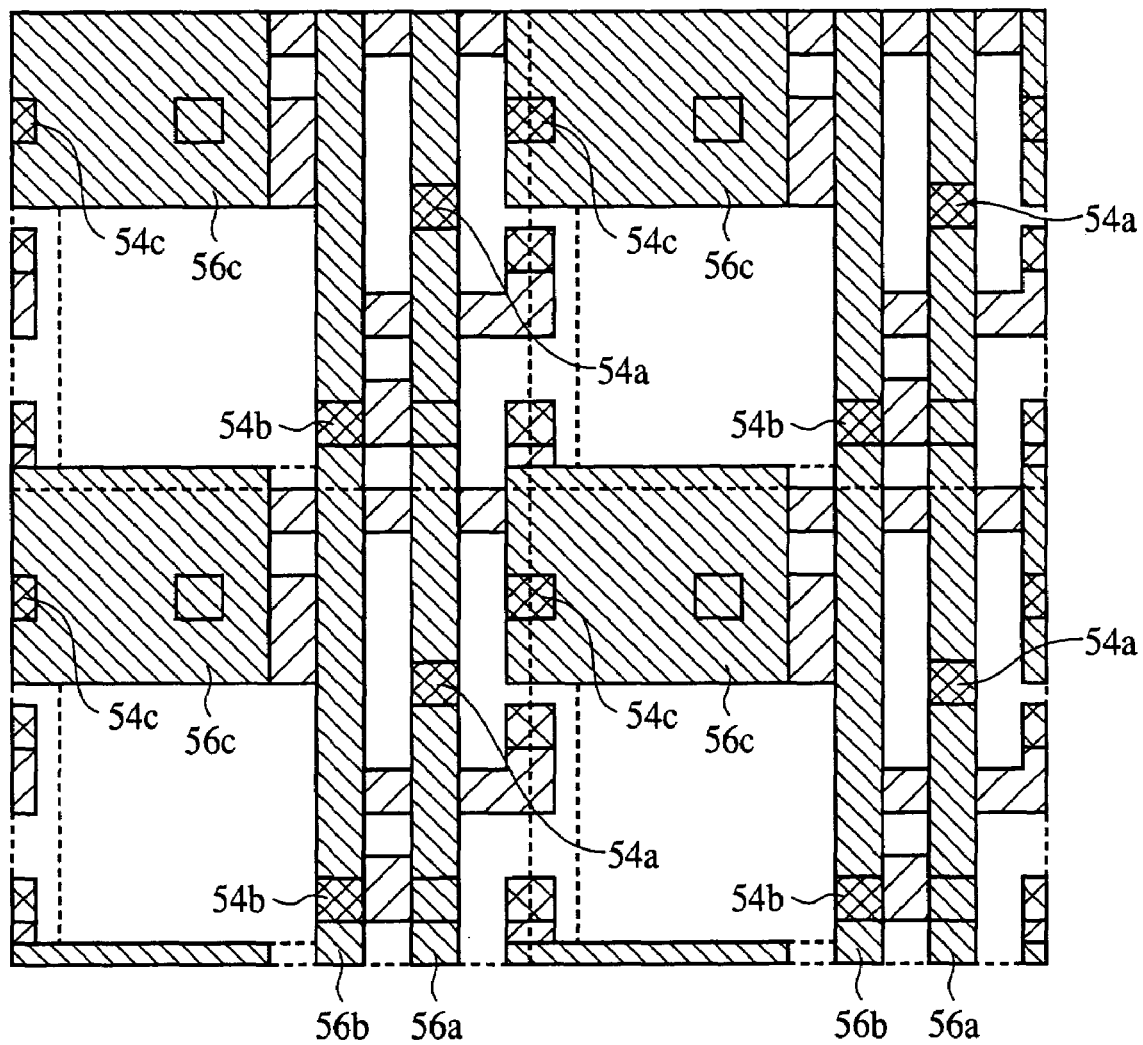
Figure 16:
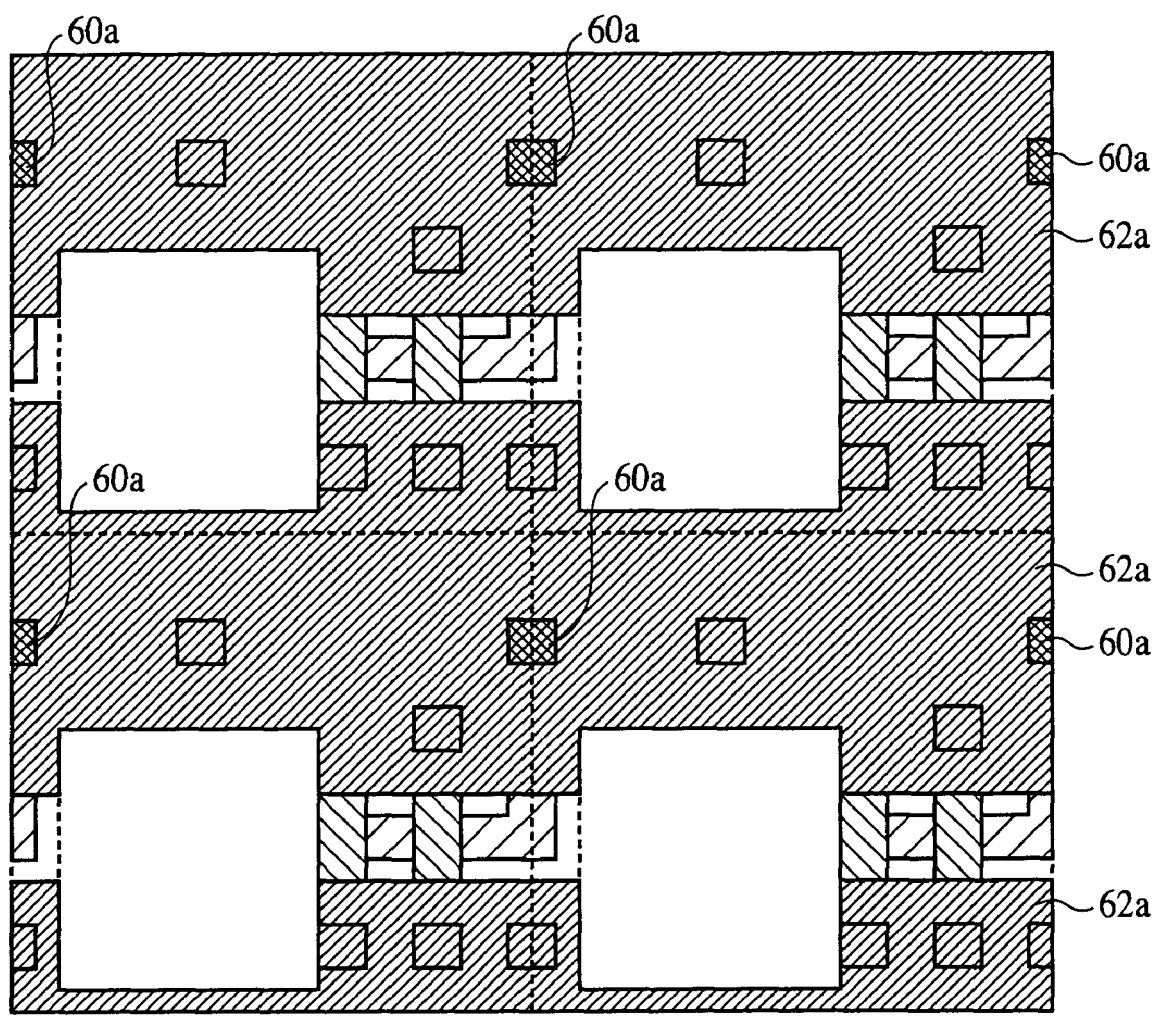

The structure of the solid-state image sensor according to the present embodiment will be specifically explained with reference to FIGS. 13 to 16. FIG. 13 is a plan view of the layout of the active regions and the gate interconnection in the pixel array unit. FIG. 14 is a plan view of the layout of first metal interconnection in the pixel array unit. FIG. 15 is a plan view of the layout of second metal interconnection in the pixel array unit. FIG. 16 is a plan view of the layout of third metal interconnection in the pixel array unit.

As shown in FIG. 13, active regions are defined by a device isolation film 22 on a silicon substrate 20. Each active region contains a wide rectangular region as a photodiode region and a substantially bracket-shaped region which is continuous to the photodiode region. In terms of the active regions of the solid-state image sensor according to the first and the second embodiments, the active regions of the solid-state image sensor according to the present embodiment are those of former, which are turned counter-clockwise by 90°.

Four gate electrodes 28 are formed bridging above the active region. The gate electrodes 28 are, from the side of the photodiode region, the gate electrode $28_{TG}$ of a transfer transistor TG, the gate electrode $28_{RST}$ of a reset transistor RST, the gate electrode $28_{SF}$ of the source follower transistor SF-Tr and the gate electrode $28_{SEL}$ of a select transistor SELECT. The gate electrode $28_{TG}$ is formed in one pattern which is continuous to the gate electrodes $28_{SEL}$ of the pixels adjacent to each other in the column direction.

As shown in FIG. 14, a first metal interconnection layer 50 includes a select/TG line 50a connected to the gate electrode $28_{TG}$ and the gate electrode $28_{SEL}$ via a contact plug 48a, an interconnection layer 50b connecting a floating diffusion FD region and the gate electrode $28_{SF}$ via a contact plug 48b and a contact plug 48c, outgoing lines 50c, 50d, 50e respectively connected to the gate electrode $28_{RST}$, the drain regions of the reset transistor RST and the source follower transistor SF-Tr, and the source region of the select transistor SELECT respectively via contact plugs 48d, 48e, 48f.

As shown in FIG. 15, a second metal interconnection layer 56 includes a VR line 56a electrically connected to the drain regions of the reset transistor RST and the source follower transistor SF-Tr via a contact plug 54a, a signal read line 56b electrically connected to the source region of the select transistor SELECT via a contact plug 54b, and an outgoing line 56c electrically connected to the gate electrode $28_{RST}$ via a contact plug 54c.

As shown in FIG. 16, a third metal interconnection layer 62 includes an RST line 62a electrically connected to the gate electrode $28_{RST}$ via a contact plug 60a.

As described above, in the solid-state image sensor according to the present embodiment as well as in the solid-state image sensor according to the first embodiment, the gate electrode $28_{TG}$ and the gate electrode $28_{SEL}$ are formed in one continuous pattern, the select/TG line 50a is formed of the first metal interconnection layer 50, the VR line 56a and the signal read line 56b are formed of the second metal interconnection layer 56, and the RST line 62a is formed of the third metal interconnection layer 62.

The solid-state image sensor according to the present embodiment is characterized mainly by the above-described layout of the gate electrodes. As shown in FIG. 13, on the right side inside the region of each pixel, the gate electrode $28_{RST}$, the gate electrode $28_{SF}$ and the gate electrode $28_{SEL}$ are formed in parallel with each other in the column direction. On the left side inside the region of each pixel, the gate electrode $28_{TG}$ and the photodiode PD are adjacently formed in the column direction. All the gate electrodes are extended in the row direction, i.e., with the gate width extended in the row direction.

Such layout of the gate electrodes 18 makes it possible to arrange the floating diffusion FD extended in the row direction, securing an area of the photodiode PD, and the floating diffusion FD can have a larger area. The gate electrode $28_{TG}$ is arranged along the extension of the floating diffusion FD (in the row direction), which facilitates enlarging a channel width of the transfer transistor TG. The transfer transistor TG is located at a part near the upper end of the pixel, and the select transistor SELECT is located at a part near the lower end of the select transistor SELECT, which facilitates the connection between the gate electrode $28_{TG}$ and the gate electrode $28_{SEL}$.

As described above, according to the present embodiment, the gate electrode of the reset transistor, the gate electrode of the source follower transistor and the gate electrode of the select transistor are formed in parallel with each other in the column direction, and the gate electrode of the transfer transistor and the photodiode are adjacently formed in the column direction, whereby the floating diffusion can have the area increased with the area of the photodiode retained. The transfer transistor of one pixel and the select transistor of the adjacent pixel can be located near each other, which facilitates their connection.

Figure 17:
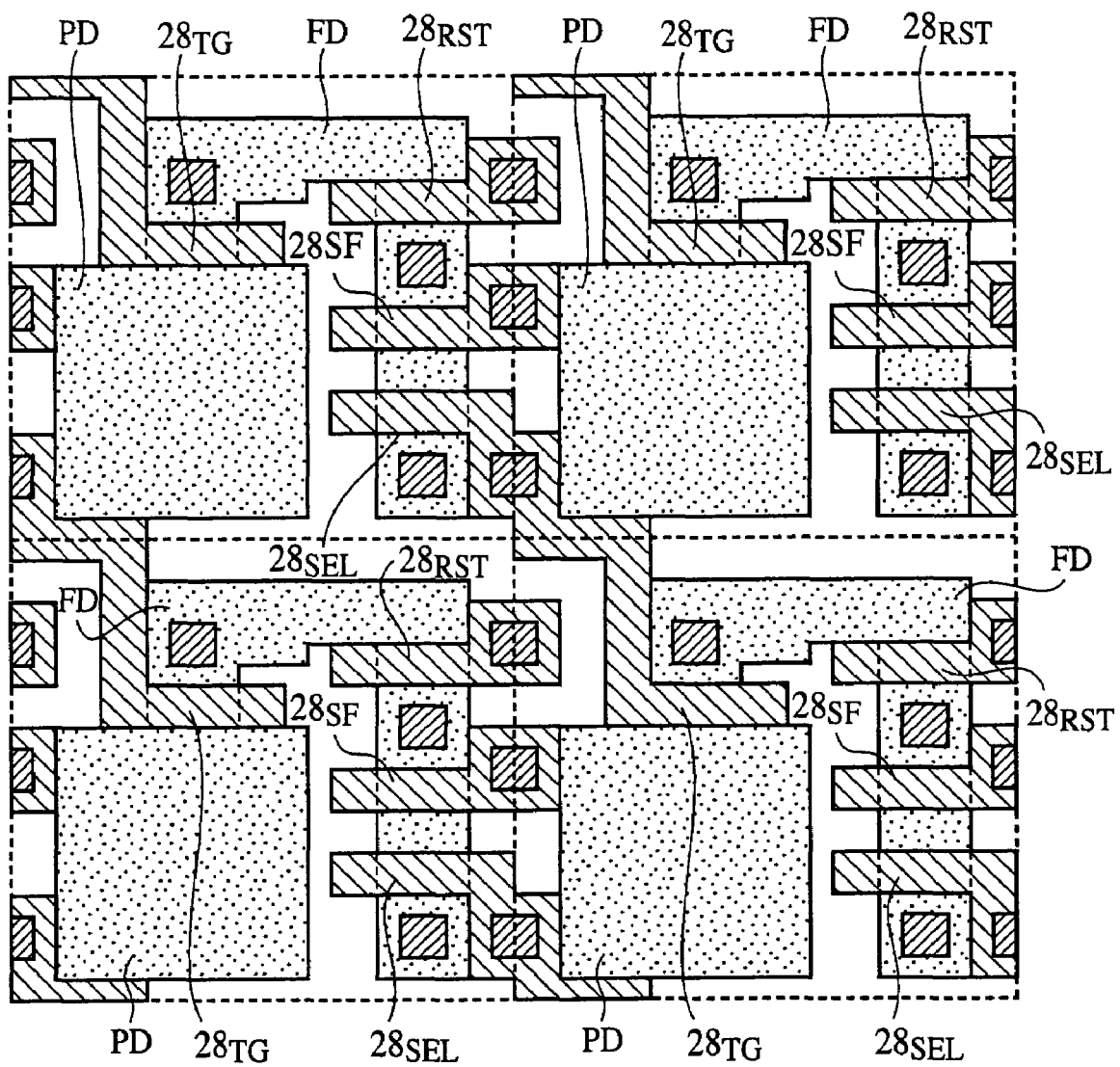
FIG. 17 is a plan view of the solid-state image sensor according to a modification of the third embodiment of the present invention, which shows a structure thereof.

In the present embodiment, the gate electrode $28_{TG}$ and the gate electrodes $28_{SEL}$ of the pixels adjacent with each other in the column direction are formed in one continuous pattern. However, as shown in FIG. 17, the gate electrodes $28_{TG}$ and the gate electrodes $28_{SEL}$ of the pixels diagonally adjacent to each other may be formed in one continuous pattern, which permits the gate interconnection length to be shorter.

A Fourth Embodiment

The solid-state image sensor according to a fourth embodiment of the present invention will be explained with reference to FIGS. 18 to 21.

FIGS. 18 to 21 are plan views of the solid-state image sensor according to the present embodiment, which show a structure thereof. The same members of the present embodiment as those of the solid image sensor according to the first to the third embodiments shown in FIGS. 1 to 17 are represented by the same reference numbers not to repeat or to simplify their explanation.

The solid-state image sensor according to the present embodiment is the same as the solid-state image sensor according to the first embodiment in the circuit diagram, the operation and the fabrication method except that the plane layout of the respective layers are different from those of the solid-state image sensor according to the first embodiment. That is, in the solid-state image sensor according to the present embodiment as well, a TG line commonly connecting the gate terminals of the transfer transistors TG of the respective pixel of the $n^{th}$ row, and a select line commonly connecting the gate terminals of the select transistors SELECT of the respective pixels of the $n+1^{th}$ row are formed of a common signal line (select/TG line).

Figure 18:
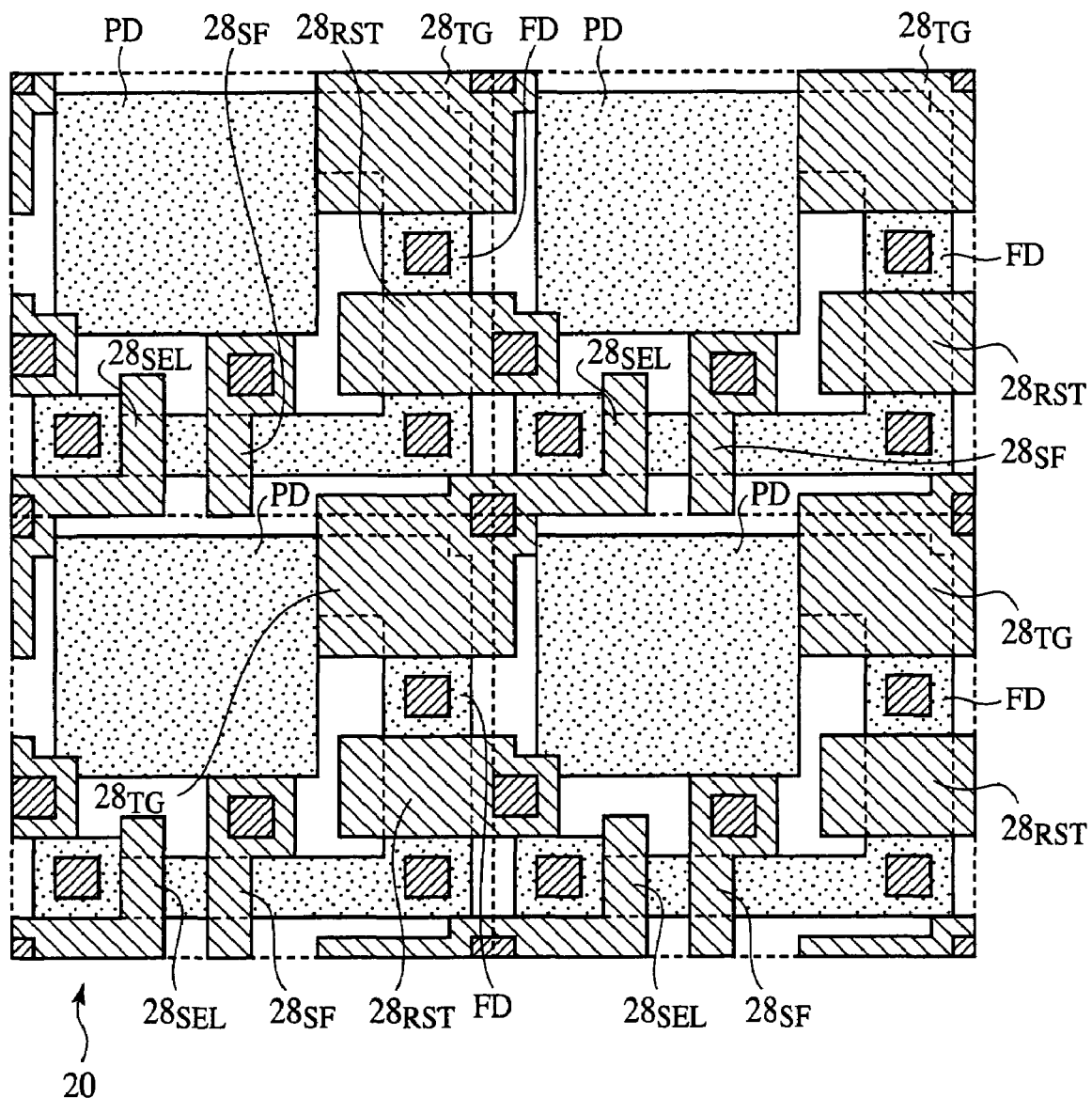
FIGS. 18-21 are plan views of the solid-state image sensor according to a fourth embodiment of the present invention which show a structure thereof.
Figure 19:
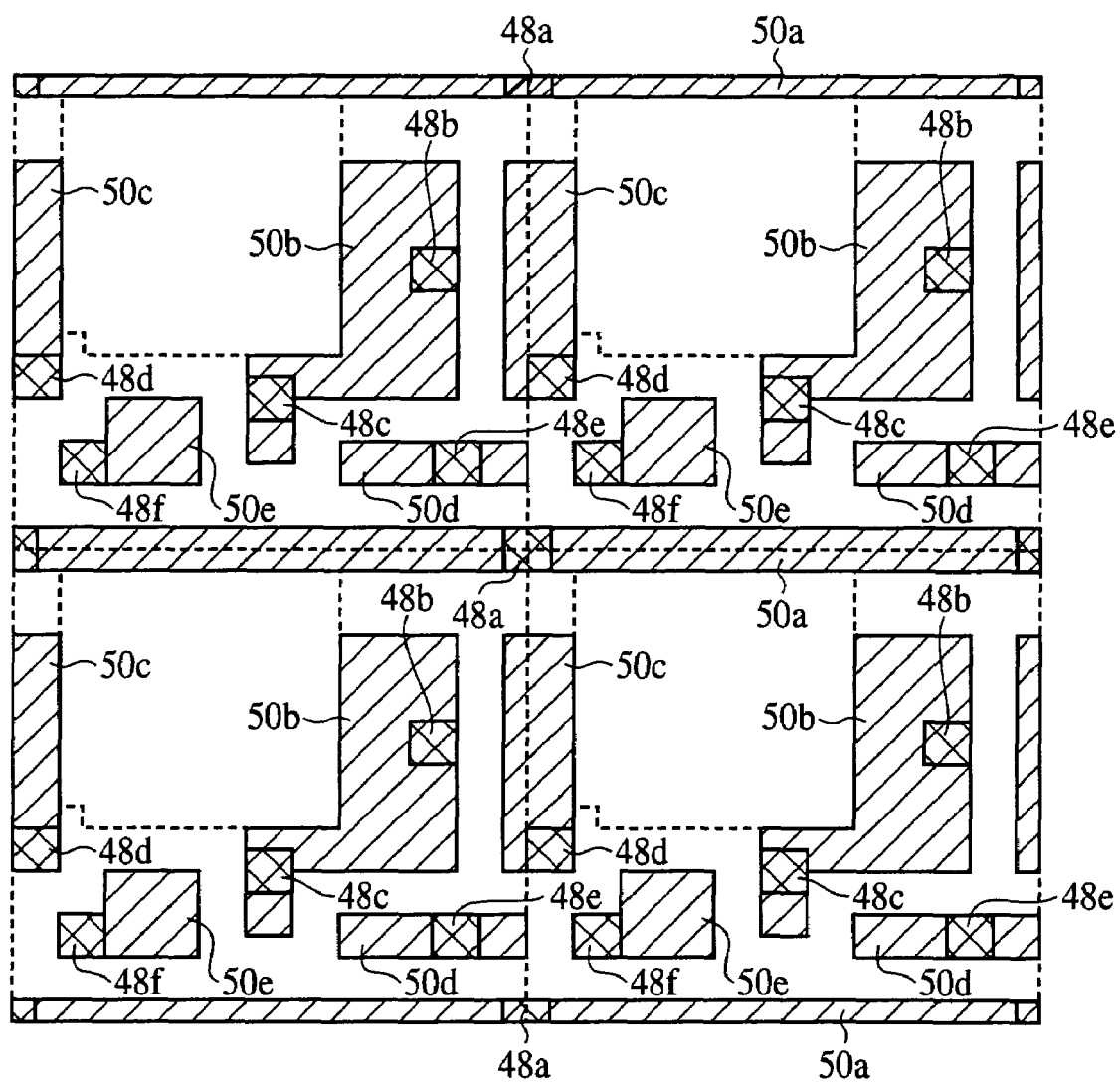
Figure 20:
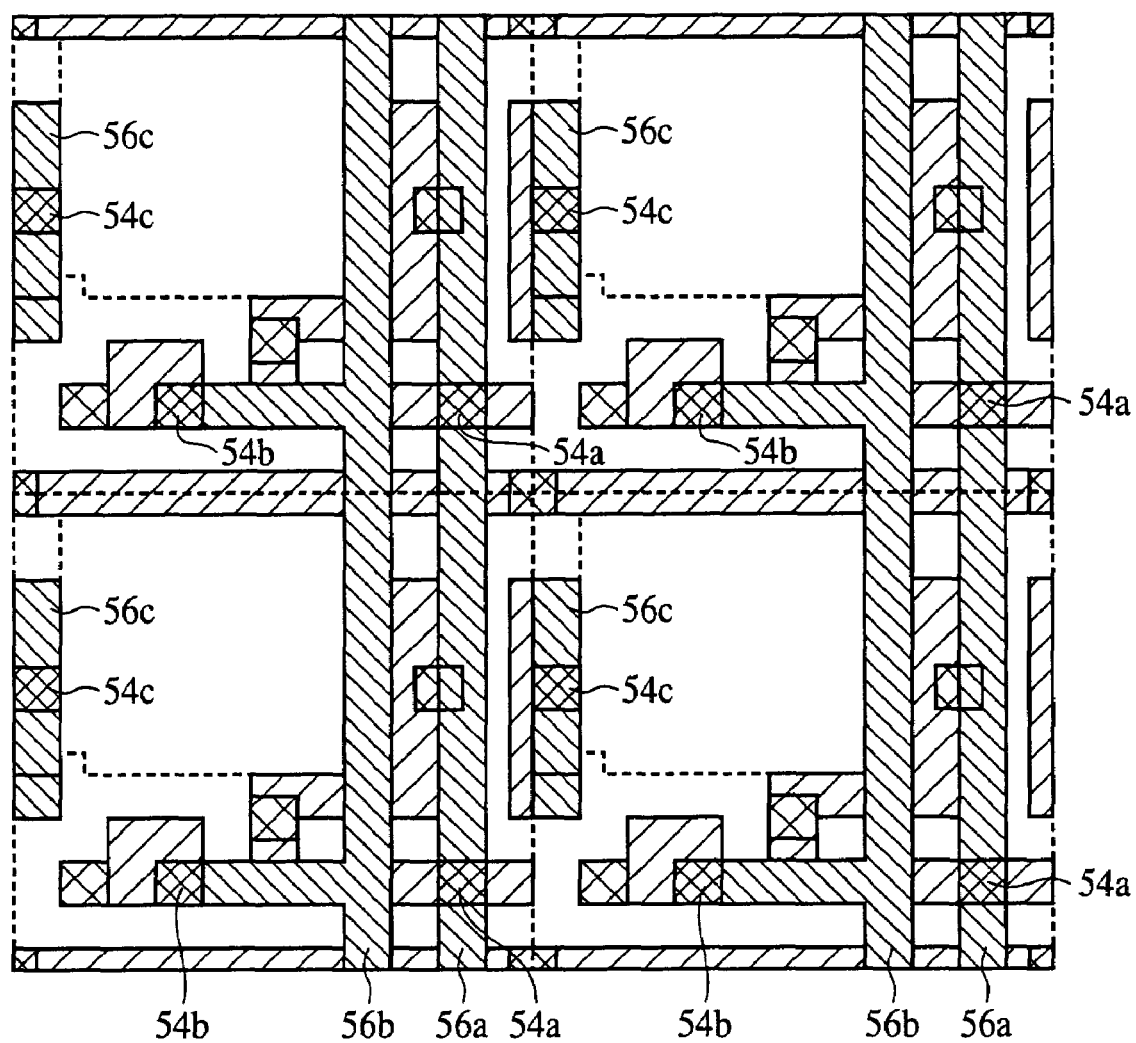
Figure 21:
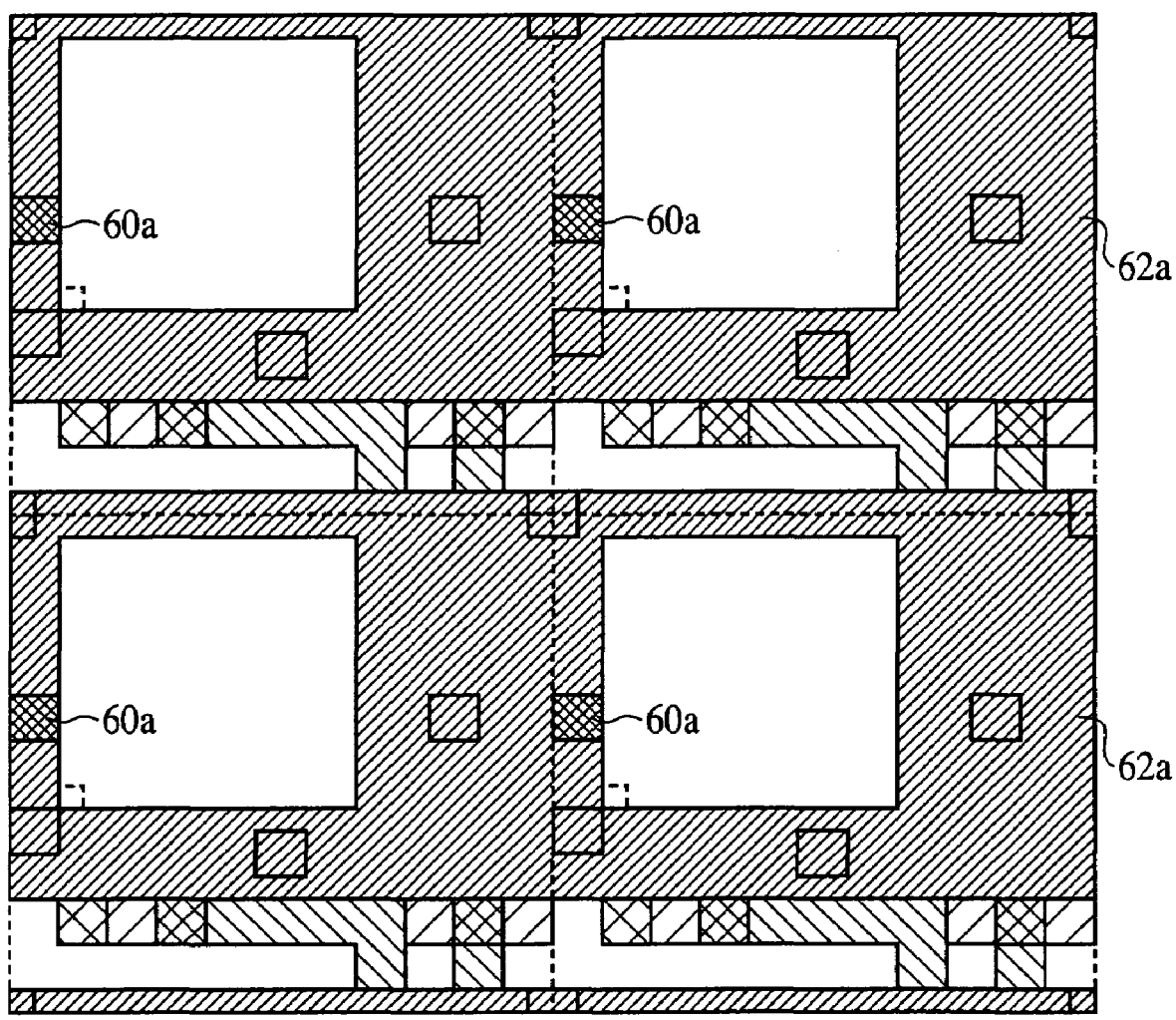

The structure of the solid-state image sensor according to the present embodiment will be specifically explained with reference to FIGS. 18 to 21. FIG. 18 is a plan view of the layout of the active regions and the gate interconnections in the pixel array unit. FIG. 19 is a plan view of a layout of the first metal interconnection in the pixel array unit. FIG. 20 is a plan view of a layout of the second metal interconnection in the pixel array unit. FIG. 21 is a plan view of a layout of the third metal interconnection in the pixel array unit.

As shown in FIG. 18, active regions are defined on a silicon substrate 20 by a device isolation film 22. Each active region includes a wide rectangular region as a photodiode region and a substantially bracket-shaped region continuous to the photodiode region.

In each active region, four gate electrodes 28 are formed bridging above the active region. These gate electrodes 28 are, from the side of the photodiode region, a gate electrode $28_{TG}$ of the transfer transistor TG, the gate electrode $28_{RST}$ of a reset transistor RST, the gate electrode $28_{SF}$ of a source follower transistor SF-Tr, and the gate electrode $28_{SEL}$ of a select transistor SELECT. The gate electrode $28_{TG}$ is formed in one pattern continuous to the gate electrode $28_{SEL}$ of the pixels diagonally adjacent to each other.

As shown in FIG. 19, the first metal interconnection layer 50 includes a select/TG line connected to the gate electrode $28_{TG}$ and the gate electrode $28_{SEL}$ via a contact plug 48a, an interconnection layer 50b connecting a floating diffusion FD region and the gate electrode $28_{SF}$ via a contact plug 48b and a contact plug 48c, and outgoing lines 50c, 50d, 50e connected respectively to the gate electrode $28_{RST}$, the drain regions of the reset transistor RST and the source follower transistor SF-Tr, and the source region of the select transistor SELECT respectively via a contact plug 48d, a contact plug 48e, and a contact plug 48f.

As shown in FIG. 20, the second metal interconnection layer 56 includes a VR line 56a electrically connected to the drain regions of the reset transistor RST and the source follower transistor SF-Tr via a contact plug 54a, a signal read line 56b electrically connected to the source region of the select transistor SELECT via a contact plug 54b, and an outgoing line 56c electrically connected to the gate electrode $28_{RST}$ via a contact plug 54c.

As shown in FIG. 21, the third metal interconnection layer 62 includes an RST line 62a electrically connected to the gate electrode $28_{RST}$ via a contact plug 60a.

As described above, in the solid-state image sensor according to the present embodiment as well as in the solid-state image sensor according to the first embodiment, the gate electrode $28_{TG}$ and the gate electrode $28_{SEL}$ are formed in one continuous pattern, and the select/TG line is formed of the first metal interconnection layer 50, the VR line 56a and the signal read line 56b are formed of the second metal interconnection layer 56, and the RST line 62a is formed of the third metal interconnection layer 62.

The solid-state image sensor according to the present embodiment is characterized mainly by the above-described layout of the gate electrodes 28. As shown in FIG. 18, the gate electrode $28_{TG}$ is positioned near the upper right in the pixel, the gate electrode $28_{SEL}$ is positioned near the lower left in the pixel, and the gate electrode $28_{TG}$ is formed in one pattern continuous to the gate electrodes $28_{SEL}$ of the pixels diagonally adjacent to each other. The gate electrode $28_{SF}$ and the gate electrode $28_{SEL}$ are adjacently formed in parallel with each other in row direction. The gate electrodes 28 are thus arranged, whereby the channel lengths of the gate electrode $28_{TG}$ and the gate electrode $28_{RST}$ can be large with the area of the photodiode PD retained. Thus, the threshold voltages $V_{th}$ of these transistors can be low. The low threshold voltage of the source follower transistor SF-Tr can increase the signal voltage ($VR-V_{th}$), and a large signal range can be obtained. A low threshold voltage of the transfer transistor TG smoothes the transfer of signal charges from the photodiodes PD to the floating diffusion FD.

As described above, according to the present embodiment, the gate electrode of the transfer transistor and the gate electrode of the select transistor of the pixels diagonally adjacent to each other are formed in one continuous pattern, whereby the channel lengths of the transfer transistor and the reset transistor can be made large with the area of photodiode retained. Thus, the transistors can have low threshold voltages $V_{th}$.

A Fifth Embodiment

The solid-state image sensor according to a fifth embodiment of the present invention will be explained with reference to FIGS. 22 to 25.

FIGS. 22 to 25 are plan views of the solid-state image sensor according to the present embodiment, which show a structure thereof. The same members of the present embodiment as those of the solid-state image sensor according to the first to the fourth embodiments shown in FIGS. 1 to 21 are represented by the same reference numbers not to repeat or to simplify their explanation.

Figure 22:
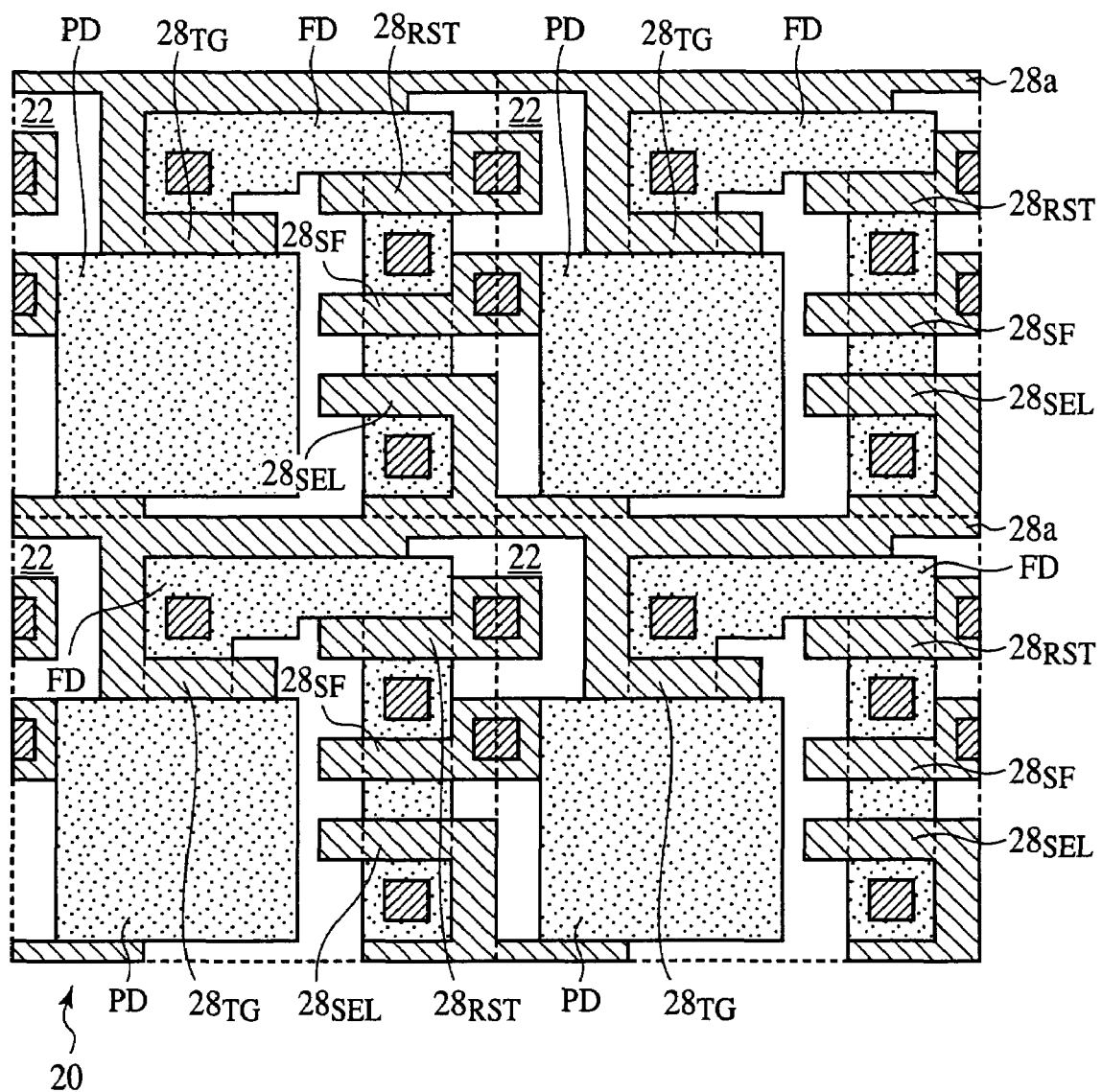
FIGS. 22-25 are plan views of the solid-state image sensor according to a fifth embodiment of the present invention which show a structure thereof.
Figure 23:
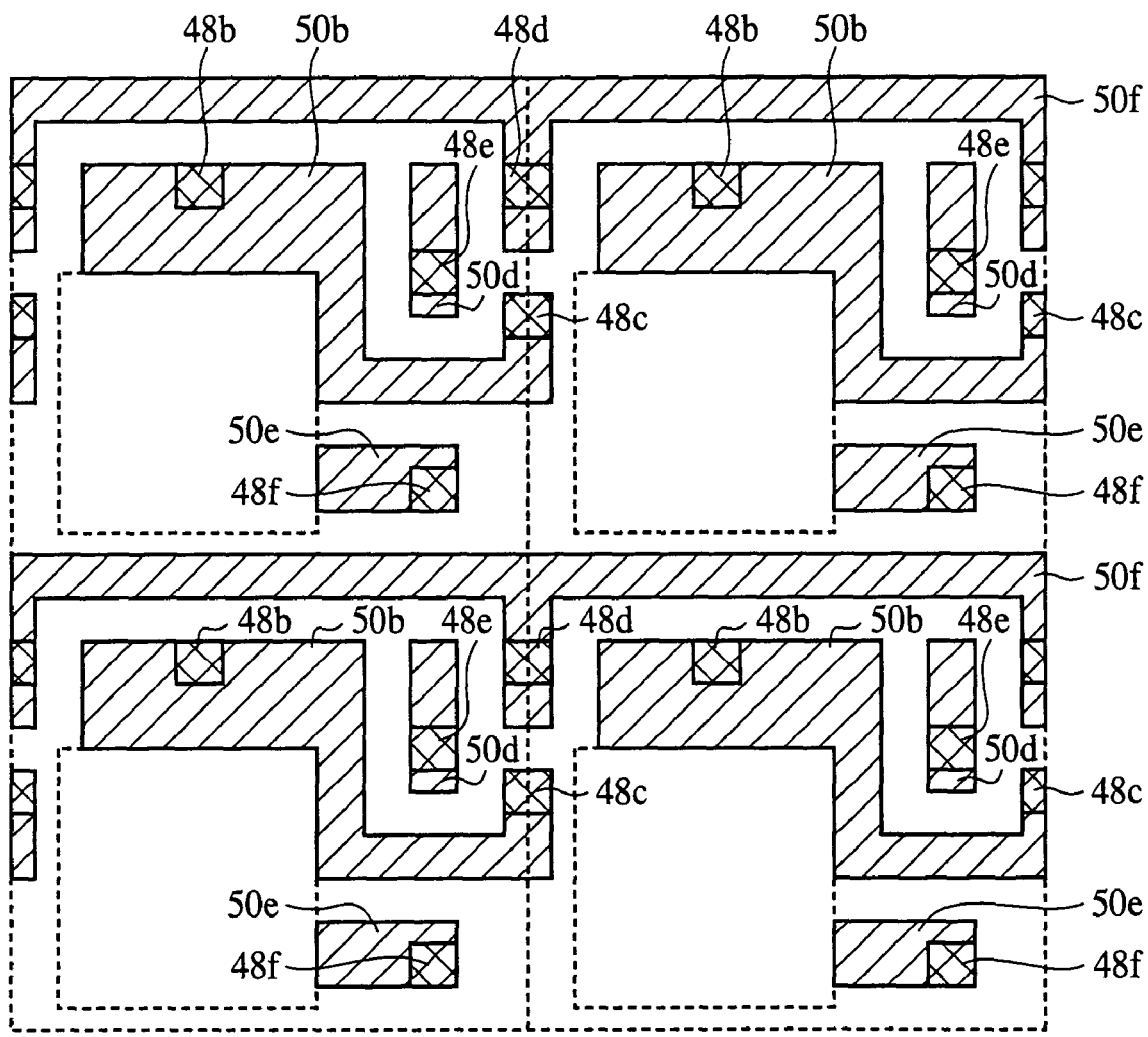
Figure 24:
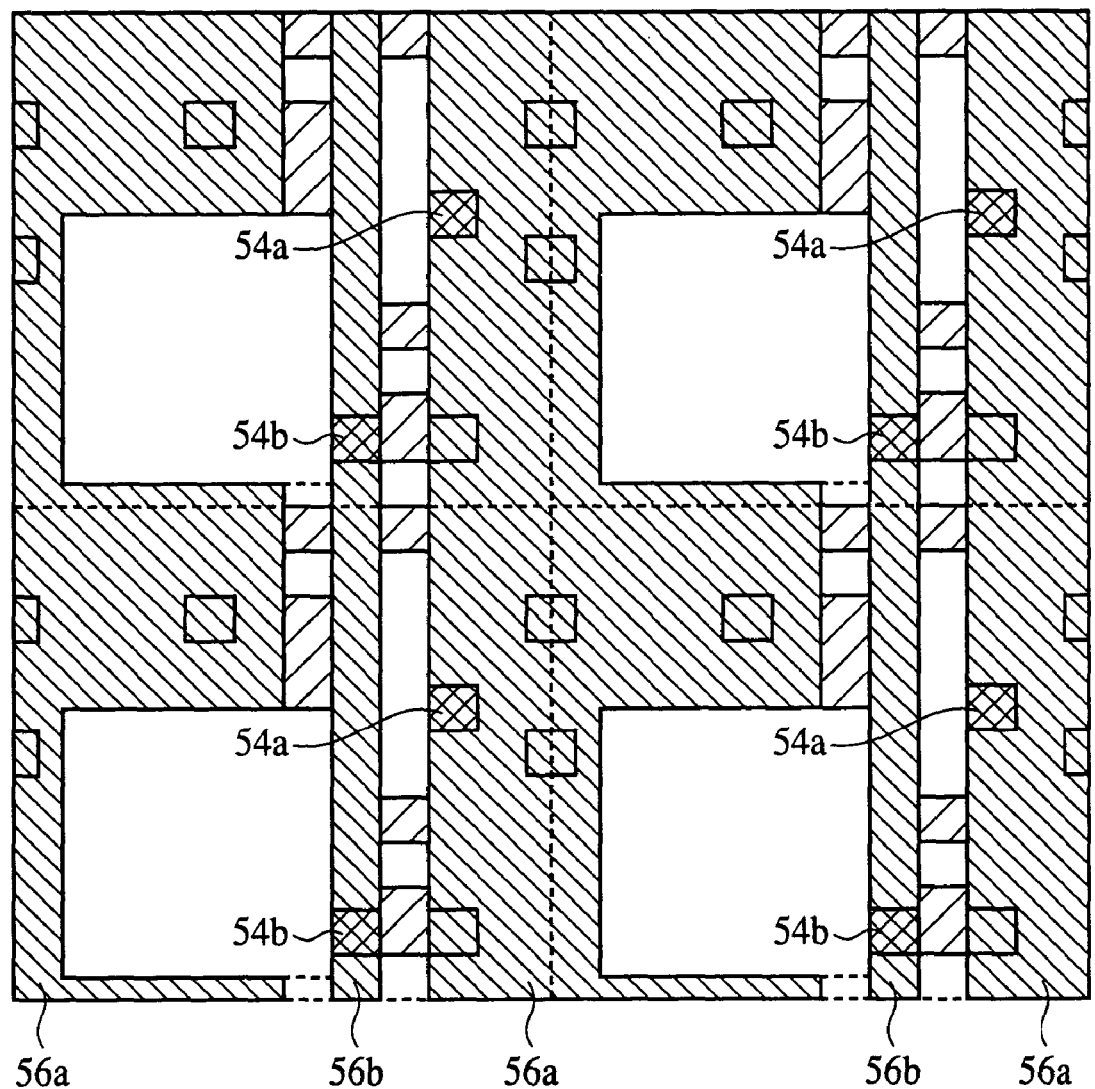
Figure 25:
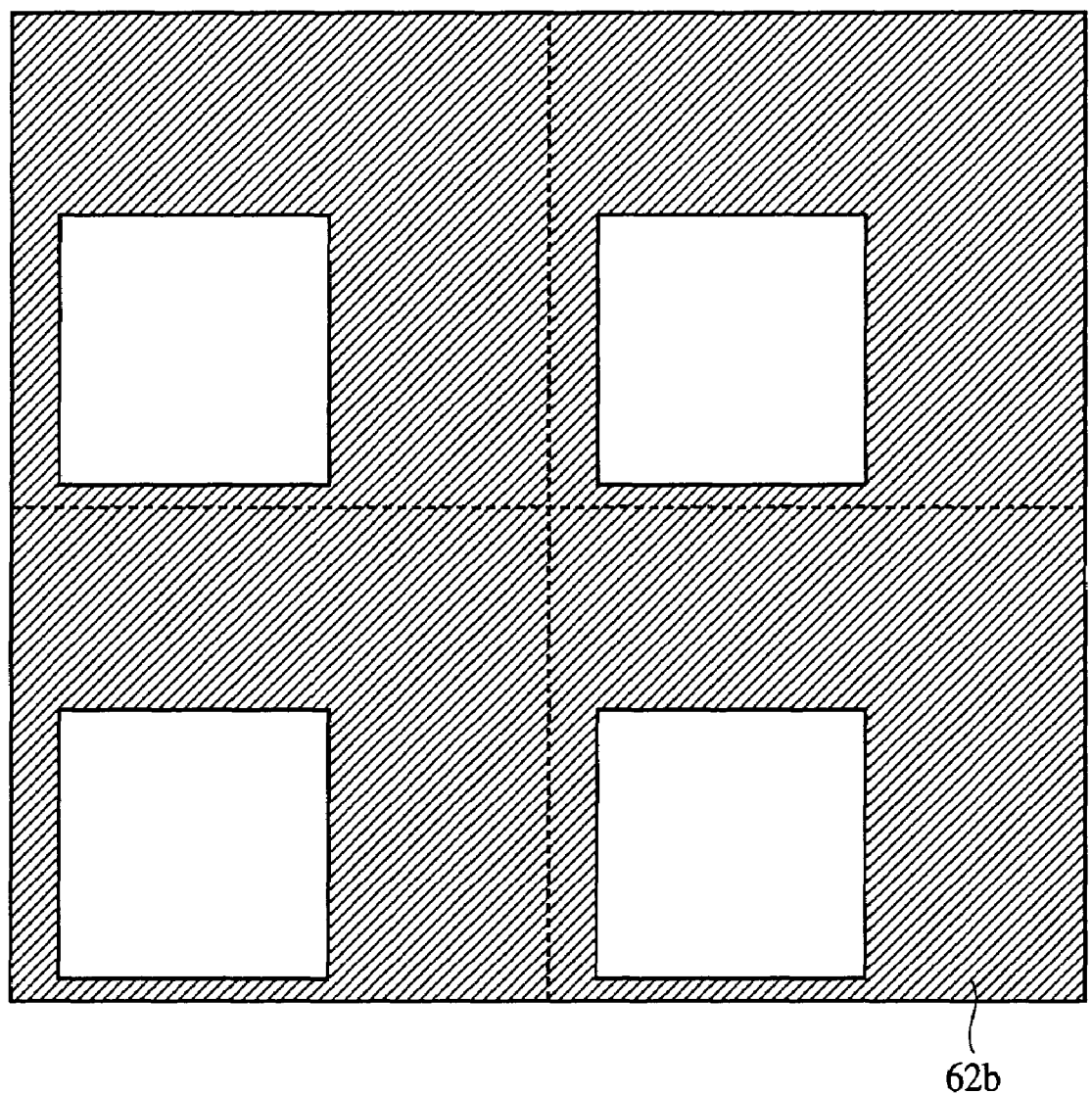

The structure of the solid-state image sensor according to the present embodiment will be specifically explained with reference to FIGS. 22 to 25. FIG. 22 is a plan view of a layout of the active regions and the gate interconnection in the pixel array unit. FIG. 23 is a plan view of a layout of the first metal interconnection in the pixel array unit. FIG. 24 is a plan view of a layout of the second metal interconnection in the pixel array unit. FIG. 25 is a plan view of a layout of the third metal interconnection in the pixel array unit.

As shown in FIG. 22, active regions are defined on a silicon substrate 20 by a device isolation film 22. Each active region contains a wide rectangular region as a photodiode region and a substantially bracket-shaped region continuous to the photodiode region. In terms of the active regions of the solid-state image sensor according to the first and the second embodiments, the active regions of the solid-state image sensor according to the present embodiment are the active regions of solid-state image sensor according to the former, which are turned counter-clockwise by 90°.

In each active region, four gate electrodes 28 are formed bridging above the active region. These gate electrodes are, from the side of the photodiode region, the gate electrode $28_{TG}$ of a transfer transistor TG, the gate electrode $28_{RST}$ of a reset transistor RST, the gate electrode $28_{SF}$ of a source follower transistor SF-Tr and the gate electrode $28_{SEL}$ of a select transistor SELECT. A select/TG line 28 is formed of the same conducting layer (the gate interconnection) that forms the gate electrodes 28, and the select/TG line 28a, the gate electrode $28_{TG}$ connected to the select/TG line 28a and the gate electrode $28_{SEL}$ connected to the select/TG line 28a are formed in one pattern.

As shown in FIG. 23, a first metal interconnection layer 50 includes an RST line 50f connected to the gate electrode $28_{RST}$ via a contact plug 48d, an interconnection layer 50b interconnecting a floating diffusion FD region and the gate electrode $28_{SF}$ via a contact plug 48b and a contact plug 48c, outgoing lines 50d, 50e respectively connected to the drain regions of the reset transistor RST and the source follower transistor SF-Tr, and the source region of the select transistor SELECT respectively via contact plugs 48e, 48f.

As shown in FIG. 24, a second metal interconnection layer 56 includes a VR line 56a electrically connected to the drain regions of the reset transistor RST and the source follower transistor SF-Tr via a contact plug 54a, and a signal read line 56b electrically connected to the source region of select transistor SELECT via a contact plug 54b.

As shown in FIG. 25, the third metal interconnection layer 62 forms no signal line but a light shield film 62b which exposes the photodiode PD region and covers the rest region of the pixel containing the floating diffusion FD.

As described above, in the solid-state image sensor according to the present embodiment as well as the solid-state image sensor according to the second embodiment, the select/TG line 28a is formed of the gate interconnection, and the gate electrode $28_{TG}$ connected to the select/TG line 28a and the gate electrode $28_{SEL}$ connected to the select/TG line 18a are formed in one continuous pattern. The RST line 50f is formed of the first metal interconnection layer 50, the VR line 56a and the signal read line 56b are formed of the second metal interconnection layer 56, and the light shield film 62b is formed of the third metal interconnection layer 62. The layout of the active region and the gate electrodes 28 is the same as that of the solid-state image sensor according to the third embodiment.

As described above, in the solid-state image sensor according to the present embodiment as well as the solid-state image sensor according to the second embodiment, the layout of the metal interconnection layers can have freedom, and the third metal interconnection layer can be used for the light shield film alone. Thus, the floating diffusion can be effectively shielded, which is very effective to use the global shutter mode.

As in the solid-state image sensor according to the third embodiment, the area of the floating diffusion can be large with the area of the photodiode retained. The transfer transistor of one pixel can be positioned near the select transistor of a pixel adjacent to the former, which facilitates their connection.

A Sixth Embodiment

The solid-state image sensor according to a sixth embodiment of the present invention will be explained with reference to FIGS. 26 to 29.

FIGS. 26 to 29 are plan views of the solid-state image sensor according to the present embodiment, which show a structure thereof. The same members of the present embodiment as those of the solid-state image sensor according to the first to the fifth embodiments shown in FIGS. 1 to 25 are represented by the same reference numbers not to repeat or to simplify their explanation.

The solid-state image sensor according to the present embodiment is the same as the solid-state image sensor according to the first embodiment in the circuit diagram, the operation and the fabrication method except that the layouts of the respective layers are different from those of the solid-state image sensors according to the first embodiment. That is, in the solid-state image sensor according to the present embodiment as well, a TG line commonly connecting the gate terminals of the transfer transistors TG of the respective pixels of the nth row, and a select line commonly connecting the gate terminals of the select transistors SELECT of the respective pixels of the n+1th row are formed of a common signal line (select/TG line).

Figure 26:
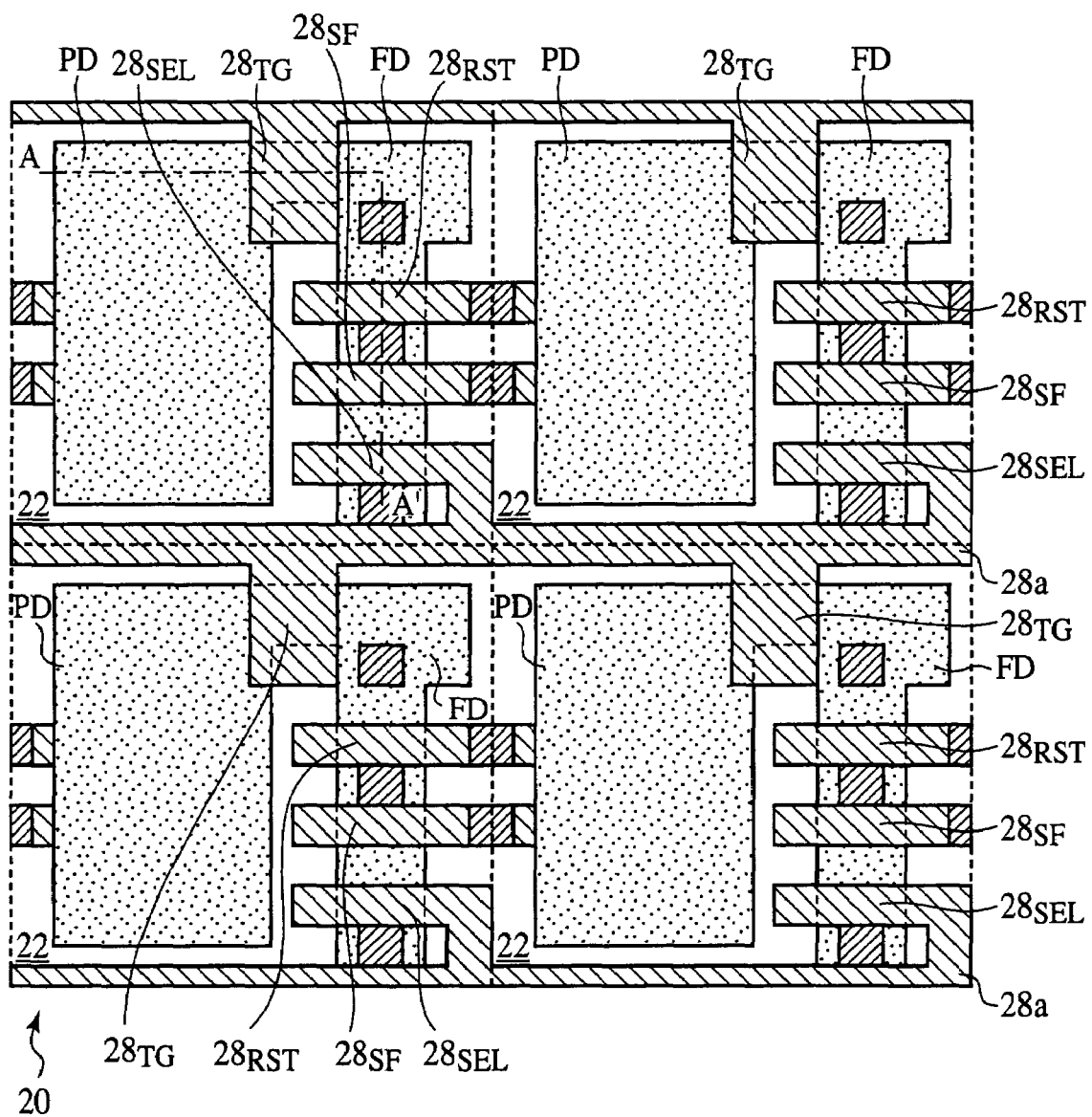
FIGS. 26-29 are plan views of the solid-state image sensor according to a sixth embodiment of the present invention which show a structure thereof.
Figure 27:
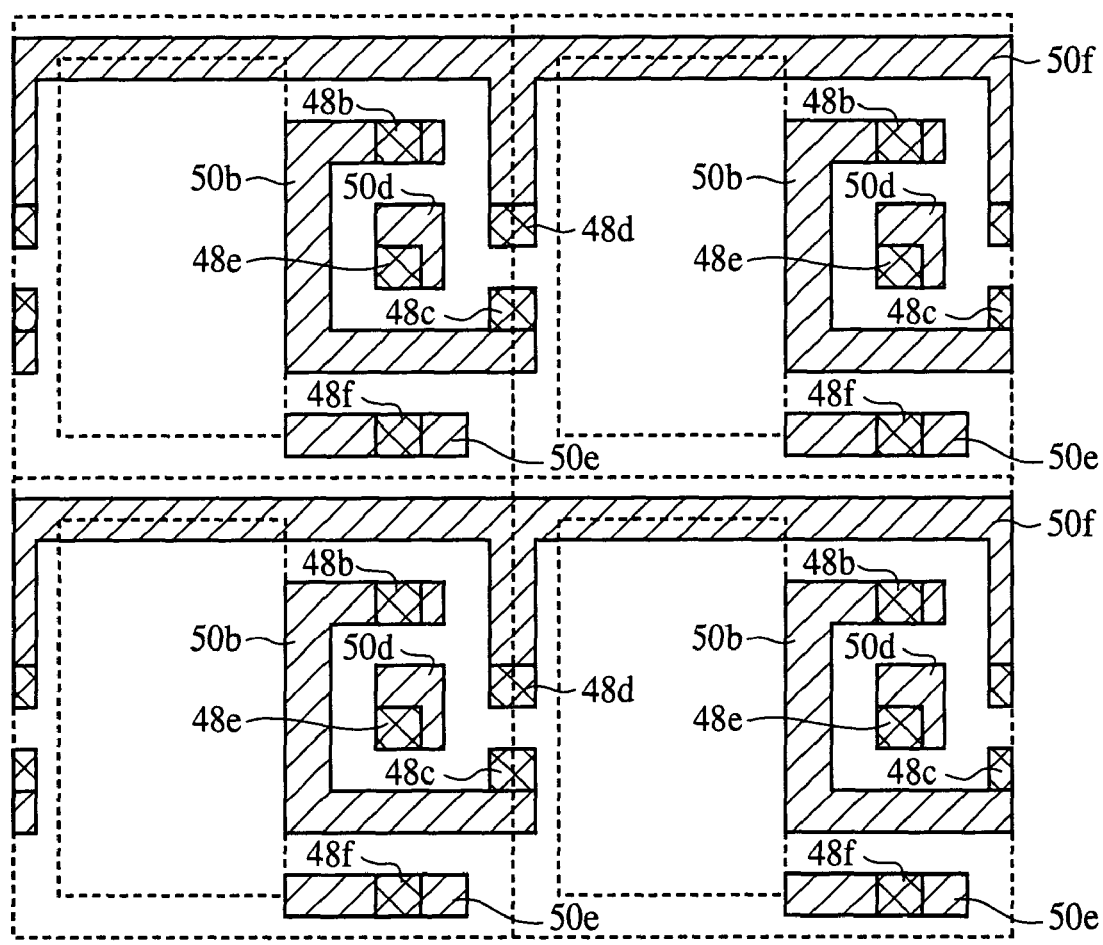
Figure 28:
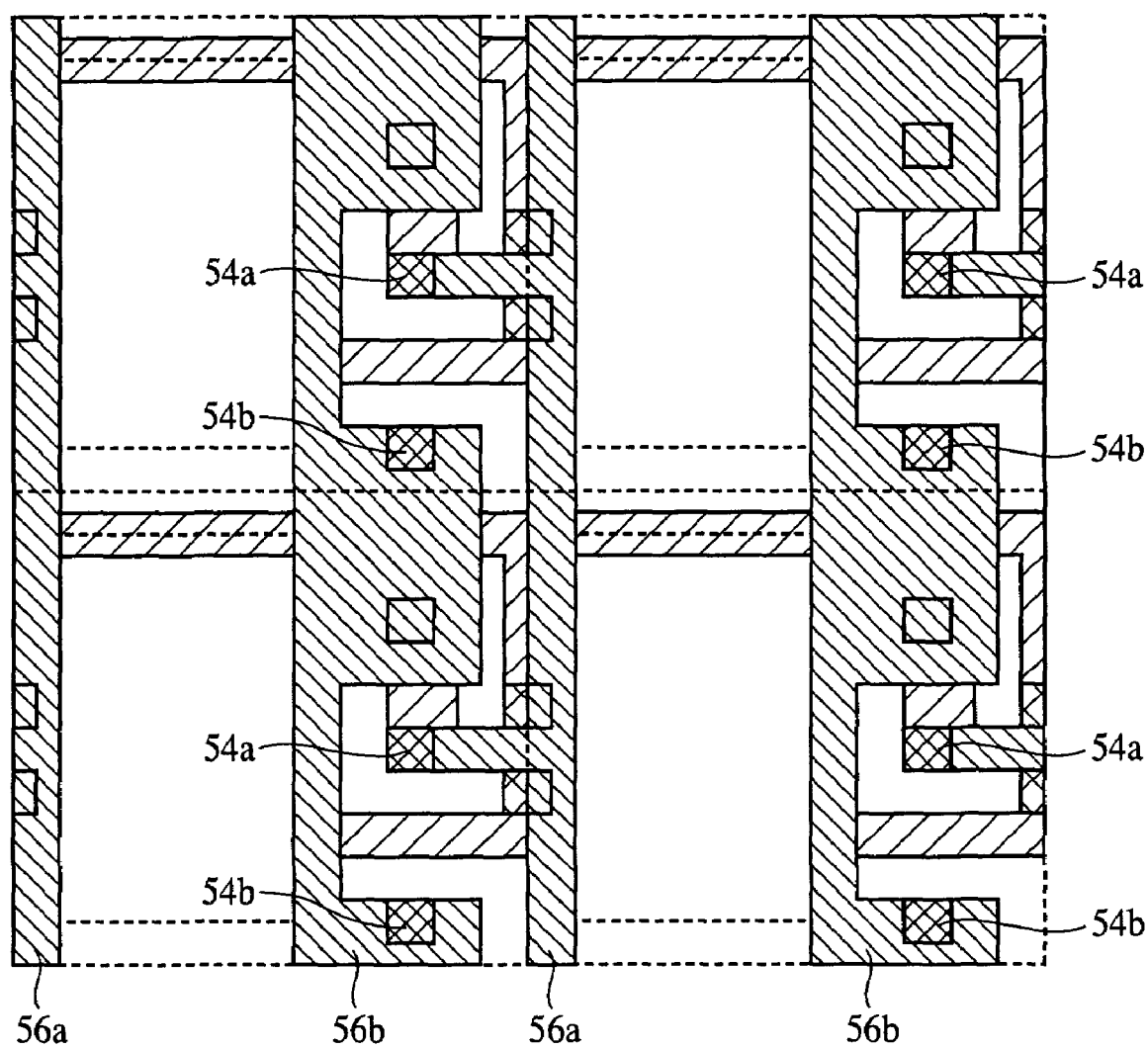
Figure 29:
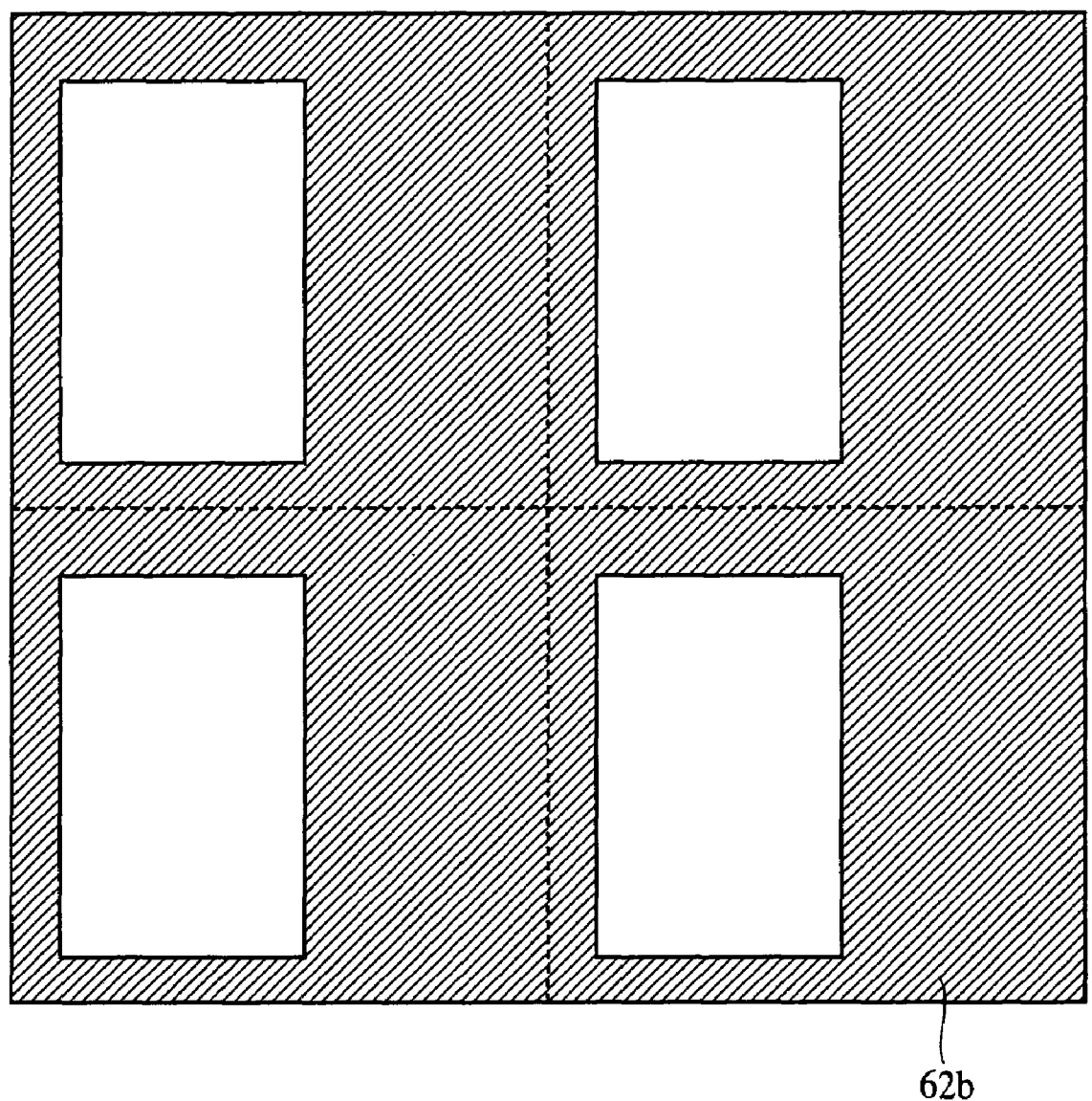

Next, the structure of the solid-state image sensor according to the present embodiment will be explained with reference to FIGS. 26 to 29. FIG. 26 is a plan view of a layout of active regions and the gate interconnection in a pixel array unit. FIG. 27 is a plan view of a layout of the first metal interconnection in the pixel array unit. FIG. 28 is a plan view of a layout of the second metal interconnection in the pixel array unit. FIG. 29 is a plan view of a layout of the third metal interconnection in the pixel array unit.

As shown in FIG. 26, active regions are defined on a silicon substrate 20 by a device isolation film 22. Each active region contains a wide rectangular region as a photodiode region, and a substantially bracket-shaped region continuous to the photodiode region. In terms of the active region of the solid-state image sensor according to the first and the second embodiments, the active regions of the solid-state image sensor according to the present embodiment according to the present embodiment are those of the solid-state image sensor according to the former, which are turned counter-clockwise by 90°.

In each active region, four gate electrodes 28 are formed bridging above the active region. These gate electrodes 28 are, from the side of the photodiode region, the gate electrode $28_{TG}$ of a transfer transistor TG, the gate electrode $28_{RST}$ of a reset transistor RST, the gate electrode $28_{SF}$ of a source follower transistor SF-Tr and the gate electrode $28_{SEL}$ of a select transistor SELECT. The select/TG line 28a is formed of the same conducting layer (the gate interconnection) which forms the gate electrodes 28, and the select/TG line 28a, the gate electrode $28_{TG}$ connected to the select/TG line 28a and the gate electrode $28_{SEL}$ connected to the select/TG line 28a are formed in one pattern.

As shown in FIG. 27, the first metal interconnection layer 50 includes an RST line 50f connected to the gate electrode $28_{RST}$ via a contact plug 48d, an interconnection layer 50b interconnecting the floating diffusion FD region and the gate electrode $28_{SF}$ via a contact plug 48b and a contact plug 48c, and outgoing lines 50d, 50e connected respectively to the drain regions of the reset transistor RST and the source follower transistor SF-Tr, and the source region of the select transistor SELECT respectively via a contact plug 48e and a contact plug 48f.

As shown in FIG. 28, the second metal interconnection layer 56 includes a VR line 56a electrically connected to the drain regions of the reset transistor RST and the source follower transistor SF-Tr via a contact plug 54a, and a signal read line 56b electrically connected to the source region of the select transistor SELECT via a contact plug 54b.

As shown in FIG. 29, the third metal interconnection layer 62 forms no signal line but a light shield film 62 which exposes the photodiode PD region and covers the rest region of the pixel containing the floating diffusion FD region.

As described above, in the solid-state image sensor according to the present embodiment as well as the solid-state image sensor according to the second embodiment, the select/TG line 28a is formed of the gate interconnection, the gate electrode $28_{TG}$ connected to the select/TG line 28a and the gate electrode $28_{SEL}$ connected to the select/TG line 28a are formed in one continuous pattern, the RST line 50f is formed of the first metal interconnection layer 50, the VR line 56a and the signal read line 56b are formed of the second metal interconnection layer 56, and the light shield film 62b is formed of the third metal interconnection layer 62.

Thus, in the solid-state image sensor according to the present embodiment as well as the solid-state image sensor according to the second embodiment, the layout of the metal interconnection layers can have freedom, and the third metal interconnection layer can be used for the light shield film alone. Thus, the floating diffusion can be effectively shielded, which is very effective to use the global shutter mode.

As in the solid-state image sensor according to the fifth embodiment, the gate electrode $28_{RST}$, the gate electrode $28_{SF}$ and the gate electrode $28_{SEL}$ are formed in parallel with each other in the right region of the pixel. Especially in the solid-state image sensor according to the present embodiment, the contact holes are formed by self-alignment with the gate electrodes 28, which permits a pitch between the gate electrodes 28 to be small. In the solid-state image sensor according to the fifth embodiment, accordingly, the contact plug 48b connected to the floating diffusion FD must be located upper of the photodiode PD (see FIG. 23). However, in the solid-state image sensor according to the present embodiment, the contact plugs 48b, 48e, 48f can be located adjacent to the gate electrode $28_{RST}$, the gate electrode $28_{SF}$ and the gate electrode $28_{SEL}$, whereby the photodiode PD and the floating diffusion FD can have larger areas. The transfer transistor can also have a longer gate length, and the threshold voltage $V_{th}$ can be lowered.

Then, the method for fabricating the solid-state image sensor according to the present embodiment will be explained with reference to FIGS. 30A-30C.

First, in the same way as in, e.g., the method for fabricating the solid-state image sensor according to the first embodiment shown in FIGS. 7A and 7B, a device isolation film 22, gate electrodes 28, a metal silicide film 42, a silicon oxide film 36, etc. are formed on a silicon substrate 20. At this time, before the gate electrodes 28 are patterned, the silicon oxide film 36 is in advance removed from parts where contacts are to be formed for the gate electrodes 28. The silicon oxide film 36 in the pixels is left when a sidewall insulating film 38 for covering the side walls of the gate electrodes 28 of peripheral circuit transistors are formed (FIG. 30A).

Then, by, e.g., plasma CVD method, a silicon nitride film (silicon oxynitride film) 44 of, e.g., a 70 m-thick, and a silicon oxide film 45' of, e.g., a 700~1500 nm-thick (central condition: 1000 nm) are deposited.

Next, the surface of the silicon oxide film 45' is polished by, e.g., CMP method to planarize the silicon oxide film 45'.

Next, contact holes 46' are formed in the silicon oxide film 45', the silicon nitride film 44 and the silicon oxide film 36 by photolithography and dry etching. The silicon oxide film 45', the silicon nitride film 44 and the silicon oxide film 36 are sequentially etched under etching conditions which ensure etching selective ratio among one another. Thus, the contact holes between the gate electrode $28_{RST}$ and the gate electrode $28_{SF}$ and between the gate electrode $28_{SEL}$ and the select/TG line 28a can be opened by self-alignment with the gate electrodes 28. At this time, the silicon oxide film 36 is left to be the sidewall insulating film 38 so that the gate electrodes 28 are not exposed in the contact hole 46'.

Then, a phosphorus-doped polycrystalline silicon film of, e.g., an about 300 nm-thick is deposited by, e.g., CVD method and then polished by CMP method until the surface of the silicon oxide film 45' is exposed to form contact plugs 48' buried in the contact holes 46' (FIG. 30B).

Then, on the silicon oxide film 45' with the contact plugs 48' buried in, a silicon oxide film 45" of, e.g., a 200~500 nm-thick (central condition: 500 nm) is deposited by, e.g., CVD method.

Next, contact holes 46" are formed in the silicon oxide films 45", 45', the silicon nitride film 44 and the silicon oxide film 36 by photolithography and dry etching. At this time, the silicon oxide films 45", 45', the silicon nitride film 44 and the silicon oxide film 36 are sequentially etched under etching conditions which can ensure an etching selective ratio among them.

Then, a titanium film of, e.g., a 10~50 nm-thick, a titanium nitride film of, e.g., a 10~100 nm-thick and a tungsten film of, e.g., a 100~800 nm-thick are deposited by, e.g., CVD method and then are polished by CMP method until the silicon oxide film 45" is exposed to thereby form contact plugs 48" buried in the contact holes 46" (FIG. 30C).

Next, in the same way as in, e.g., the method for fabricating the solid-state image sensor according to the fist embodiment shown in FIG. 8, the first to the third metal interconnection layers, etc. are formed.

As described above, according to the solid-state image sensor according to the present embodiment as well as the solid-state image sensor according to the second embodiment, the layouts of the metal interconnection layers can have freedom, and the third metal interconnection layer can be used as the light shield film alone. Thus, the floating diffusion can be effectively shielded, which is very effective to use the global shutter mode.

As in the solid-state image sensor according to the third embodiment, the floating diffusion can have a larger area with the area of the photodiode retained. The transfer transistor of one pixel and the select transistor of a pixel adjacent to the pixel can be arranged near each other, which facilitates their connection.

The substrate contact is formed by self-aligned contact techniques, which permits the gate electrodes to be arranged closer, whereby the photodiode PD and the floating diffusion FD can have larger areas. The gate length of the transfer transistor can be longer, which can lower the threshold voltage.

Figure 31:
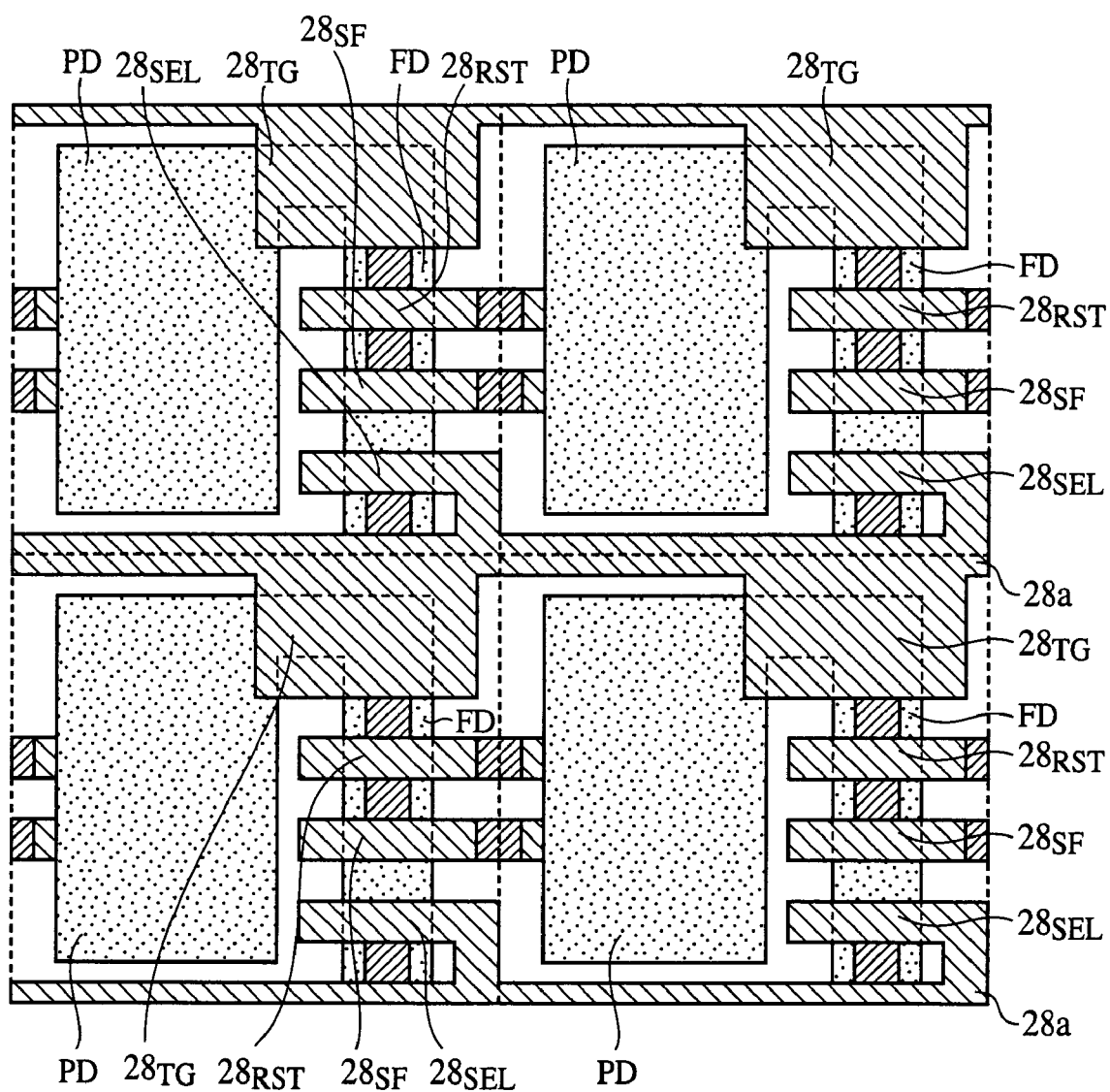
FIG. 31 is a plan view of the solid-state image sensor according to a modification of the sixth embodiment of the present invention, which shows a structure thereof.

In the present embodiment, the contact between the gate electrode $28_{RST}$ and the gate electrode $28_{SF}$, and the contact between the gate electrode $28_{SEL}$ and the select/TG line $28a$ are self-aligned. However, as shown in FIG. 31, the contact between the gate electrode $28_{TG}$ and the gate electrode $28_{RST}$ may be self-aligned, whereby the gate length of the transfer transistor can be further longer.

A Seventh Embodiment

The solid-state image sensor according to a seventh embodiment of the present invention will be explained with reference to FIGS. 32 to 35.

FIGS. 32 to 35 are plan views of the solid-state image sensor according to the present embodiment, which show a structure thereof. The same members of the present embodiment as those of the solid-state image sensor according to the first to the sixth embodiments shown in FIGS. 1 to 31 are represented by the same reference numbers not to repeat or to simplify their explanation.

The solid-state image sensor according to the present embodiment is the same as the solid-state image sensor according to the first embodiment in the circuit diagram, the operation and the fabrication method except that the plane layouts of the respective layers are different from those of the solid-state image sensor according to the first embodiment. That is, in the solid-state image sensor according to the present embodiment as well, the TG line commonly connecting the gate terminals of transfer transistors TG of the pixels of the $n^{th}$ row, and the select line commonly connecting the gate terminals of select transistors SELECT of the respective pixels of the $n+1^{th}$ row are formed of a common signal line (select/TG line).

Figure 32:
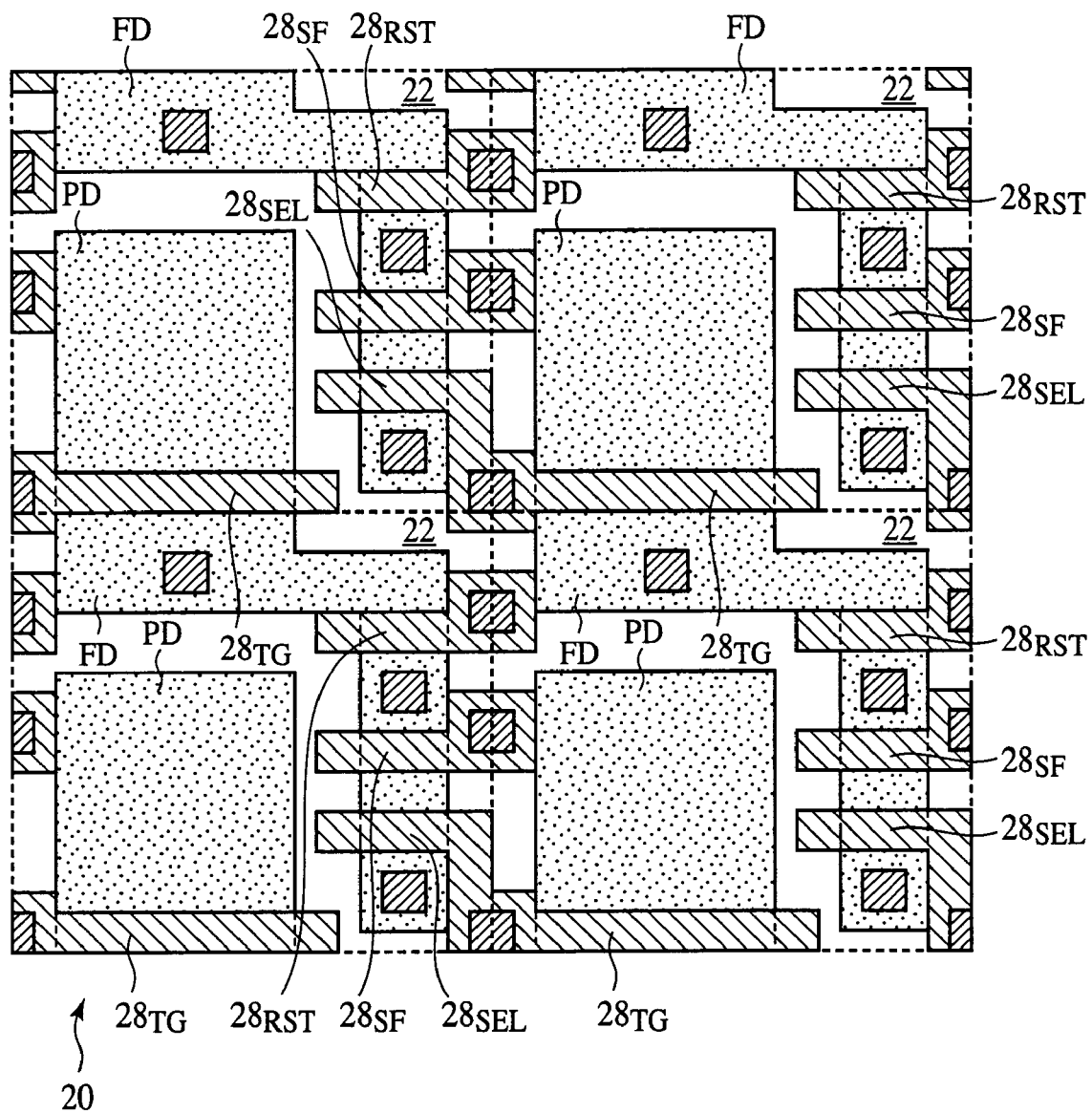
FIGS. 32-35 are plan views of the solid-state image sensor according to a seventh embodiment of the present invention which show a structure thereof.
Figure 33:
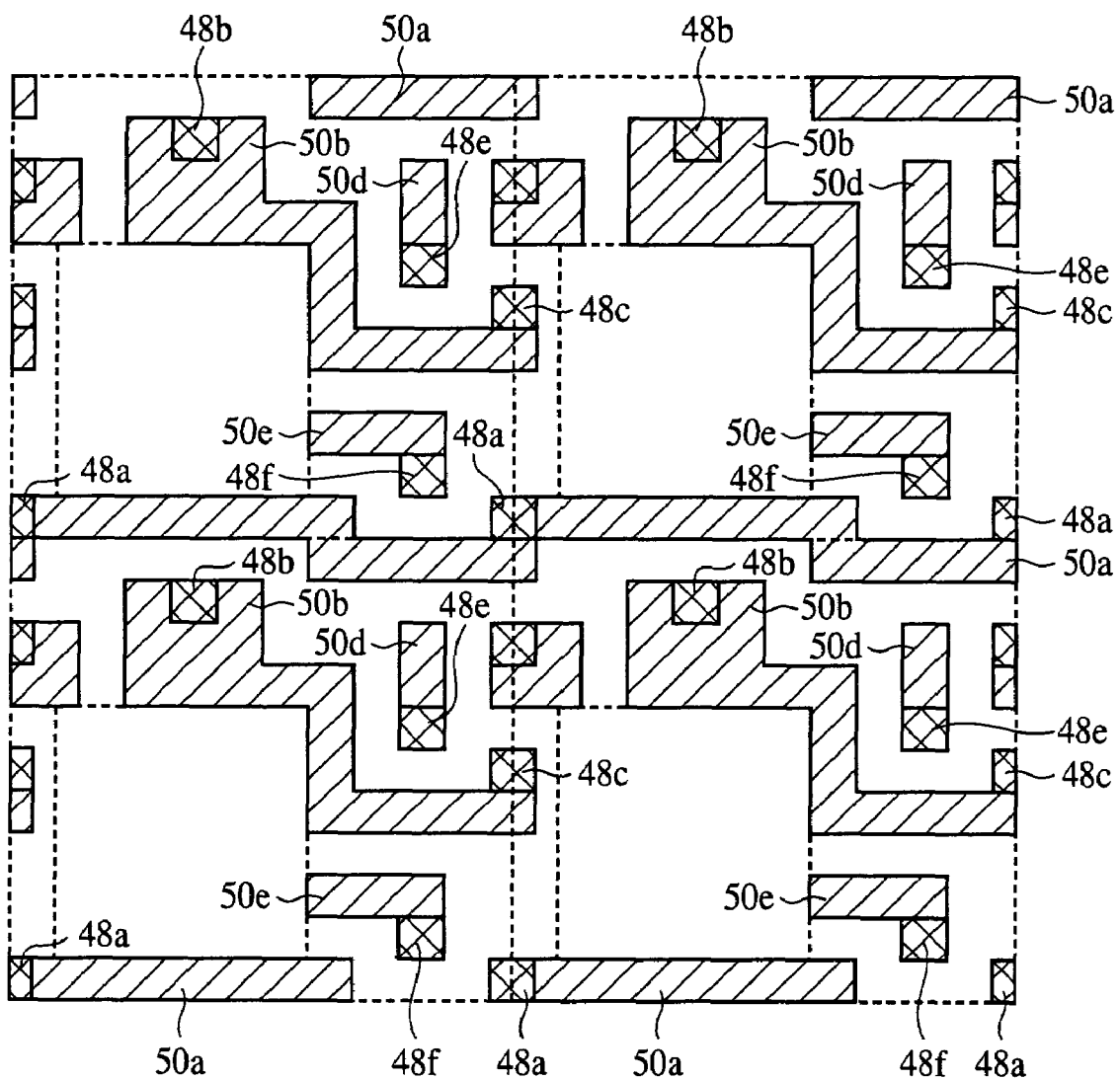
Figure 34:
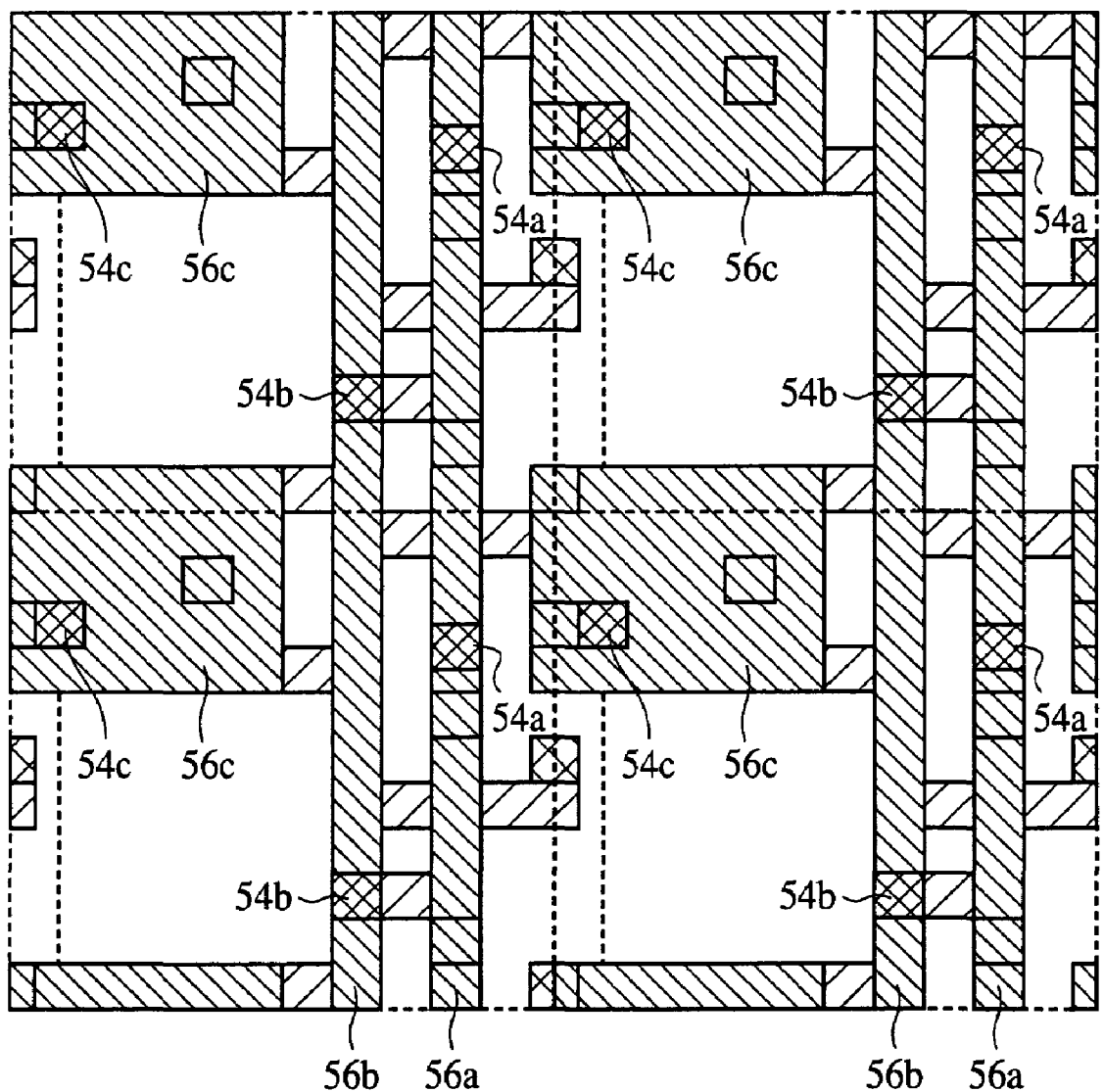
Figure 35:
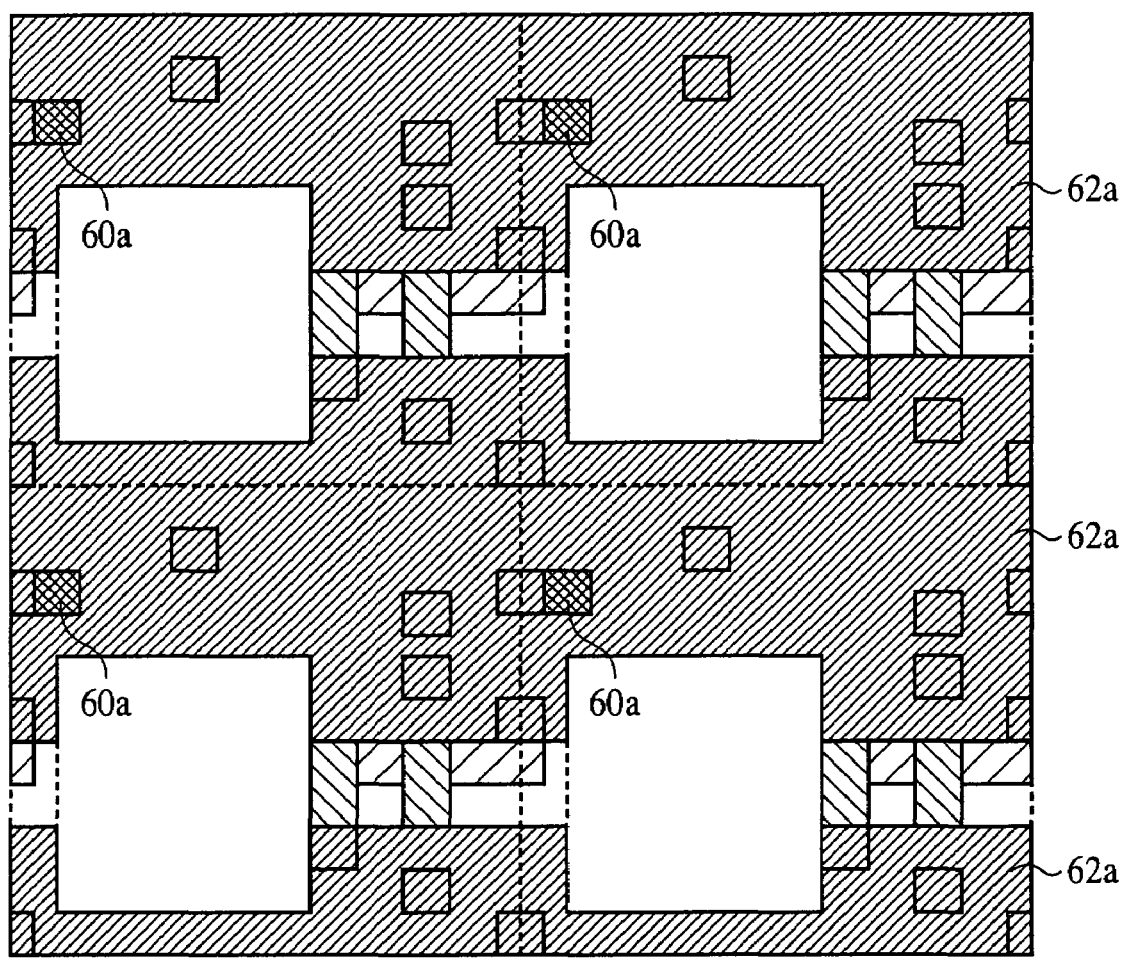

Next, the structure of the solid-state image sensor according to the present embodiment will be specifically explained with reference to FIGS. 32 to 35. FIG. 32 is a plan view of a layout of the active regions and the gate interconnection in a pixel array unit. FIG. 33 is a plan view of a layout of the first metal interconnection in the pixel array unit. FIG. 34 is a plan view of a layout of the second metal interconnection in the pixel array unit. FIG. 35 is a plan view of a layout of the third metal interconnection in the pixel array unit.

As shown in FIG. 32, active regions are defined on a silicon substrate 20 by a device isolation film 22. Each active region contains a wide rectangular region as a photodiode region and a substantially L-shaped region continuous to the photodiode region.

On each active region, four gate electrodes 28 are formed bridging above the active region. These gate electrodes are, from the side of the photodiode region, the gate electrode $28_{TG}$ of a transfer transistor TG, the gate electrode $28_{RST}$ of a reset transistor RST, the gate electrode $28_{SF}$ of a source follower transistor SF-Tr, and the gate electrode $28_{SEL}$ of a select transistor SELECT. The gate electrode $28_{TG}$ is formed in one pattern which is continuous to the gate electrode $28_{SEL}$ of the pixels adjacent to each other in the column direction.

As shown in FIG. 33, the first metal interconnection layer 50 includes a select/TG line $50a$ connected to the gate electrode $28_{TG}$ and the gate electrode $28_{SEL}$ via a contact plug $48a$, an interconnection layer $50b$ connecting the floating diffusion FD region and the gate electrode $28_{SF}$ via a contact plug $48b$ and a contact plug $48c$, and outgoing lines $50c$, $50d$, $50e$ respectively connected to the gate electrode $28_{RST}$, the drain regions of the reset transistor RST and the source follower transistor SF-Tr, and the source region of the select transistor SELECT respectively via contact plugs $48d$, $48e$, $48f$.

As shown in FIG. 34, the second metal interconnection layer 56 includes a VR line $56a$ electrically connected to the drain regions of the reset transistor RST and the source follower transistor SF-Tr via a contact plug $54a$, a signal read line $56b$ electrically connected to the source region of the select transistor SELECT via a contact plug $54b$, and an outgoing line $56c$ electrically connected to the gate electrode $28_{RST}$ via a contact plug $54c$.

As shown in FIG. 35, the third metal interconnection layer 62 includes an RST line $62a$ electrically connected to the gate electrode $28_{RST}$ via a contact plug $60a$.

Here, the solid-state image sensor according to the present embodiment is characterized mainly in that each active region is formed, bridging pixel regions adjacent to each other. That is, in the solid-state image sensor according to the present embodiment, the photodiode PD and the gate electrode $28_{TG}$ are positioned in one pixel region which is the same as that of the solid-state image sensor according to the first to the sixth embodiments, and the rest constituent part is positioned in another pixel region adjacent to said one pixel region.

The active regions are thus laid out, whereby the area of the floating diffusion FD and the channel width of the transfer transistor TG can be readily enlarged. The gate electrodes 28 are arranged with respect to the floating diffusions FD as shown in FIG. 23, whereby the area variations of the floating diffusion FD due to disalignment of the gate electrodes 28 can be made small.

As described above, according to the present embodiment, the active region for one pixel is formed, bridging 2 unit pixel regions, which facilitates increasing the area of the floating diffusion and the channel width of the transfer transistor. Area variations of the floating diffusion FD due to misalignment of the gate electrodes can be readily made small.

An Eighth Embodiment

The solid-state image sensor according to an eighth embodiment of the present invention will be explained with reference to FIGS. 36 to 39.

FIGS. 36 to 39 are plan views of the solid-state image sensor according to the present embodiment, which shows a structure thereof. The same members of the present embodiment as those of the solid-state image sensor according to the first to the seventh embodiments shown in FIGS. 1-35 are represented by the same reference numbers not to repeat or to simplify their explanation.

The solid-state image sensor according to the present embodiment is the same as the solid-state image sensor according to the first embodiment in the circuit diagram, the operation and the fabrication method except that the plane layouts of the respective layers are different from those of the solid-state image sensor according to the first embodiment. That is, in the solid-state image sensor according to the present embodiment as well, the TG line commonly connecting the gate terminals of the transfer transistors TG of the respective pixels of the $n^{th}$ row, and the select line commonly connecting the gate terminals of the select transistors SELECT of the $n+1^{th}$ row are formed of a common signal line (select/TG line).

Figure 36:
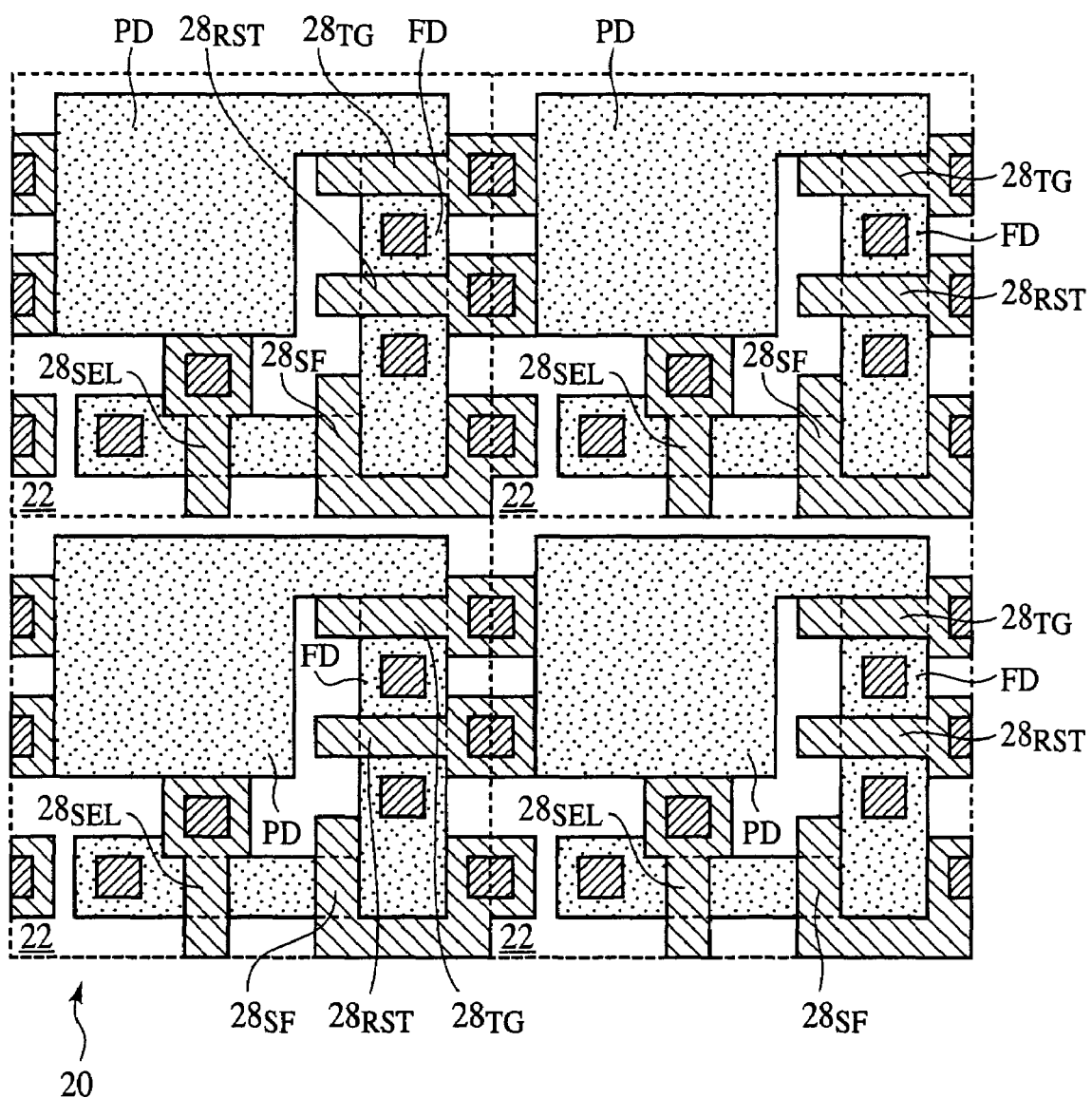
FIGS. 36-39 are plan views of the solid-state image sensor according to an eighth embodiment of the present invention which show a structure thereof.
Figure 37:
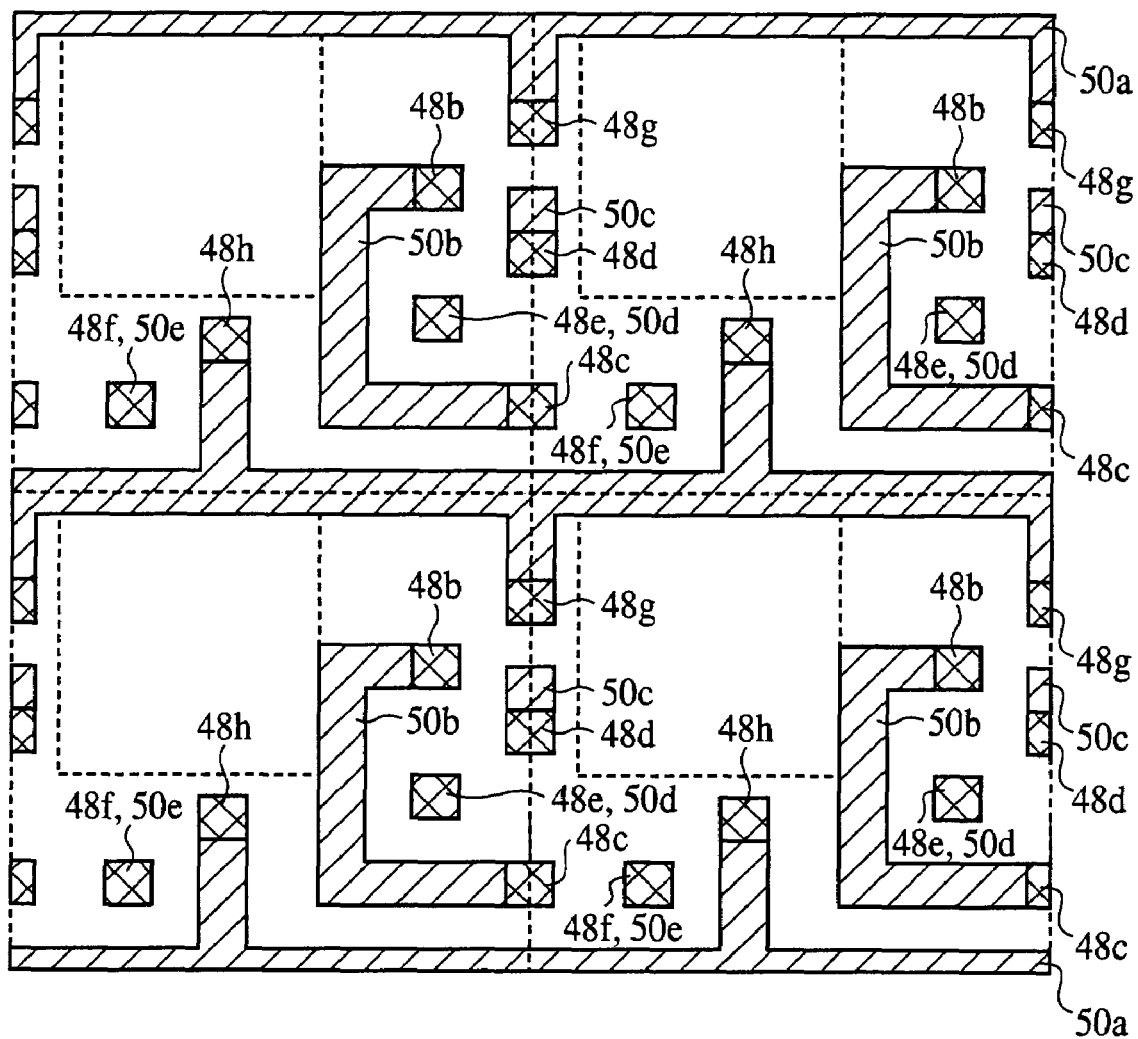
Figure 38:
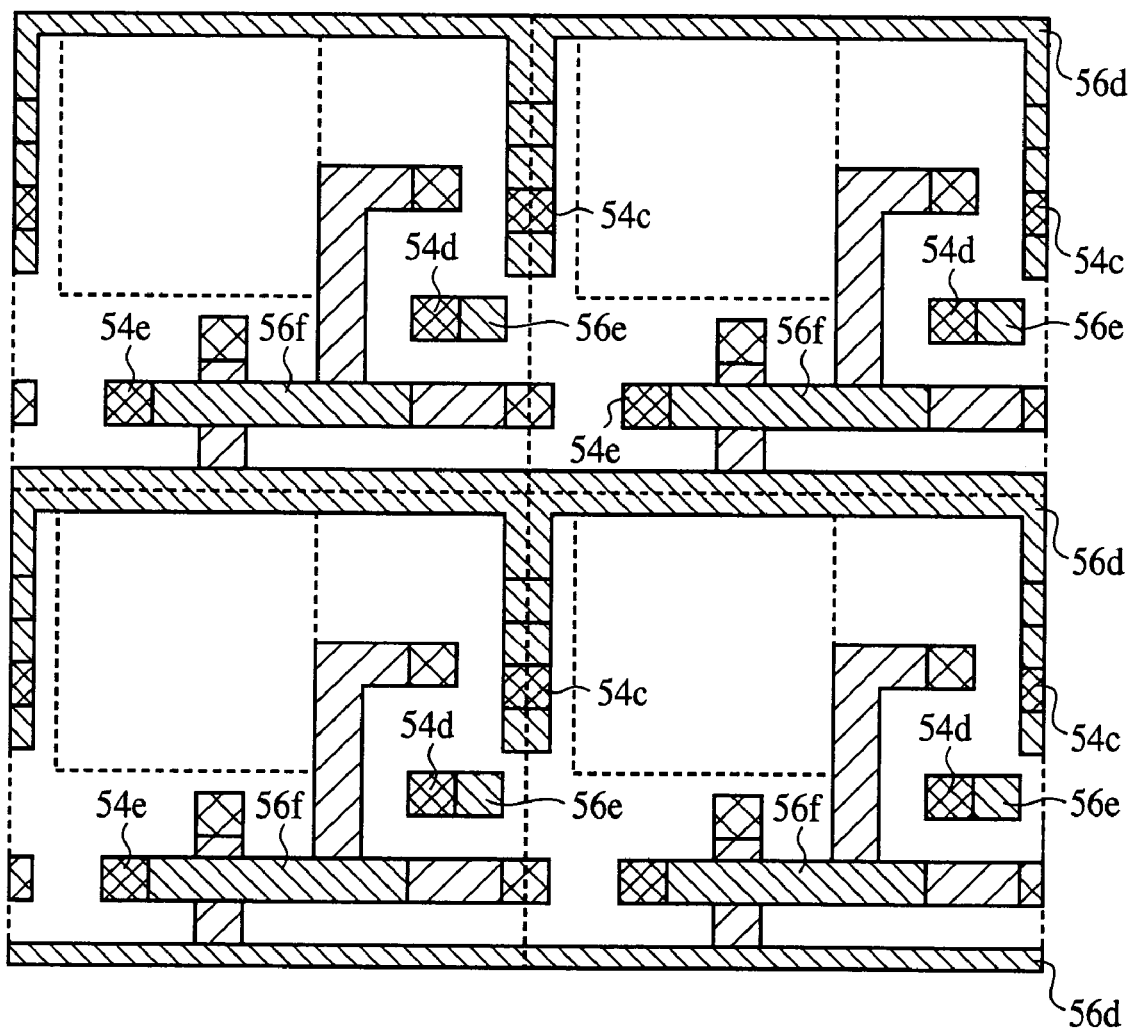
Figure 39:
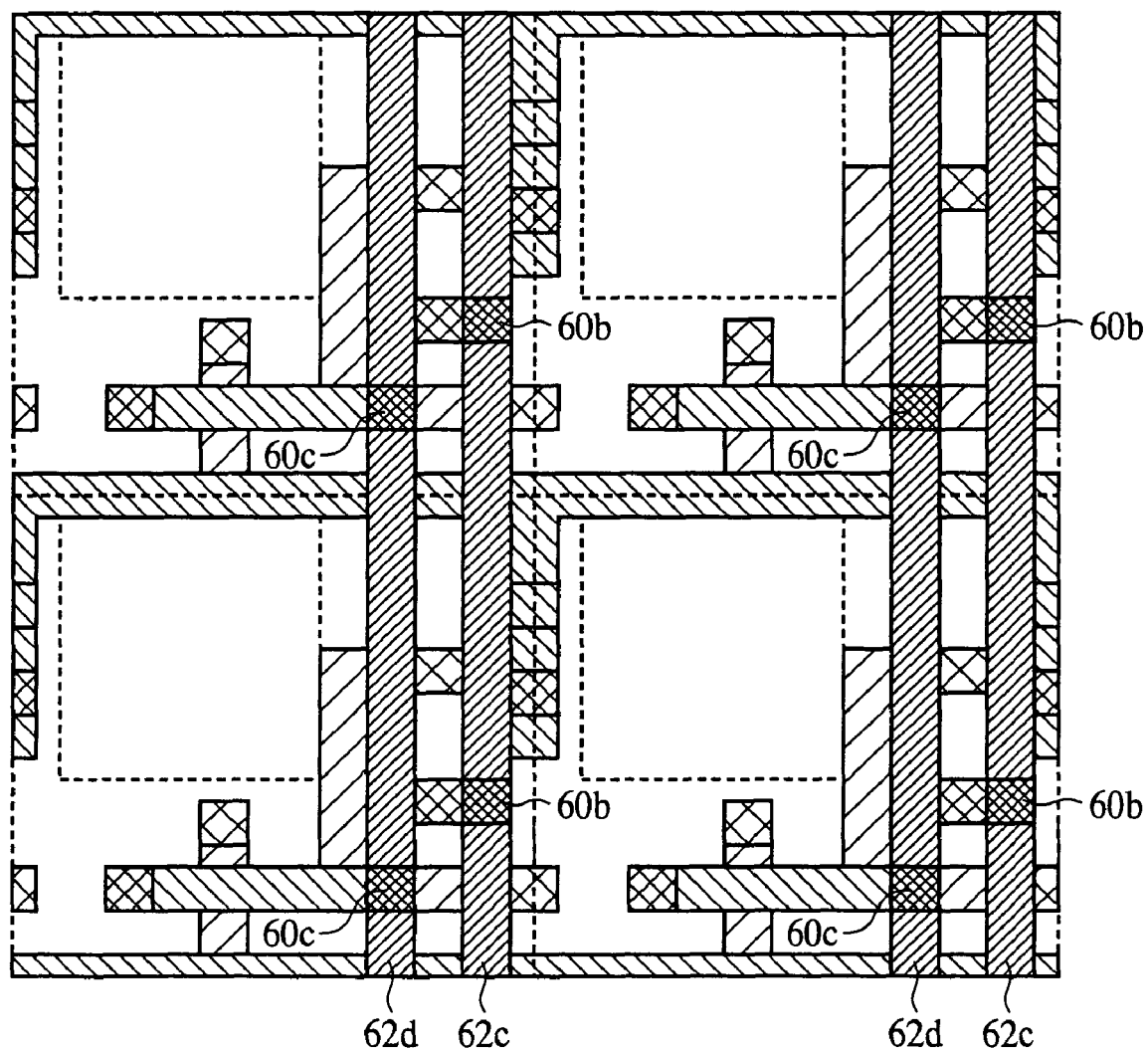

Next, the structure of the solid-state image sensor according to the present embodiment will be specifically explained with reference to FIGS. 36 to 39. FIG. 36 is a plan view of a layout of the active regions and the gate interconnection in a pixel array unit. FIG. 37 is a plan view of a layout of the first metal interconnection in the pixel array unit. FIG. 38 is a plan view of a layout of the second metal interconnection in the pixel array unit. FIG. 39 is a layout of the third metal interconnection in the pixel array unit.

As shown in FIG. 36, the active regions are defined on a silicon substrate 20 by a device isolation film 22. Each active region contains a wide rectangular region as a photodiode region, and a substantially bracket-shaped region continuous to the photodiode region.

In each active region, four gate electrodes 28 are formed bridging above the active region. These gate electrodes 28 are, from the side of the photodiode region, the gate electrode $28_{TG}$ of a transfer transistor TG, the gate electrode $28_{RST}$ of a reset transistor RST, the gate electrode $28_{SF}$ of a source follower transistor SF-Tr, and the gate electrode $28_{SEL}$ of a select transistor SELECT.

As shown in FIG. 37, the first metal interconnection layer 50 includes a select/TG line 50a connected to the gate electrode $28_{TG}$ and the gate electrode $28_{SEL}$ via contact plugs 48g, 48h, an interconnection layer 50b interconnecting the floating diffusion FD region and the gate electrode $28_{SF}$ via a contact plug 48b and a contact plug 48c, and outgoing lines 50c, 50d, 50e respectively connected to the gate electrode $28_{RST}$, the drain regions of the reset transistor RST and the source follower transistor SF-Tr, and the source region of the select transistor SELECT respectively via a contact plug 48d, a contact plug 48e and a contact plug 48f.

As shown in FIG. 38, the second metal interconnection layer 56 includes an RST line 56d connected to the gate electrode $28_{RST}$ via a contact plug 54c, an outgoing line 56e connected to the drain regions of the reset transistor RST and the source follower transistor SF-Tr via a contact plug 54d, and an outgoing line 56f electrically connected to the source region of the select transistor SELECT via a contact plug 54e.

As shown in FIG. 39, the third metal interconnection layer 62 includes a VR line 62c connected to the drain regions of the reset transistor RST and the source follower transistor SF-Tr via a contact plug 60b, and a signal read line 62d electrically connected to the source region of the select transistor SELECT via a contact plug 60c.

As described above, according to the present embodiment, the select/TG line is formed of the first metal interconnection layer, the RST line is formed of the second metal interconnection layer, and the VR line and the signal read line are formed of the third metal interconnection layer, whereby the solid-state image sensor can include the 4-Tr-pixels having the select line and the TG line made common.

A Ninth Embodiment

The solid-state image sensor according to a ninth embodiment of the present invention will be explained with reference to FIGS. 40 to 45B.

Figure 40:
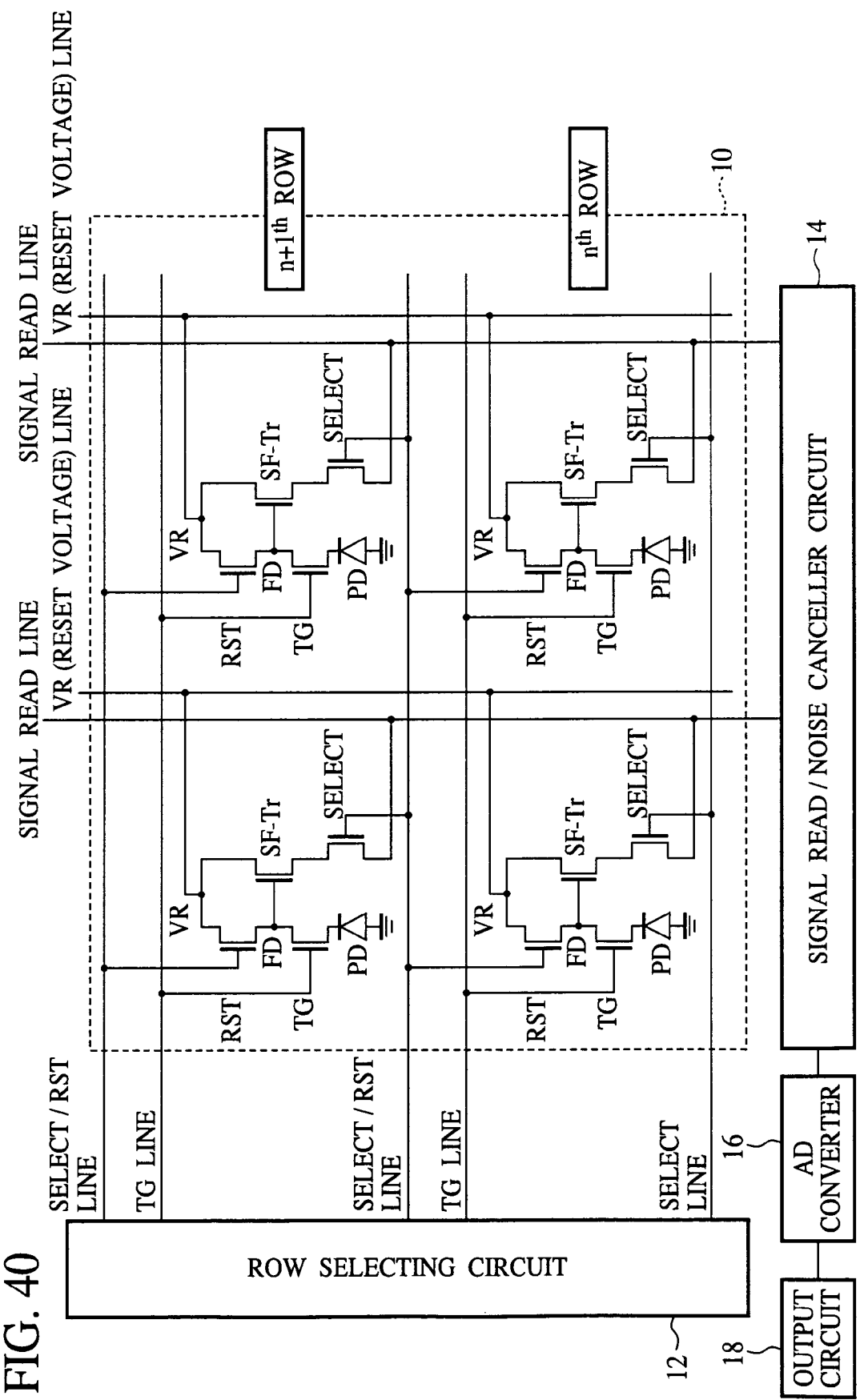
FIG. 40 is a circuit diagram of the solid-state image sensor according to a ninth embodiment of the present invention.
Figure 43:
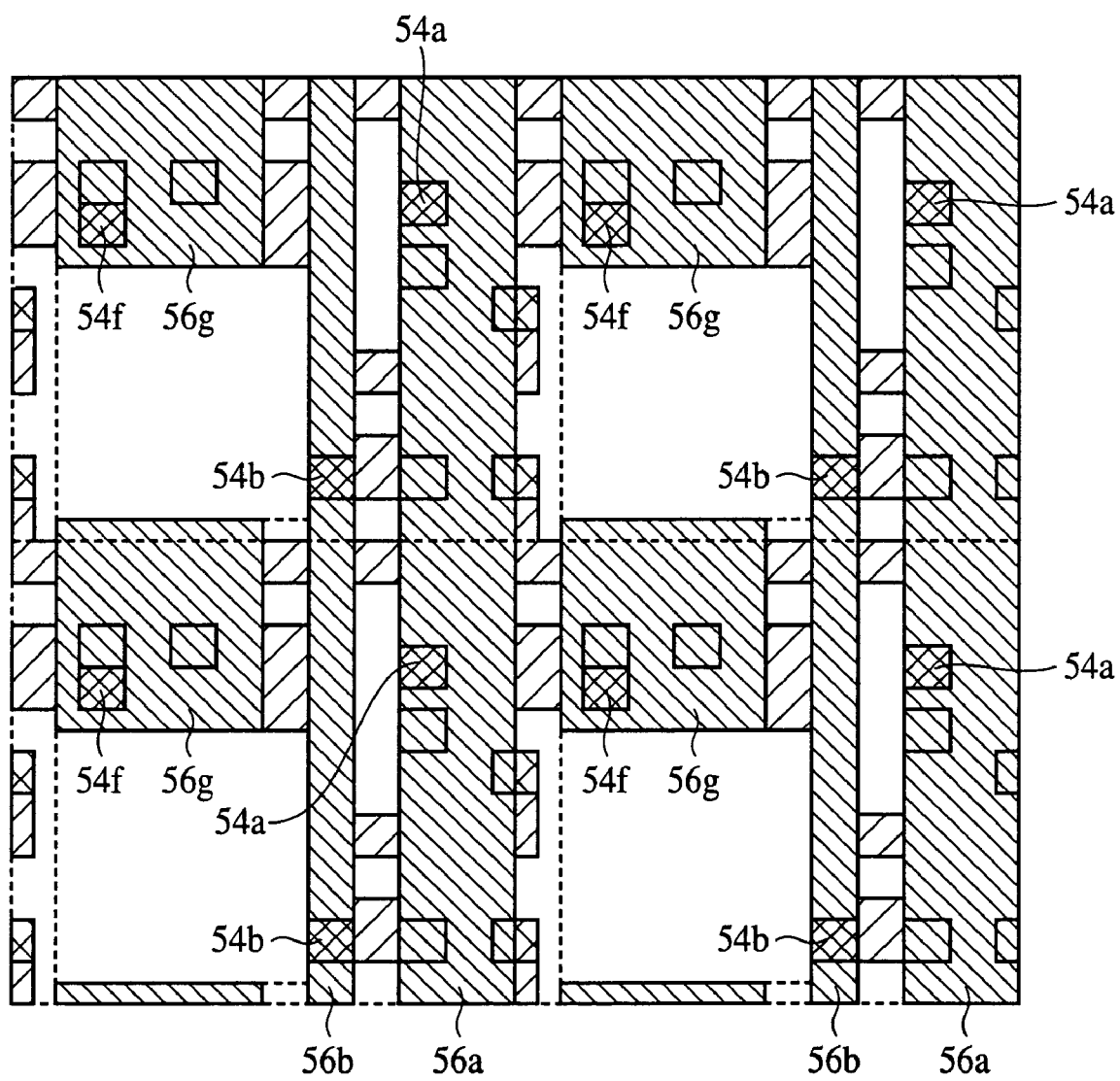
Figure 44:
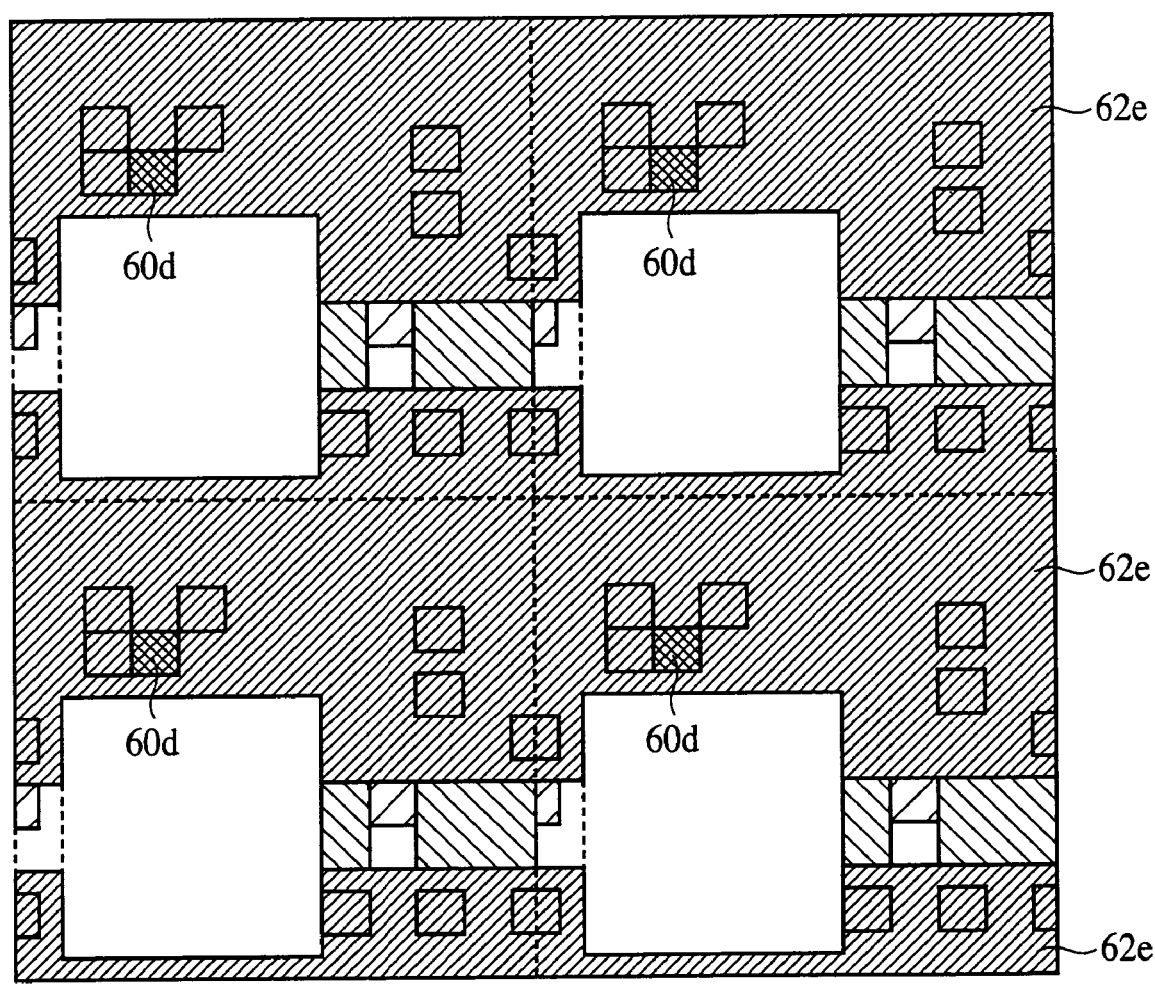
Figure 45A:
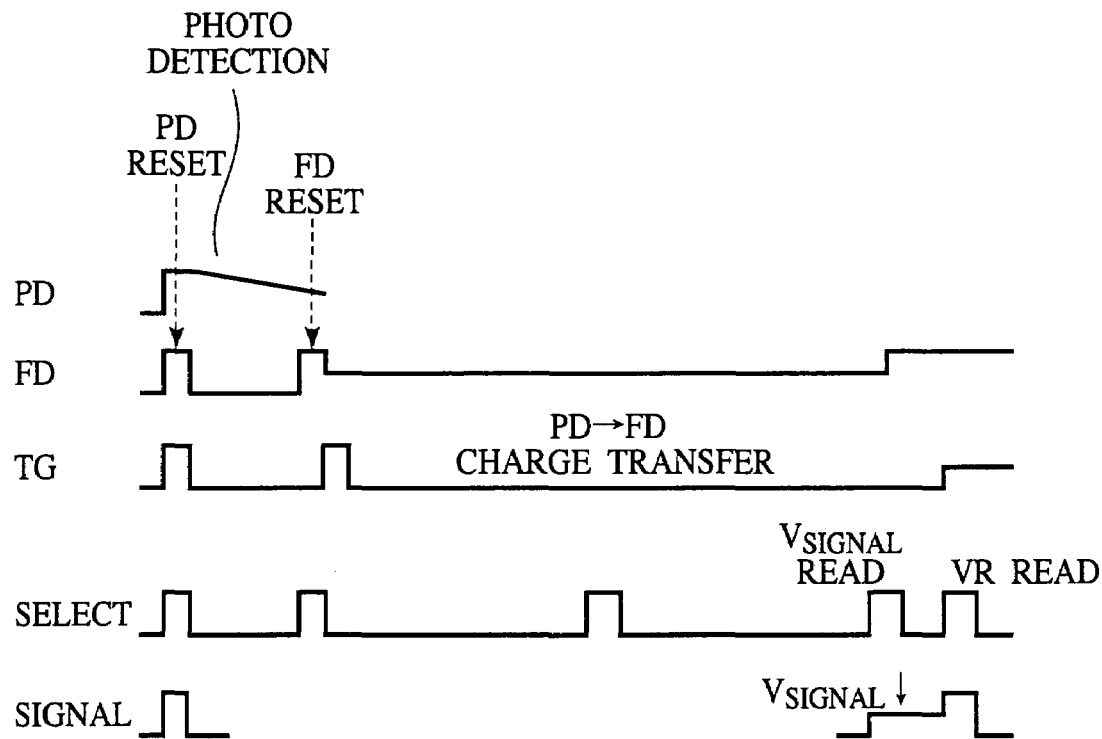
FIGS. 45A and 45B are timing charts explaining the image reading method for the solid-state image sensor according to the ninth embodiment of the present invention.
Figure 45B:
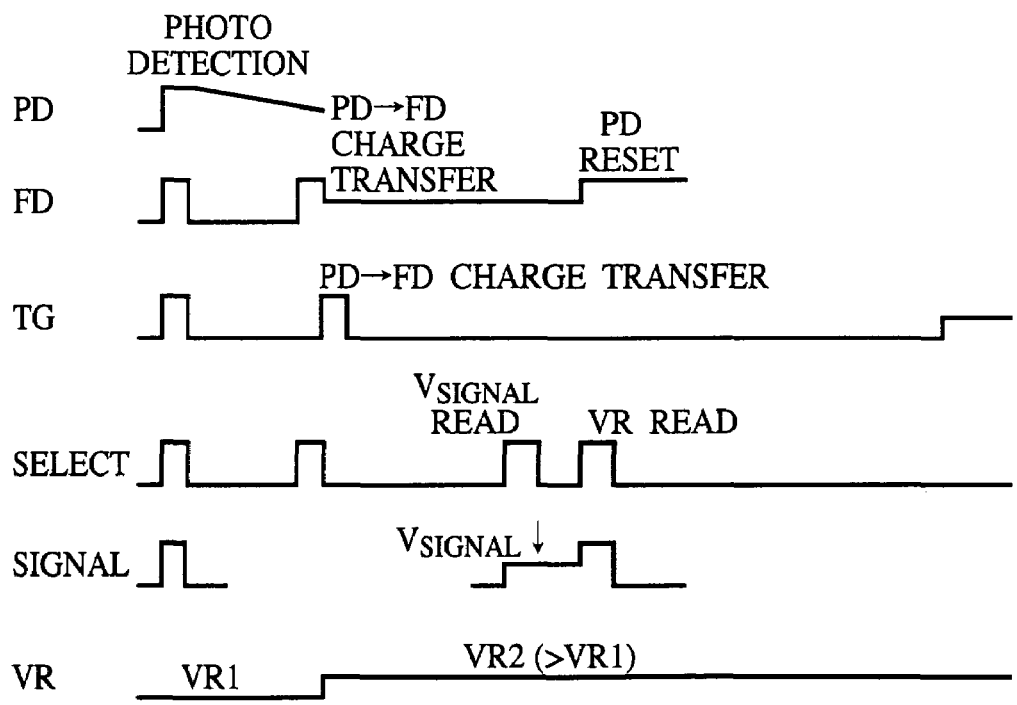

FIG. 40 is a circuit diagram of the solid-state image sensor according to the present embodiment. FIGS. 41 to 44 are plan views of the solid-state image sensor according to the present embodiment, which show a structure thereof. FIGS. 45A and 45B are timing charts explaining an image reading method of the solid-state image sensor according to the present embodiment. The same members of the present embodiment as those of the solid-state image sensor according to the first to the eighth embodiments shown in FIGS. 1-39 are represented by the same reference numbers not to repeat or to simplify their explanation.

First, the structure of the solid-state image sensor according to the present embodiment will be explained with reference to FIGS. 40 to 44. FIG. 40 is a circuit diagram of the solid-state image sensor according to the present embodiment. In FIG. 40 the pixel array unit 10 is represented by 2×2 unit pixels.

Each pixel includes a photodiode PD, a transfer transistor TG, a reset transistor RST, a source follower transistor SF-Tr and a select transistor SELECT. That is, the solid-state image sensor according to the present embodiment is a solid-state image sensor having 4-Tr-pixels.

The cathode terminal of the photodiode PD is connected to the source terminal of the transfer transistor TG. The anode terminal of the photodiode is grounded. The drain terminal of the transfer transistor TG is connected to the source terminal of the reset transistor RST and the gate terminal of the source follower transistor SF-Tr. The source terminal of the source follower transistor SF-Tr is connected to the drain terminal of the select transistor SELECT.

The respective pixels adjacent to each other in the row direction are connected to a TG line which commonly connects the gate terminals of the transfer transistors TG. The respective pixels are connected to a select/RST line which commonly connects the gate terminals of the reset transistors RST of the pixels of the $n^{th}$ row and the gate terminals of the select transistors SELECT of the pixels of the $n+1^{th}$ row.

The respective pixels adjacent to each other in the column direction are connected to a signal read line which commonly connects the source terminals of the select transistors SELECT and to a VR (reset voltage) line which commonly connects the drain terminals of the reset transistors RST and the drain terminals of the source follower transistors SF-Tr.

The TG lines and the select/RST lines are connected to a row selecting circuit 12. The signal read lines are connected to a signal read/noise canceller circuit 14. The signal read/noise canceller circuit 14 is connected to an output circuit 18 via an AD converter 16. The VR lines are connected to a power source of substantially a source voltage or a power source whose voltage is lowered from a source voltage.

As described above, in the solid-state image sensor according to the present embodiment, the RST line commonly connecting the gate terminals of the reset transistors RST of the respective pixels of the $n^{th}$ row, and the select line commonly connecting the gate terminals of the select transistors SELECT of the respective pixels of the $n+1^{th}$ row are formed of a common signal line (select/RST line).

Figure 41:
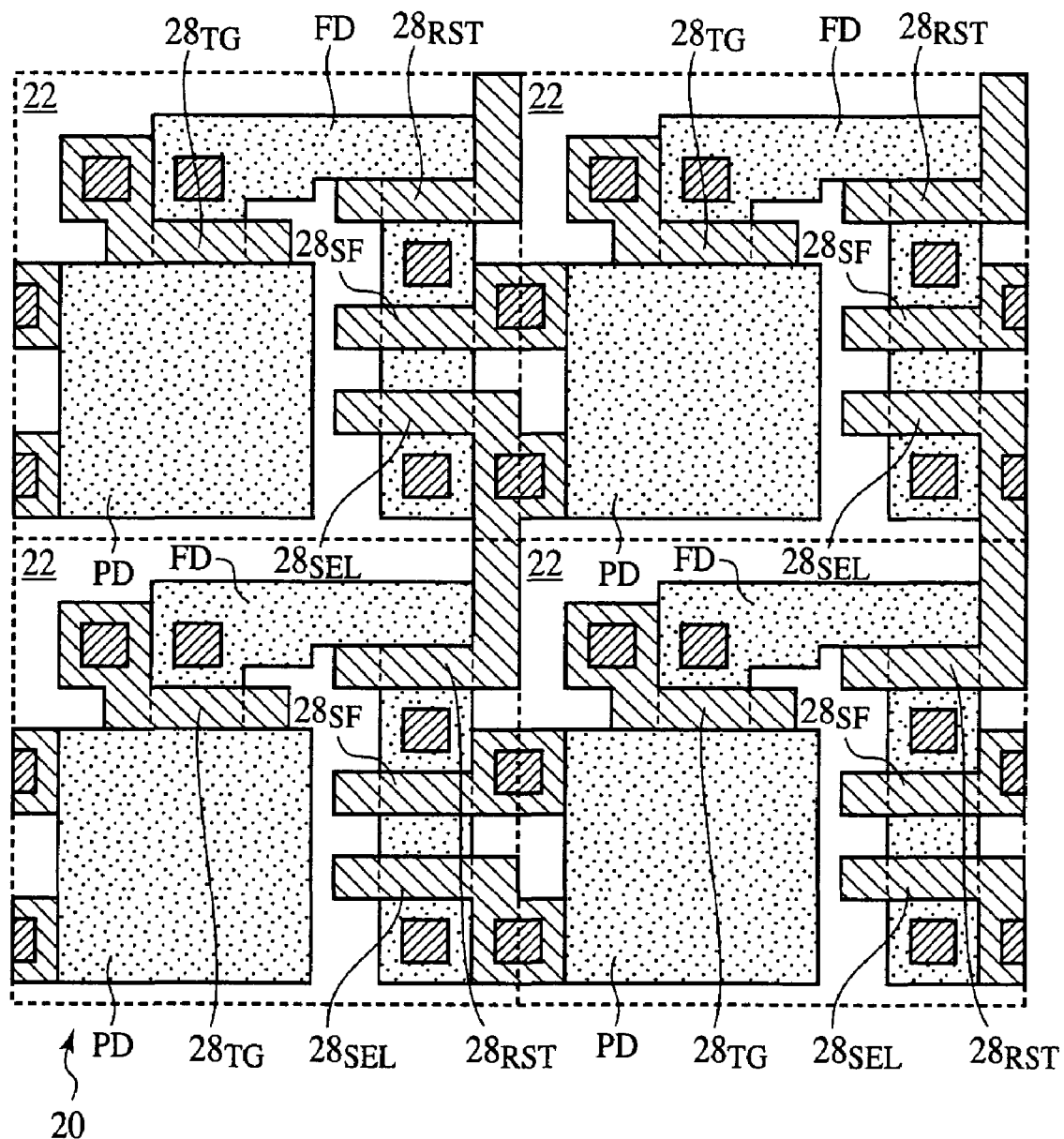
FIGS. 41-44 are plan views of the solid-state image sensor according to the ninth embodiment of the present invention which show a structure thereof.
Figure 42:
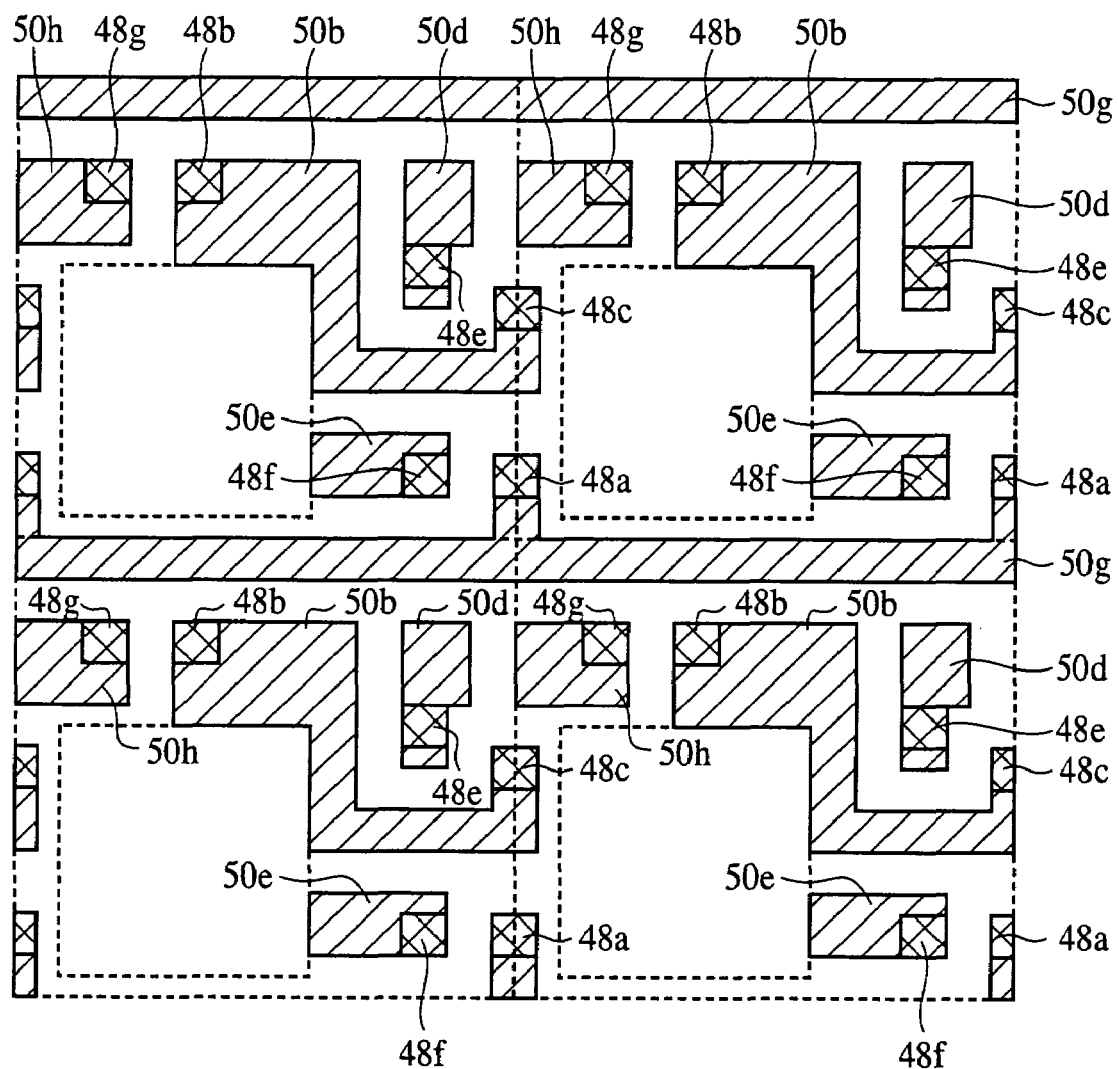

Then, the structure of the solid-state image sensor for forming the circuit shown in FIG. 40 will be specifically explained with reference to FIGS. 41 to 44. FIG. 41 is a plan view of a layout of the active regions and the gate interconnection in the pixel array unit. FIG. 42 is a plan view of a layout of the first metal interconnection in the pixel array unit. FIG. 43 is a plan view of a layout of the second metal interconnection in the pixel array unit. FIG. 44 is a plan view of a layout of the third metal interconnection in the pixel array unit.

As shown in FIG. 41, active regions are defined on a silicon substrate 20 by a device isolation film 22. Each active region contains a wide rectangular region as a photodiode region and a substantially bracket-shaped region continuous to the photodiode region.

In each active region, four gate electrodes 28 are formed bridging above the active region. These gate electrodes 28 are, from the side of the photodiode region, the gate electrode $28_{TG}$ of the transfer transistor TG, the gate electrode $28_{RST}$ of the reset transistor RST, the gate electrode $28_{SF}$ of the source follower transistor SF-Tr and the gate electrode $28_{SEL}$ of the select transistor SELECT. The gate electrode $28_{RST}$ is formed in one pattern continuous to the gate electrode $28_{SEL}$ of the adjacent pixel in the column direction.

As shown in FIG. 42, the first metal interconnection layer 50 includes a select/RST line 50g connected to the gate electrode $28_{RST}$ and the gate electrode $28_{SEL}$ via a contact plug 48a, an interconnection layer 50b interconnecting the floating diffusion FD region and the gate electrode $28_{SF}$ via a contact plug 48b and a contact plug 48c, and outgoing lines 50h, 50d, 50e connected respectively to the gate electrode $28_{TG}$, the drain regions of the reset transistor RST and the source follower transistor SF-Tr, and the source region of the select transistor SELECT respectively via a contact plug 48g, a contact plug 48e, and a contact plug 48f.

As shown in FIG. 43, the second metal interconnection layer 56 includes a VR line 56a electrically connected to the drain regions of the reset transistor RST and the source follower transistor SF-Tr via contact plug 54a, and a signal read line 56b electrically connected to the source region of the select transistor SELECT via a contact plug 54b, and an outgoing line 56g electrically connected to the gate electrode $28_{TG}$ via a contact plug 54f.

As shown in FIG. 44, the third metal interconnection layer 62 includes a TG line 62e electrically connected to the gate electrode $28_{TG}$ via a contact plug 60d.

As described above, the solid-state image sensor according to the present embodiment is characterized in that the gate electrodes $28_{RST}$ of the reset transistors RST of the pixels of the $n^{th}$ row, and the gate electrodes $28_{SEL}$ of the select transistors SELECT of the pixels of the $n+1^{th}$ row are formed in one pattern, and that the first metal interconnection layer 50 forms the select/RST line 50g, the second metal interconnection layer 56 forms the VR line 56a and the signal read line 56b, and the third metal interconnection layer 62 forms the TG line 62e.

Thus, even in the case that the select line and the RST line are formed in the common interconnection layer, it is not necessary to interconnect the gate electrode $28_{RST}$ and the gate electrode $28_{SEL}$, which are spaced from each other, by the metal interconnection layer. Accordingly, one contact hole for connecting the first metal interconnection layer 50 to the lower layer can be saved, which gives allowance for the layout of the metal interconnection layers.

Allowance is given also to the area, and the floating diffusion can have a sufficient area, and the floating diffusion FD having a sufficient area can lower the well concentration to thereby mitigate electric fields. Accordingly, the junction leakage can be decreased. The gate width of the transfer transistor can be large.

As shown in FIG. 41, the gate electrode $28_{RST}$, the gate electrode $28_{SF}$ and the gate electrode $28_{SEL}$ are formed in parallel with each other in the column direction on the right side in the pixel. In the left region in the pixel, the gate electrode $28_{TG}$ and the photodiode PD are adjacently formed in the column direction. All the gate electrodes are arranged in the row direction, e.g., with the gate width arranged in the row direction. The gate electrodes 28 are thus arranged, whereby with the area of the photodiode PD retained, the floating diffusion FD can be extended in the row direction, and the area can be large. The gate electrode $28_{TG}$ is arranged along the extension of the floating diffusion FD, whereby the channel width of the transfer transistor can be readily made large. The reset transistor RST is located at a position near the upper end, and the select transistor SELECT is located at a position near the lower end, whereby the connection between the gate electrode $28_{RST}$ and the gate electrode $28_{SEL}$ can be easy.

Then, the image reading method for the solid-state image sensor according to the present embodiment will be explained with reference to FIGS. 45A and 45B. In the present embodiment, the image reading method called the global shutter mode will be explained. In the global shutter mode, no light detection time difference takes place between the pixels, as does in the rolling shutter mode, and the global shutter mode can provide good images without "deflections" and "distortions". The solid-state image sensor according to the present embodiment is applicable to the rolling shutter mode described in, e.g., Reference 4.

FIGS. 45A and 45B are timing charts explaining the image reading method for the solid-state image sensor according to the present embodiment. FIG. 45A is a timing chart of the pixels of the $n+1^{th}$ row. FIG. 45B is a timing chart of the pixels of the $n^{th}$ row. In FIGS. 45A and 45B, positive voltages are taken on the vertical axis, and time is taken on the horizontal axis.

First, a signal is applied to the TG lines and the select/RST lines of all the rows to globally rest the photodiodes PD and the floating diffusions FD of all the rows. The photodiodes PD and the floating diffusions FD are reset, and their voltages are increased to prescribed values.

Then, when the reset signal applied to the TG lines is turned off, the photodiodes PD start the photo detection. Electrons are generated in the photodiodes PD, and the voltages of the photodiodes PD gradually decrease.

Next, a reset signal is globally applied to the select/RST lines of all the rows to reset only the floating diffusions FD. When the reset signal is applied to the select/RST lines, the floating diffusions FD are reset, and voltages of the floating diffusions FD are stabilized at a prescribed value reflecting a reset voltage VR (=VR1).

Then, the TG lines of all the rows are turned on to transfer the charges in the photodiodes PD to the floating diffusions FD. Thus, the voltages of the floating diffusions FD are decreased by amounts of the transferred charges.

When the floating diffusions FD are globally reset, the select transistors SELECT are turned on together with the reset transistors RST. Accordingly, it is preferable to retain the signal read lines in high-impedance state in which the signal read lines are shut off from the peripheral read circuit.

Then, the reading operation is performed sequentially on the first row. In the present embodiment, the reading operation is performed, for example, first on the $n^{th}$ row and then on the $n+1^{th}$ row.

First, to read the $n^{th}$ row, a select signal is applied to the select/RST line of the $n^{th}$ row. Then, voltages decreased by voltage change amounts $\Delta V$ corresponding to amounts of electrons stored in the photodiodes PD, i.e., voltages corresponding to (a reset voltage VR)−(a threshold voltage $V_{th}$)−(voltage change amounts $\Delta V$) are outputted to the signal read lines ($V_{signal}$ read).

Then, when a reset signal is applied to the select/RST line of the $n^{th}$ row, the floating diffusions FD are reset, and voltages of the floating diffusions FD are stabilized at a prescribed value reflecting the reset voltage VR (=VR2). This voltage is applied to the gate terminals of the source follower transistors SF-Tr. Voltages corresponding to (the reset voltage VR)−(the threshold voltage $V_{th}$) are outputted to the signal read lines (VR read).

Next, differences between the VR read voltages (VR−$V_{th}$) and the $V_{signal}$ read voltages (VR−$V_{th}$−ΔV) are given by the signal read/noise canceller circuit 12, and the voltage change amounts ΔV are given. Thus, for the pixels of the $n^{th}$ row, output voltage changes accompanying threshold voltage variations of the source follower transistors SF-Tr of the respective pixels are cancelled, and the voltage change amounts ΔV corresponding to the amounts of electrons stored in the photodiodes PD can be accurately read.

Then, to read the n+1$^{th}$ row, a select signal is applied to the select/RST line of the n+1$^{th}$ row. Then, voltages decreased by voltage change amounts ΔV corresponding to amounts of electrons stored in the photodiodes PD, i.e., (the reset voltage VR)−(the threshold voltage $V_{th}$)−(voltage change amounts ΔV) are outputted to the signal read lines ($V_{signal}$ read).

At this time, the reset transistors RST of the $n^{th}$ row are turned on, and the floating diffusions FD are reset without any trouble, because the $n^{th}$ row has been already read.

Then, a reset signal is applied to the select/RST line of the n+1$^{th}$ row, and the floating diffusions FD are reset. Voltages of the floating diffusions FD are stabilized at a prescribed voltage reflecting the reset voltage VR (=VR2). This voltage is applied to the gate terminals of the source follower transistors SF-Tr. Then, a voltage corresponding to (the reset voltage VR)−(the threshold voltage $V_{th}$) is outputted to the signal read lines (VR read).

Next, differences between the VR read voltages (VR−$V_{th}$) and the $V_{signal}$ read voltages (VR−$V_{th}$−ΔV) are given by the signal read/noise canceller circuit 12 to give voltage change amounts ΔV. Thus, for the pixels of the n+1$^{th}$ row, output voltage changes accompanying the threshold voltage variations of the source follower transistors SF-Tr of the respective pixels are cancelled to thereby accurately read the voltage change amounts corresponding to the amounts of electrons stored in the photodiodes PD.

The above-described string of reading operations is performed sequentially on the respective pixels, whereby optical signals detected by the photodiodes PD can be read.

In the above-described photo detection—read sequence, when the "VR read" on the $n^{th}$ line is performed, the select line of the n+1$^{th}$ row, which has the signal common with the RST line of the $n^{th}$ row is turned on, there is a possibility that VR−$V_{th}$ (n+1)−ΔV (n+1) may be outputted from the n+1$^{th}$ row to the signal read lines. Especially, when a light amount is small (dark), ΔV (n+1)≈0 V, and when $V_{th}$ (n+1) is sufficiently smaller than $V_{th}$ (n), the VR read from the $n^{th}$ row is $$VR-V_{th}(n)<VR-V_{th}(n+1).$$

There is a possibility that the VR read from the $n^{th}$ row is hindered by the n+1$^{th}$ row.

For the prevention of such occurrence, the reset voltage VR=VR1 for the global reset and the reset voltage VR2 for the read from the respective rows may be changed to be VR1<VR2. Thus, upon the "VR read" from the $n^{th}$ row, even when the select line of the n+1$^{th}$ row is turned on, the VR read voltage (VR2−$V_{th}$ (n)) to be outputted from the $n^{th}$ row can be kept from being influenced. Specifically, when VR2=VR1+ 0.1 V or more, it is possible that VR2−$V_{th}$ (n)>VR1−$V_{th}$ (n+1). The VR read from the $n^{th}$ row can be performed without failure.

In the global shutter mode, charges stored in the photodiodes PD of the respective pixels are globally transferred to the floating diffusions FD, and then the charges of the floating diffusions FD of the respective pixels are sequentially read. Accordingly, a period of time in which the charges must be held in the floating diffusions FD is longer by 10 s msec. To prevent changes of the charge amounts in the floating diffusions FD due to photo detection in a time of standby for the read, it is very important to cover the floating diffusions FD with the metal interconnection layer.

As described above, in the solid-state image sensor according to the present embodiment, the gate electrodes of the reset transistors RST of the $n^{th}$ row, and the gate electrodes $28_{SEL}$ of the select transistors SELECT of the n+1$^{th}$ row are formed in one pattern, whereby the layout of the upper metal interconnection layer can have freedom. This allows the third metal interconnection layer to form the RST lines alone, which permits the third metal interconnection layer to have the function of the light shield film. Accordingly, the floating diffusions FD can be sufficiently shielded, which is very effective to use the global shutter mode.

As described above, according to the present embodiment, the gate electrodes of the reset transistors and the gate electrodes of the select transistors are formed in one continuous pattern, which can save one contact holes for connecting the first metal interconnection layer to the lower layer. This gives allowance to the layout of the metal interconnection layer. This also gives allowance to the area, which allows the floating diffusions to have a larger area, and the junction leakage can be decreased. The transfer transistors can have readily a larger gate width.

The third metal interconnection layer may form the RST lines alone, and can be used as the light shield film for shielding the floating diffusions. Accordingly, in the reading by the global shutter mode, good images without "deflections" and "distortions" can be provided.

In the present embodiment, the TG lines are formed of the third metal interconnection layer 62. However, in the global shutter mode, the TG lines are always globally turned on/off. Accordingly, the TG lines 62$e$ are not necessary for the respective rows. The TG lines 62$e$ may have, e.g., the same pattern as the light shield film 62$b$ shown in FIG. 12.

A Tenth Embodiment

The solid-state image sensor according to a tenth embodiment of the present invention will be explained with reference to FIGS. 46 to 49.

FIGS. 46 to 49 are plan views of the solid-state image sensor according to the present embodiment, which show a structure thereof. The same members of the present embodiment as those of the solid-state image sensor according to the first to the ninth embodiments shown in FIGS. 1 to 45 are represented by the same reference numbers not to repeat or to simplify their explanation.

The solid-state image sensor according to the present embodiment is the same as the solid image sensor according to the ninth embodiment in the circuit diagram, the operation and the fabrication method except that plan layouts of the respective layers are different from those of the solid-state image sensor according to the ninth embodiment. That is, in the solid-state image sensor according to the present embodiment as well, an RST line commonly connecting the gate terminals of the reset transistors RST of the respective pixels of the $n^{th}$ row, and a select line commonly connecting the gate terminals of the select transistors SELECT of the respective pixels of the n+1$^{th}$ row are formed in a common signal line (select/RST line).

Figure 46:
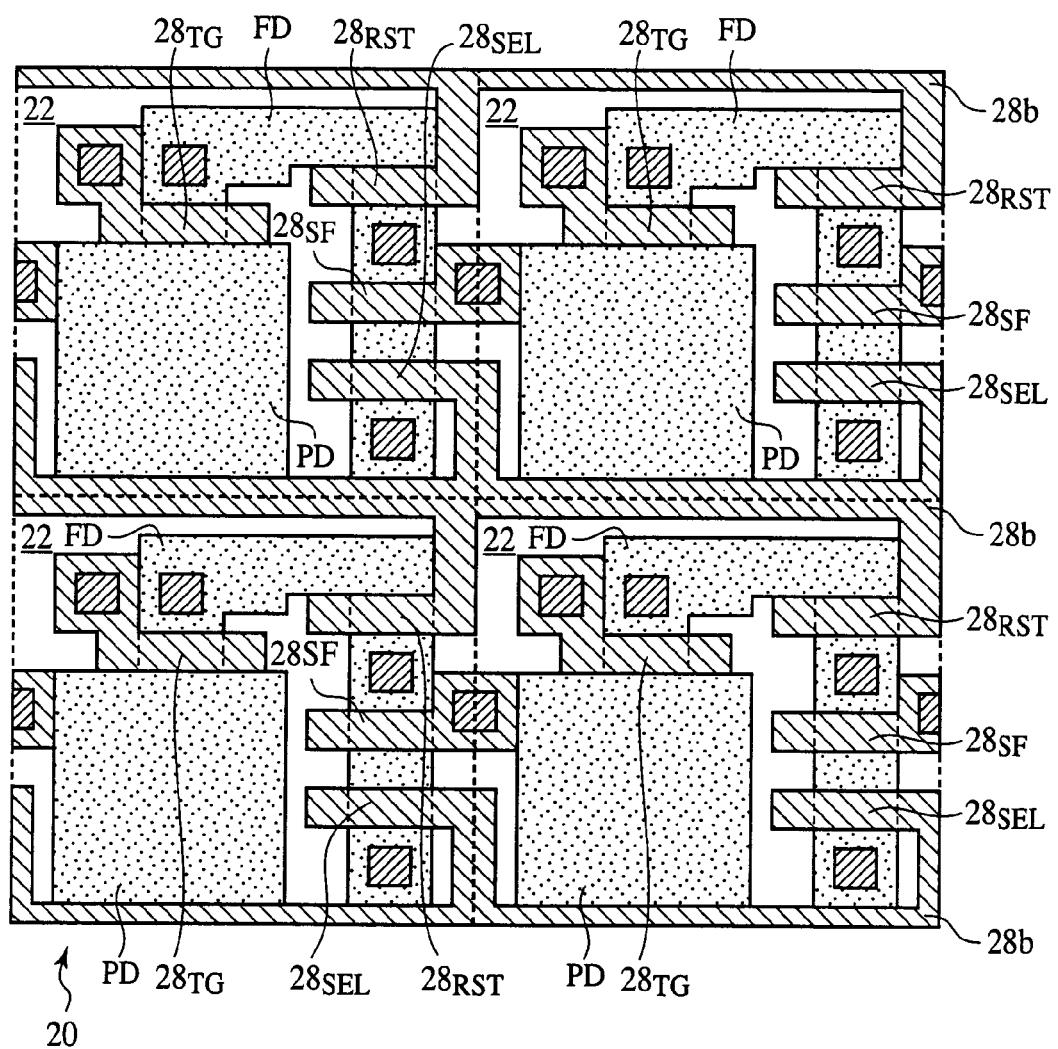
FIGS. 46-49 are plan views of the solid-state image sensor according to a tenth embodiment of the present invention which show a structure thereof.
Figure 47:
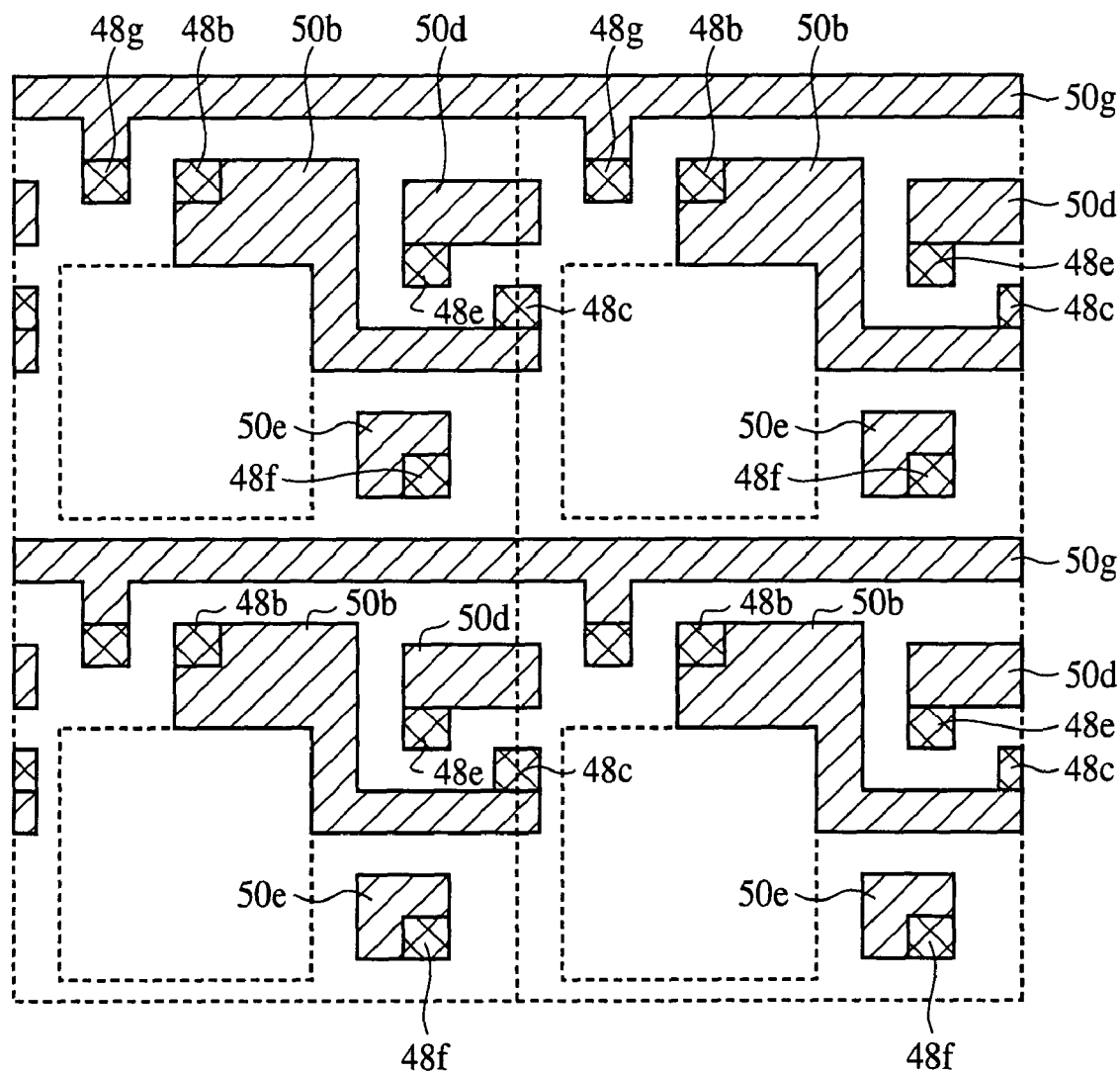
Figure 48:
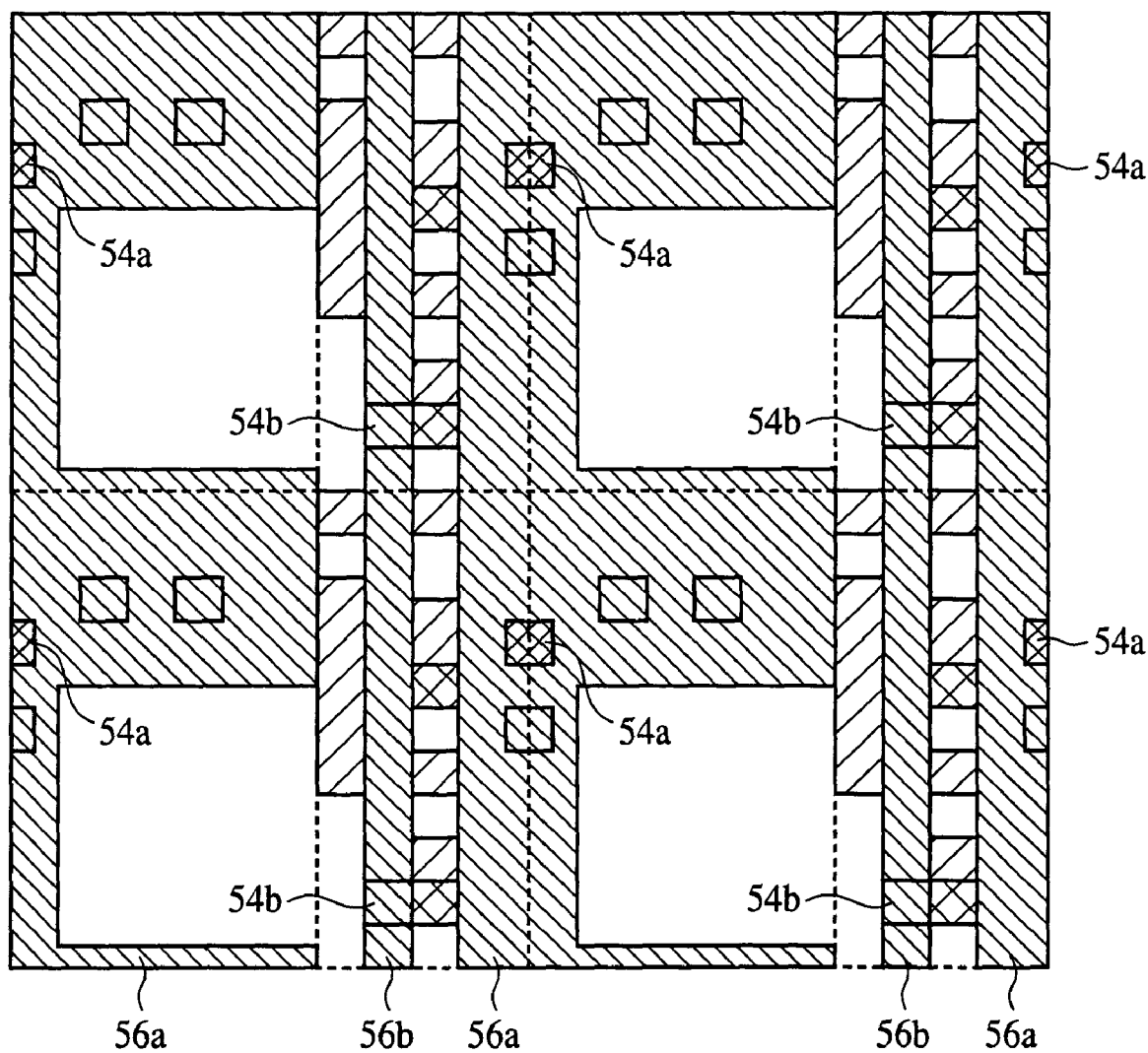
Figure 49:
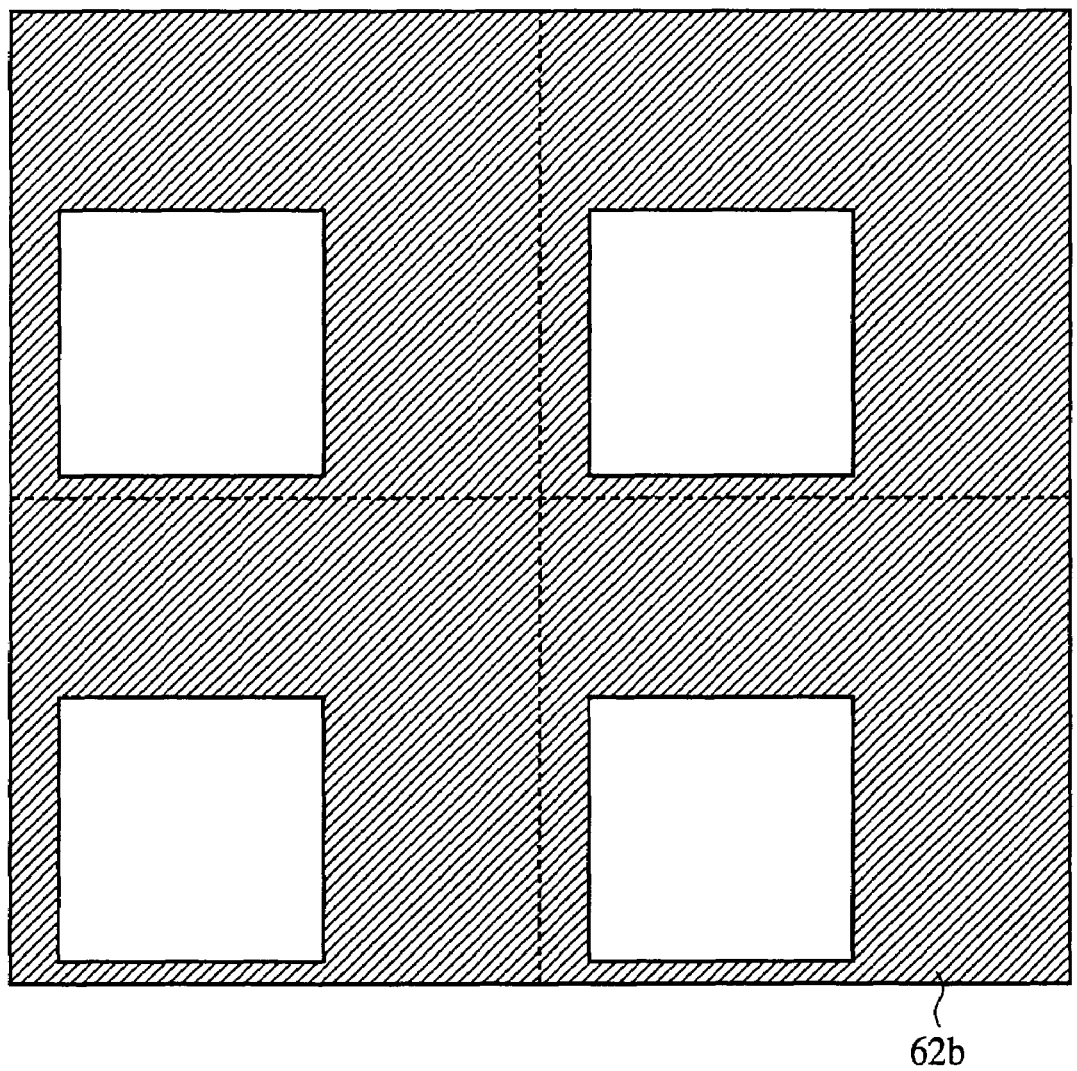

The structure of the solid-state image sensor according to the present embodiment will be specifically explained with reference to FIGS. 46 to 49. FIG. 46 is a plan view of a layout of the active regions and the gate interconnection in the pixel array unit. FIG. 47 is a plan view of a layout of the first metal interconnection in the pixel array unit. FIG. 48 is a plan view of the second metal interconnection in the pixel array unit. FIG. 49 is a plan view of a layout of third metal interconnection in the pixel array unit.

As shown in FIG. 46, the active regions are defined on a silicon substrate 20 by a device isolation film 22. Each active region contains a wide rectangular region as a photodiode region, and a substantially bracket-shaped region continuous to the photodiode region.

In each active region, four gate electrodes 28 are formed bridging above the active region. These gate electrodes 28 are, from the side of the photodiode region, the gate electrode $28_{TG}$ of a transfer transistor TG, the gate electrode $28_{RST}$ of a reset transistor RST, the gate electrode $28_{SF}$ of a source follower transistor SF-Tr, and the gate electrode $28_{SEL}$ of a select transistor SELECT. The select/RST line is formed of the same conducting layer (gate interconnection) as the gate electrodes 28. The select/RST line 28b, the gate electrode $28_{RST}$ connected to the select/RST line 28b and the gate electrode $28_{SEL}$ connected to the select/RST line 28b are formed in one pattern.

As shown in FIG. 47, a first metal interconnection layer 50 includes a TG line 50i connected to the gate electrode $28_{TG}$ via a contact plug 48g, an interconnection layer 50b interconnecting the floating diffusion FD region and the gate electrode $28_{SF}$ via a contact plug 48b and a contact plug 48c, and outgoing lines 50d, 50e respectively connected to the drain regions of the reset transistor and the source follower transistor SF-Tr, and the source region of the select transistor SELECT respectively via a contact plug 48e and a contact plug 48f.

As shown in FIG. 48, the second metal interconnection layer 56 includes a VR line 56a electrically connected to the drain regions of the reset transistor RST and the source follower transistor SF-Tr via a contact plug 54a, and an outgoing line 56b electrically connected to the source region of the select transistor SELECT via a contact plug 54b.

As shown in FIG. 49, the third metal interconnection layer 62 forms no signal line but a light shield film 62b which exposes the photodiode PD region and covers the rest region of the pixel containing the floating diffusion FD region.

As described above, the solid-state image sensor according to the present embodiment is characterized mainly in that the select/RST line 28b is formed of the gate interconnection, the gate electrode $28_{RST}$ connected to the select/RST line 28b and the gate electrode $28_{SEL}$ connected to the select/RST line 28b are formed in one continuous pattern, the first metal interconnection layer 50 forms the TG line 50i, the second metal interconnection layer 56 forms the VR line 56a and the signal read line 56b, and the third metal interconnection layer 62 forms the light shield film 62b.

Accordingly, as in the ninth embodiment, the layout of the upper metal interconnection layer can have freedom. The third metal interconnection layer must form no signal line but can be used as the light shield film. Accordingly, the floating diffusion FD can effectively shield, which is very effective to use the global shutter mode.

As shown in FIG. 46, the gate electrode $28_{RST}$, the gate electrode $28_{SF}$ and the gate electrode $28_{SEL}$ are formed in parallel with each other in the column direction in the right region in the pixel. In the left region in the pixel, the gate electrode $28_{TG}$ and the photodiode PD are adjacently formed in the column direction. All the gate electrodes are extended in the row direction, i.e., with the gate width extended in the row direction. The gate electrodes 28 are thus arranged, whereby the floating diffusion FD can be elongated in the row direction with the area of the photodiode PD retained, and the area of the floating diffusion FD can be increased. The gate electrode $28_{TG}$ is arranged in the direction of the extension of the floating diffusion FD (in the row direction), whereby the channel width of the transfer transistor can be readily increased. The reset transistor RST is positioned near the upper end of the pixel, and the select transistor SELECT is positioned near the lower end of the pixel, whereby the gate electrode $28_{RST}$ and the gate electrode $28_{SEL}$ can be readily interconnected.

As described above, according to the present embodiment, the select/RST line, the gate electrode of the transfer transistor and the gate electrode of the select transistor are formed in one continuous pattern, whereby the layouts of the metal interconnection layers can have allowance. The area can have allowance, which allows the floating diffusion to have the area increased, and the junction leakage can be decreased. The transfer transistor can have the gate width increased.

The third metal interconnection layer must form no signal line but can be used to form the light shield film. Accordingly, in reading by the global shutter mode, good images without "deflections" and "distortions" can be provided.

An Eleventh Embodiment

The solid-state image sensor according to an eleventh embodiment of the present invention will be explained with reference to FIGS. 50 to 53.

FIGS. 50 to 53 are plan views of the solid-state image sensor according to the present embodiment, which show a structure thereof. The same members of the present embodiment as those of the solid-state image sensor according to the first to the tenth embodiments shown in FIGS. 1-49 are represented by the same reference numbers not to repeat or to simplify their explanation.

The solid-state image sensor according to the present embodiment is the same as the solid-state image sensor according to the ninth embodiment in the circuit diagram, the operation and the fabrication method except that plane layouts of the respective layers are different from those of the solid-state image sensor according to the ninth embodiment. That is, in the solid-state image sensor according to the present embodiment as well, the RST line commonly connecting the gate terminals of the reset transistors RST of the respective pixels of the $n^{th}$ row and the select line commonly connecting the gate terminals of the selected transistors SELECT of the respect pixels of the $n+1^{th}$ row are formed in a common signal line (select/RST line).

Figure 50:
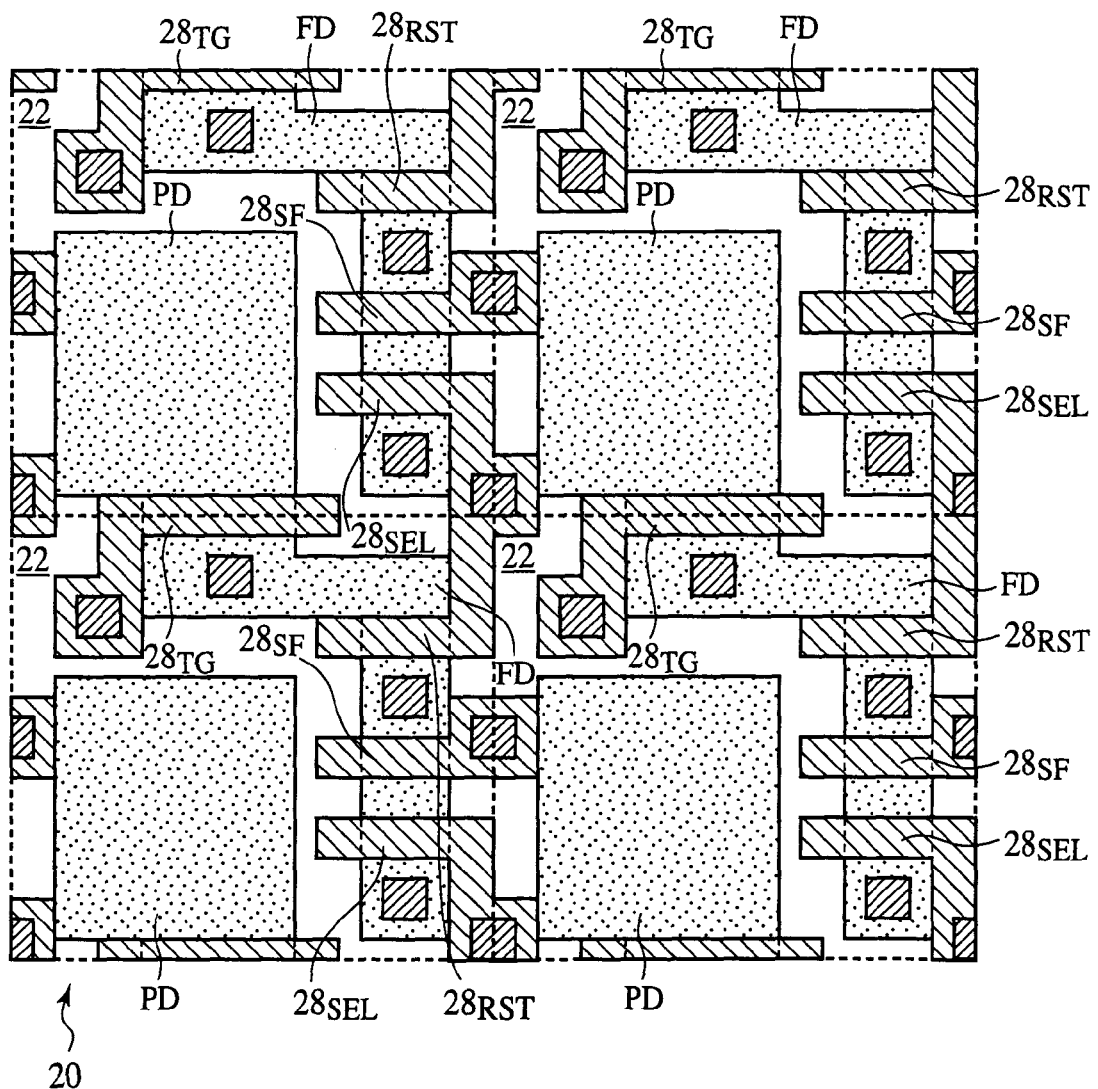
FIGS. 50-53 are plan views of the solid-state image sensor according to an eleventh embodiment of the present invention which show a structure thereof.
Figure 52:
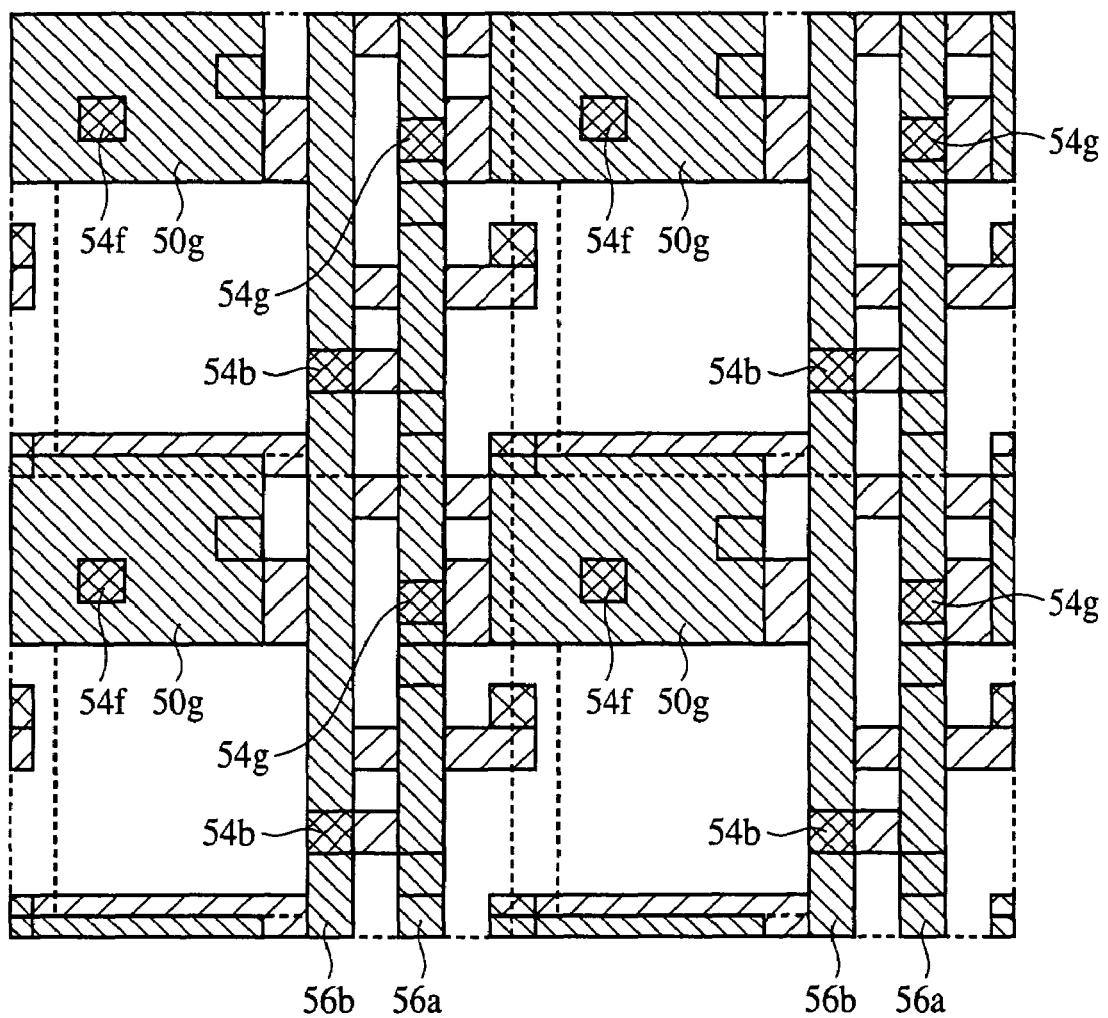
Figure 53:
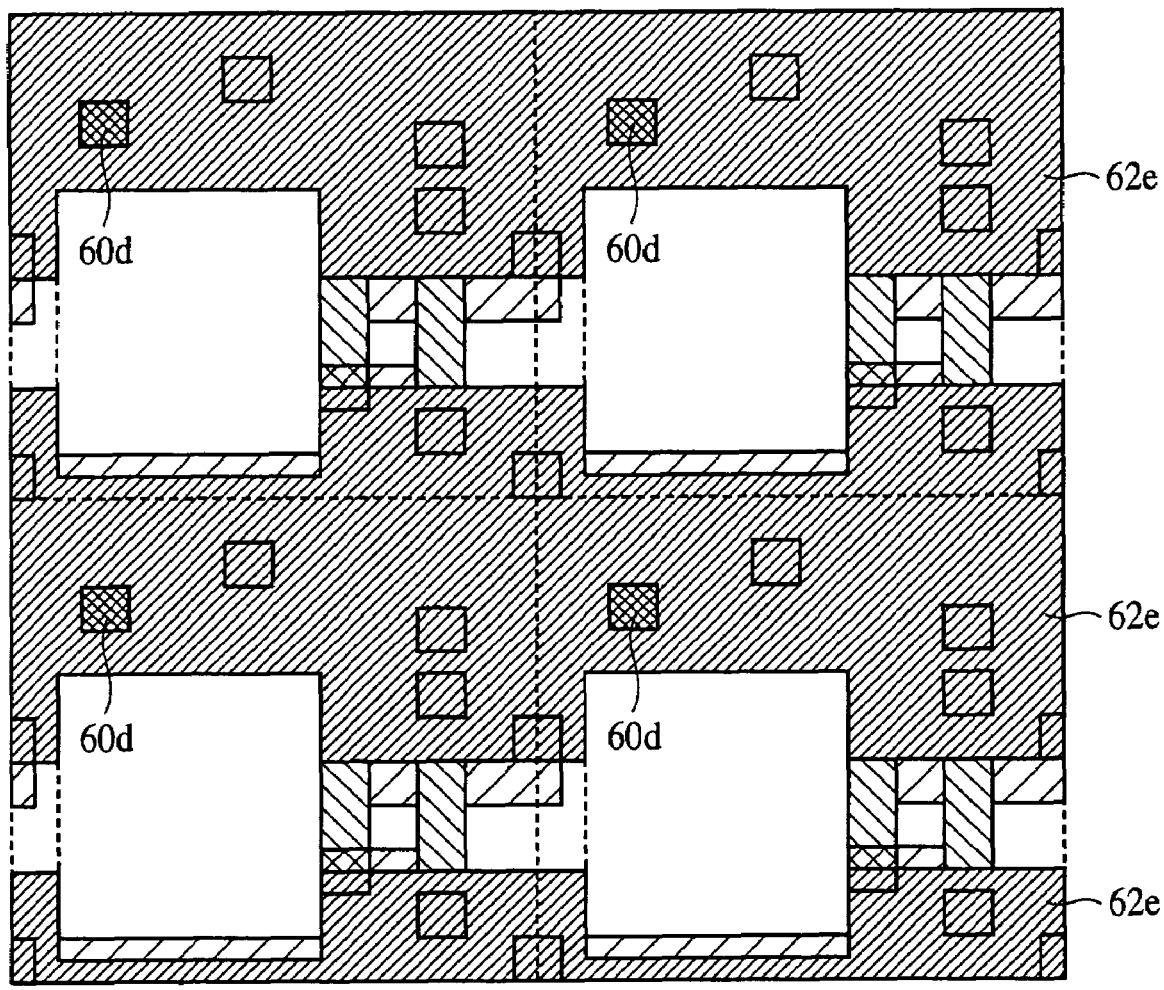

The structure of the solid-state image sensor according to the present embodiment will be specifically explained with reference to FIGS. 50 to 53. FIG. 50 is a plan view of a layout of the active regions and the gate interconnection in a pixel array unit. FIG. 52 is a plan view of a layout of the first metal interconnection in the pixel array unit. FIG. 52 is a plan view of a layout of the second metal interconnection in the pixel array unit. FIG. 53 is a plan view of a layout of the third metal interconnection in the pixel array unit.

As shown in FIG. 50, active regions are defined on a silicon substrate 20 by a device isolation film 22. Each active region contained a wide rectangular region as a photodiode region and a substantially L-shaped region continuous to the photodiode region.

In each active region, four gate electrodes 28 are formed bridging above the active region. The gate electrodes 28 are, from the side of the photodiode PD, the gate electrode $28_{TG}$ of a transfer transistor TG, the gate electrode $28_{RST}$ of a reset transistor RST, the gate electrode $28_{SF}$ of a source follower transistor SF-Tr and the gate electrode $28_{SEL}$ of a select transistor SELECT.

Figure 51:
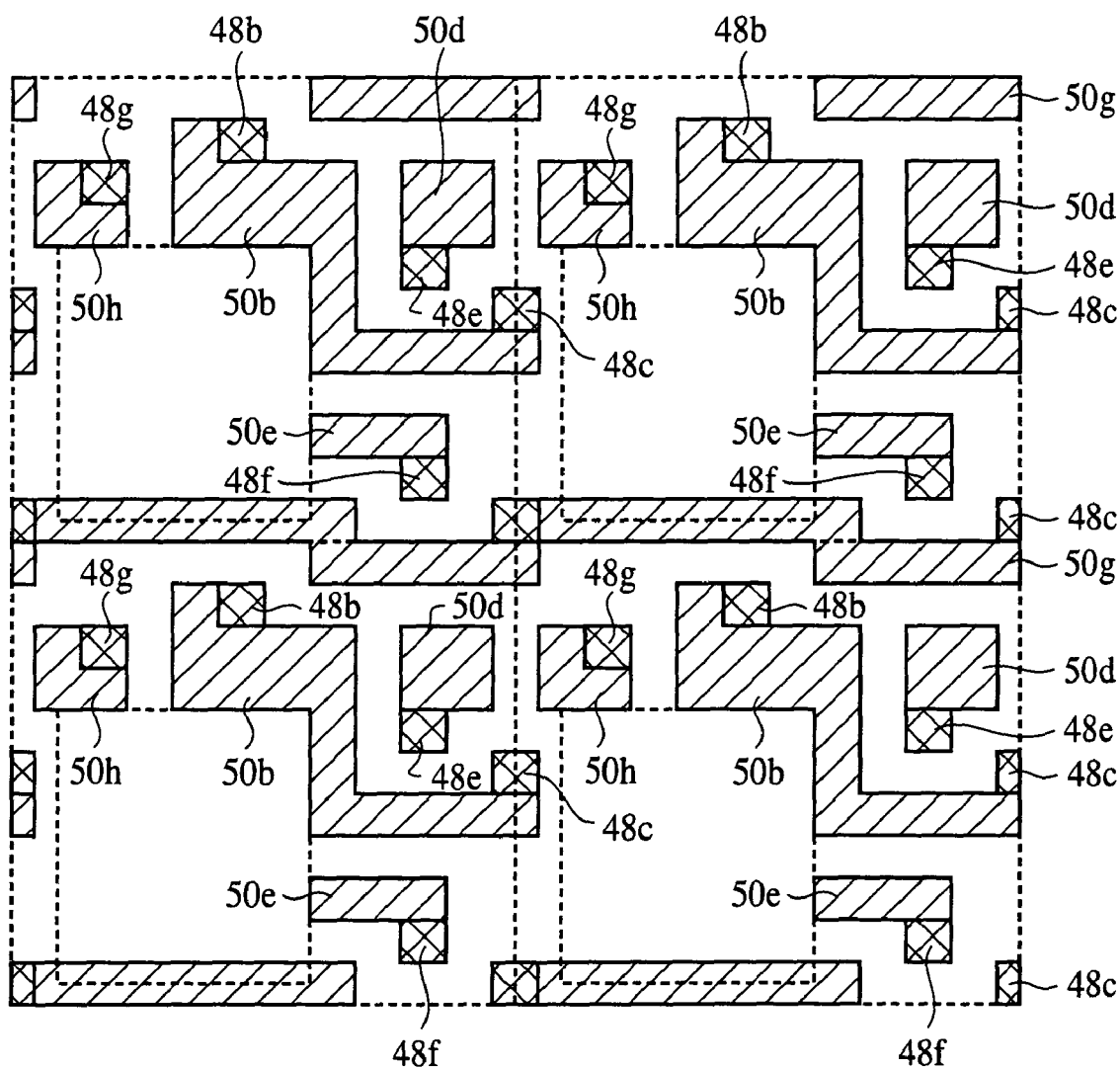

As shown in FIG. 51, the first metal interconnection layer 50 includes a select/RST line 50g connected to the gate electrode $28_{RST}$ and the gate electrode $28_{SEL}$ via a contact plug 48a, an interconnection layer 50b interconnecting the floating diffusion FD region and the gate electrode $28_{SF}$ via a contact plug 48b and a contact plug 48c, and outgoing lines 50h, 50d, 50e respectively connected to the gate electrode $28_{TG}$, the drain regions of the reset transistor RST and the source follower transistor SF-Tr, and the source region of the select transistor SELECT respectively via a contact plug 48g, a contact plug 48e and a contact plug 48f.

As shown in FIG. 52, the second metal interconnection layer 56 includes a VR line 56a electrically connected to the drain regions of the reset transistor RST and the source follower transistor SF-Tr, a signal read line 56b electrically connected to the source region of the select transistor SELECT via a contact plug 54b, and an outgoing line 56g electrically connected to the gate electrode $28_{TG}$ via a contact plug 54f.

As shown in FIG. 53, the third metal interconnection layer 62 includes a TG line 62e electrically connected to the gate electrode $28_{TG}$ via a contact plug 60d.

Here, the solid-state image sensor according to the present embodiment is characterized mainly in that the active region is formed, bridging the pixels regions adjacent to each other. That is, in terms of the pixel regions of the solid-state image sensor according to the ninth and the tenth embodiment, in the solid-state image sensor according to the present embodiment, the photodiode PD and the gate electrode $28_{TG}$ are positioned in one pixel region, and the rest constituent part is positioned in another pixel region adjacent thereto.

The active region is thus laid out, whereby the area of the floating diffusion FD and the channel width of the transfer transistor TG can be readily increased. The gate electrodes 28 are positioned with respect to the floating diffusion FD as shown in FIG. 32, whereby area variations of the floating diffusion FD due to misalignment of the gate electrodes 28 can be made small.

As described above, according to the present embodiment, the active region forming one pixel is formed, bridging two units of pixel regions, whereby the area of the floating diffusion and channel width of the transfer transistor can be readily increased. Area variations of the floating diffusion FD due to misalignment of the gate electrodes can be made small.

A Twelfth Embodiment

The solid-state image sensor according to a twelfth embodiment of the present invention will be explained with reference to FIGS. 54 to 57.

FIGS. 54 to 57 are plan views of the solid-state image sensor according to the present embodiment, which show a structure thereof. The same members of the present embodiment as those of the solid-state image sensor according to the first to the eleventh embodiments shown in FIGS. 1-53 are represented by the same reference numbers not to repeat or to simplify their explanation.

Figure 54:
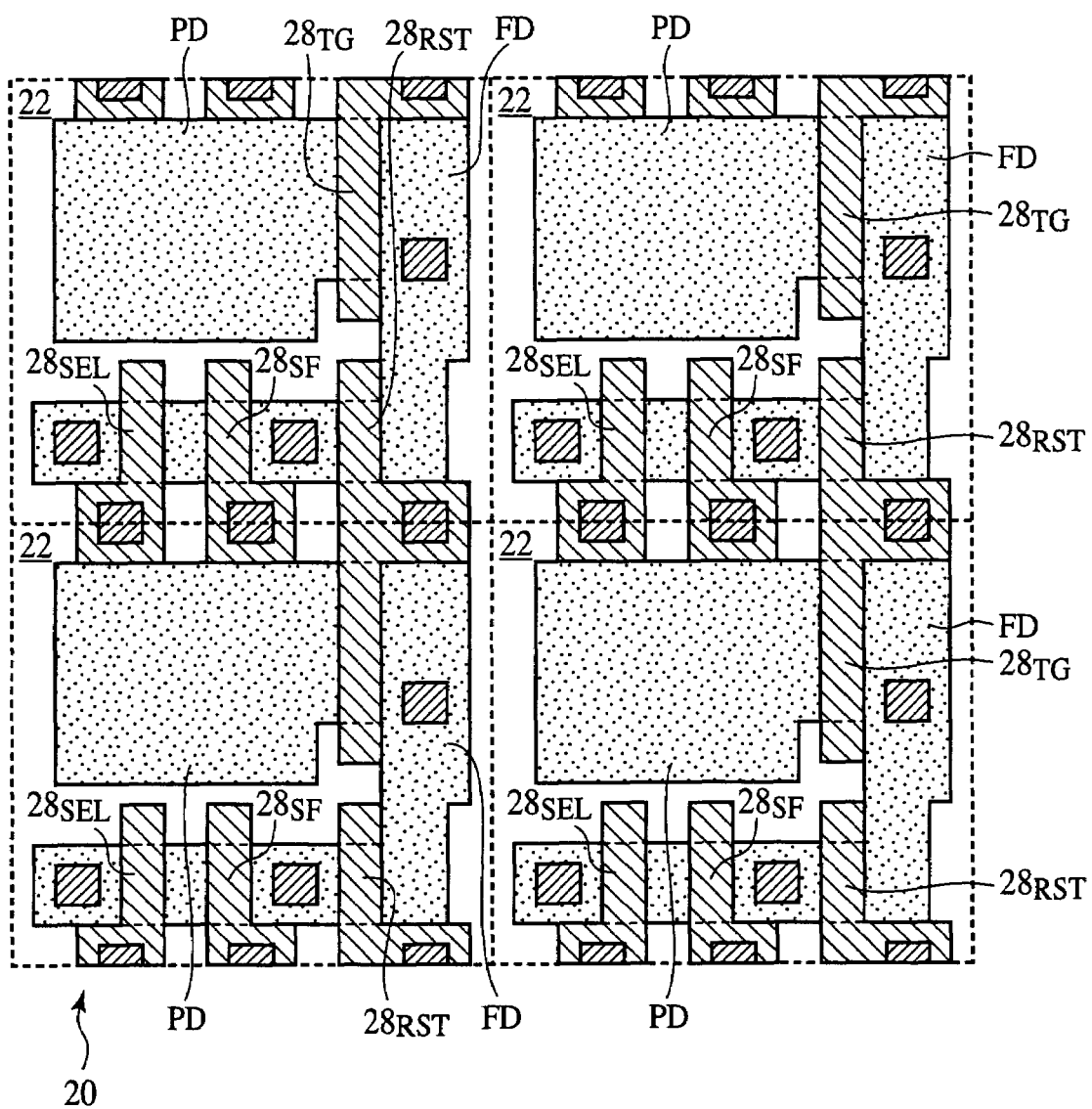
FIGS. 54-57 are plan views of the solid-state image sensor according to a twelfth embodiment of the present invention which show a structure thereof.
Figure 55:
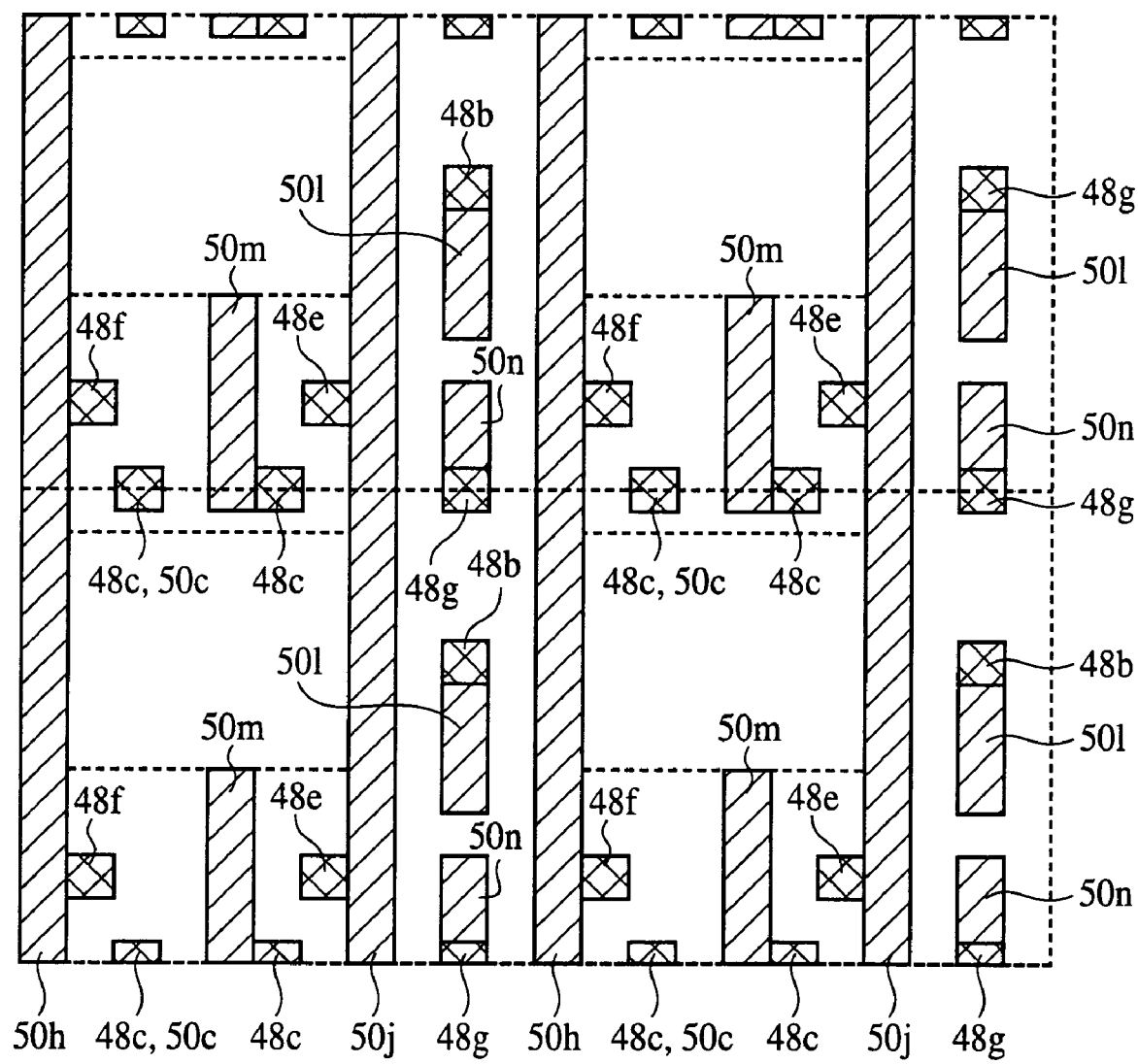
Figure 56:
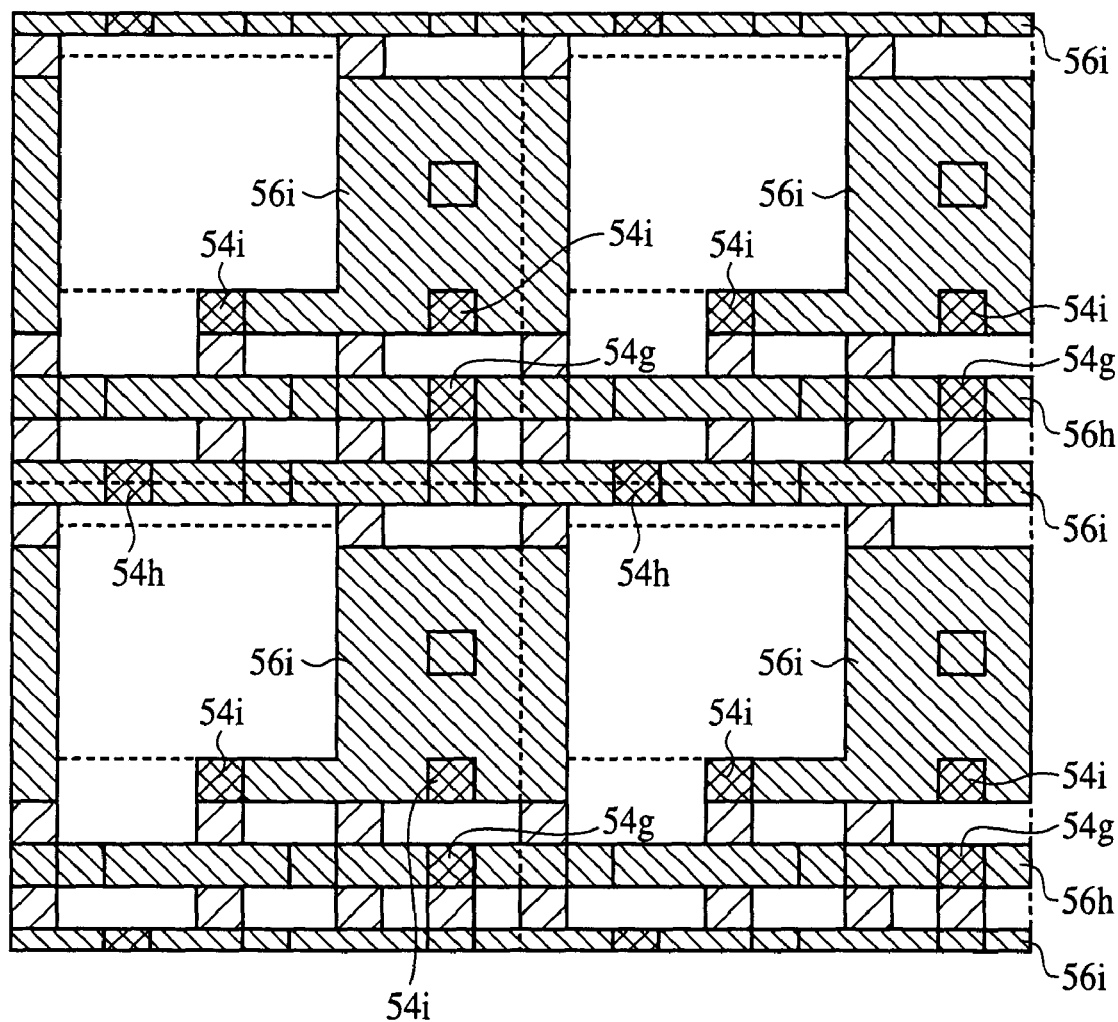
Figure 57:
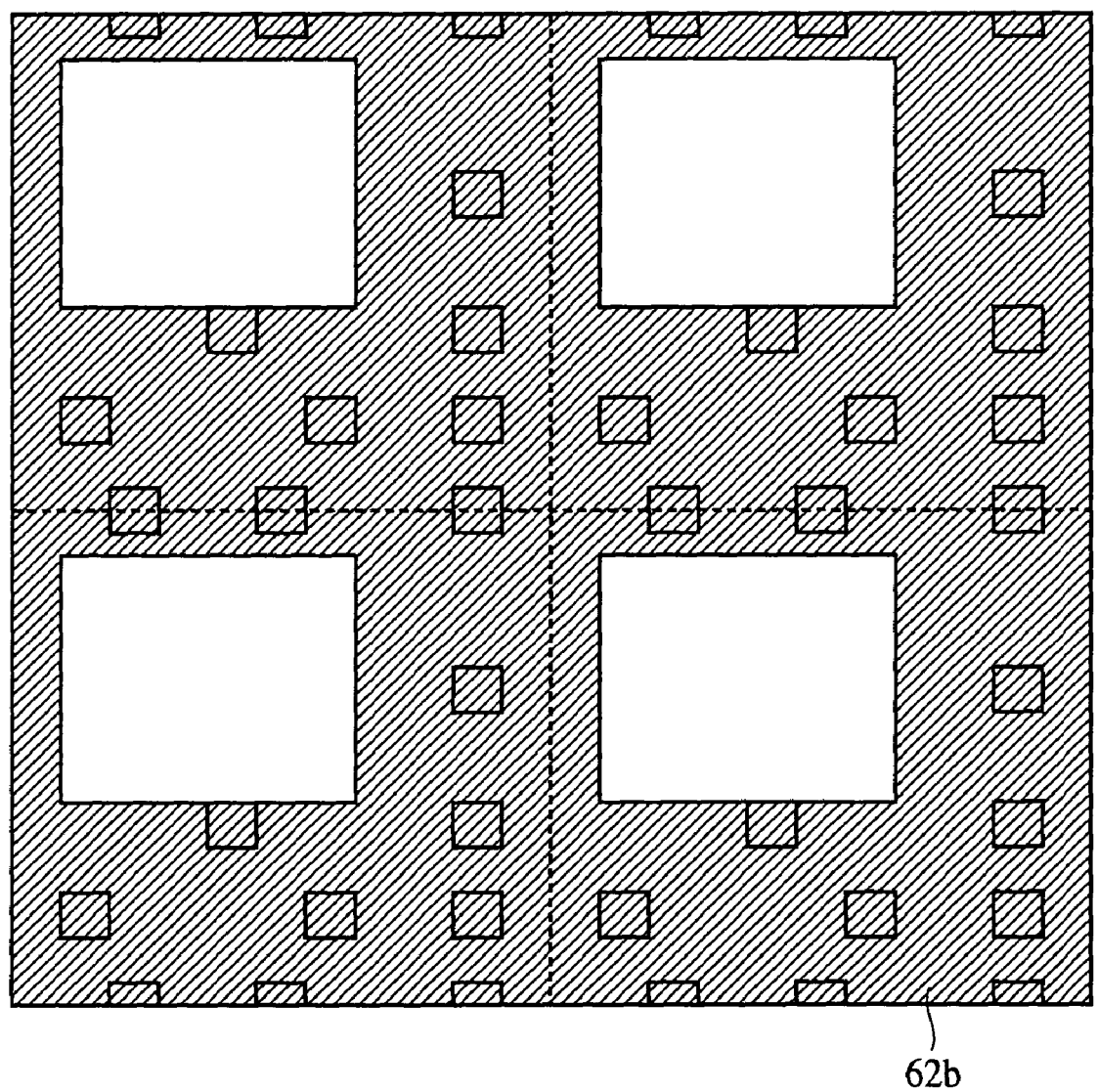

In the present embodiment, a plane layout of the solid-state image sensor having the RST line and the TG line made common. FIG. 54 is a plan view of a layout of the active regions and the gate interconnection in a pixel array unit. FIG. 55 is a plan view of a layout of the first metal interconnection in the pixel array unit. FIG. 56 is a plan view of a layout of the second metal interconnection in the pixel array unit. FIG. 57 is a plan view of a layout of the third metal interconnection in the pixel array unit.

As shown in FIG. 54, the active regions are defined on a silicon substrate 2 by a device isolation film 22. Each active region contains a wide rectangular region as a photodiode region and a substantially bracket-shaped region continuous to the photodiode region.

In each active region, four gate electrodes 28 are formed bridging above the active region. These active regions are, from the side of the photodiode PD region, the gate electrode $28_{TG}$ of a transfer transistor TG, the gate electrode $28_{RST}$ of a reset transistor RST, the gate electrode $28_{SF}$ of the source follower transistor SF-Tr, and the gate electrode $28_{SEL}$ of a select transistor SELECT. The gate electrode $28_{TG}$ is formed in one pattern continuous to the gate electrode $28_{RST}$ of a pixel adjacent in the column direction.

As shown in FIG. 55, the first metal interconnection layer 50 includes a VR line 50j connected to the drain regions of the reset transistor RST and the source follower transistor SF-Tr via a contact plug 48e, a signal read line 50k connected to the source region of the select transistor SELECT via a contact plug 48f, and outgoing lines 50l, 50m, 50n, 50o respectively connected to the floating diffusion FD, the gate electrode $28_{SF}$, the gate electrodes $28_{TG}$, $28_{RST}$, and the gate electrode $28_{SEL}$ respectively via a contact plug 48b, a contact plug 48c, a contact plug 48g, and a contact plug 48h.

As shown in FIG. 56, the second metal interconnection layer 56 includes a TG/RST line 56h electrically connected to the gate electrodes $28_{TG}$, $28_{RST}$ via a contact plug 54g, a select line 56i electrically connected to the gate electrode $28_{SEL}$ via a contact plug 54h, and an interconnection layer 56j connected to the floating diffusion FD region and the gate electrode $28_{SF}$ via a contact plug 54i and a contact plug 54j.

As shown in FIG. 57, the third metal interconnection layer 62 forms no signal line but a light shield film 62b which exposes the photodiode PD region but covers the rest region of the pixel containing the floating diffusion FD region.

As described above, the solid-state image sensor according to the present embodiment is characterized mainly in that the gate electrodes $28_{TG}$ of the transfer transistors TG of the pixels of the $n^{th}$ row and the gate electrodes $28_{RST}$ of the reset transistors RST of the pixels of the $n+1^{th}$ row are formed in one pattern, the first metal interconnection layer 50 forms the VR line 50j and the signal read line 50k, the second metal interconnection layer 56 forms the TG/RST line 56h and the select line 56i, and the third metal interconnection layer 62 forms the light shield film 62b.

Accordingly, even in a case that the TG line and the RST line are formed of the common interconnection layer, the gate electrode $28_{TG}$ and the gate electrode $28_{RST}$, which are spaced from each other, do not have to be interconnected by the metal interconnection layer. Accordingly, one contact hole for contacting the first metal interconnection layer 50 to the lower layer can be saved, which give allowance to the layout of the metal interconnection layers.

Allowance is given to the area, which allows the floating diffusion FD to have a sufficient area. The floating diffusion FD having a sufficient area can have a low well concentration. Accordingly, electric fields can be mitigated, and the junction leakage can be decreased. The transfer transistor can have the gate width increased.

As shown in FIG. 54, the gate electrode $28_{RST}$, the gate electrode $28_{SF}$ and the gate electrode $28_{SEL}$ are formed in parallel with each other in the row direction in the lower region in the pixel. In the upper region in the pixel, the gate electrode $28_{TG}$ and the photodiode PD are arranged adjacent to each other in the row direction. All the gate electrodes are extended in the column direction, i.e., with the gate width extended in the column direction. The gate electrodes are thus arranged, whereby the floating diffusion FD can be extended in the column direction with the area of the photodiode PD retained, and the floating diffusion FD can have the area increased. The gate electrodes $28_{TG}$ is arranged in the direction of the extension of the floating diffusion FD (column direction), which permits the channel width of the transfer transistor to be readily increased. The transfer transistor TG is arranged at a position near the upper end of the pixel, and the reset transistor RST is positioned at a part near the lower end of the reset transistor RST, which permits the gate electrode $28_{TG}$ and the gate electrode $28_{RST}$ to be easily interconnected to each other.

As described above, according to the present embodiment, the gate electrode of the transfer transistor and the gate electrode of the reset transistor are formed in one continuous pattern, whereby one contact hole for connecting the first metal interconnection layer to the lower layer can be saved. This gives allowance to the layout of the metal interconnection layers and gives allowance also to the area, which allows the floating diffusion to have the area increased, and the junction leakage can be decreased. The transfer transistor can have the gate width readily increased.

A Thirteenth Embodiment

The solid-state image sensor according to a thirteenth embodiment of the present invention will be explained with reference to FIGS. 58 to 61.

FIGS. 58 to 61 are plan views of the solid-state image sensor according to the present embodiment, which show a structure thereof. The same members of the present embodiment as those of the solid-state image sensor according to the first to the twelfth embodiments shown in FIGS. 1 to 57 are represented by the same reference numbers not to repeat or to simplify their explanation.

Figure 58:
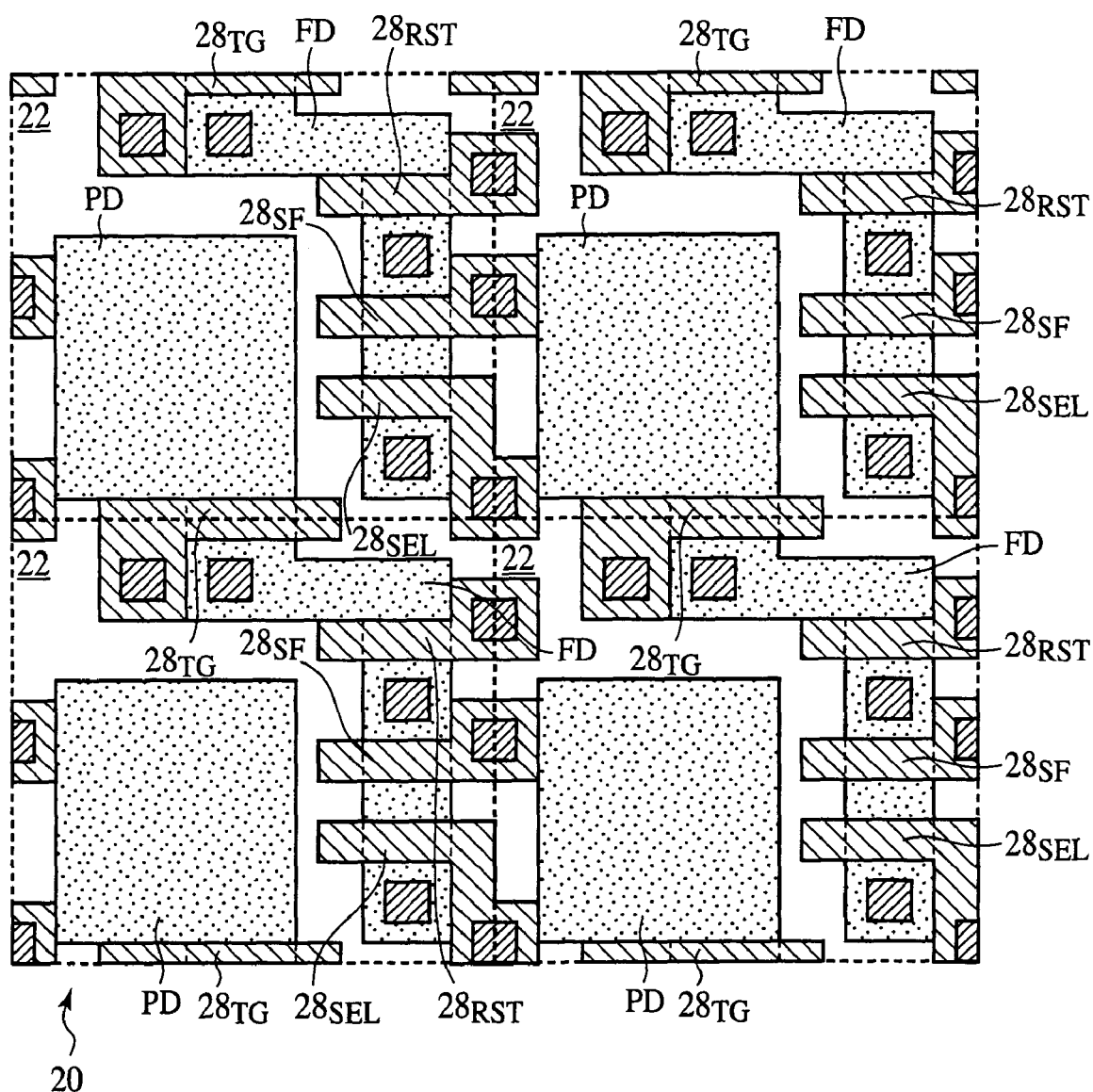
FIGS. 58-61 are plan views of the solid-state image sensor according to a thirteenth embodiment of the present invention which show a structure thereof.
Figure 59:
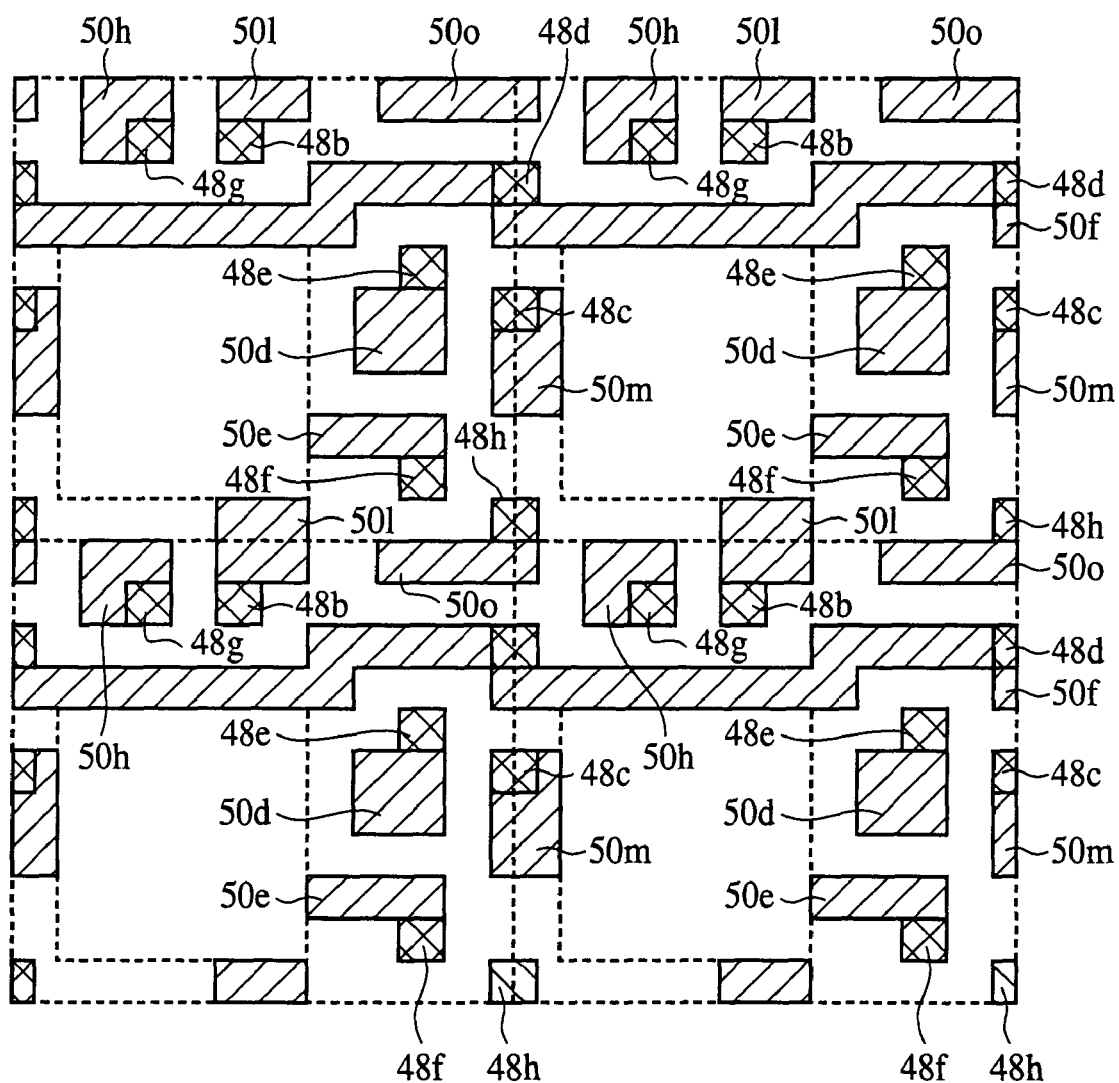
Figure 60:
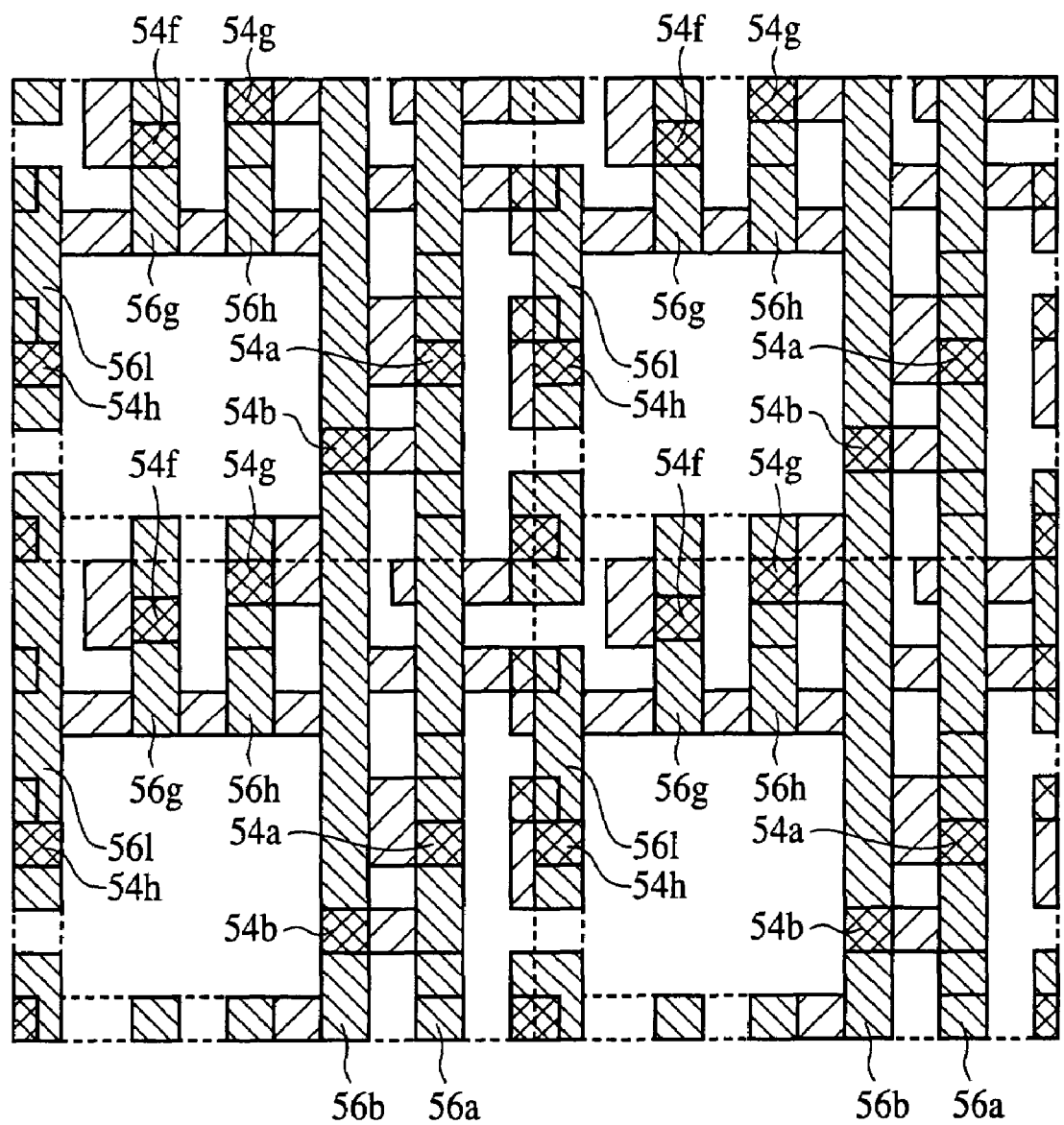
Figure 61:
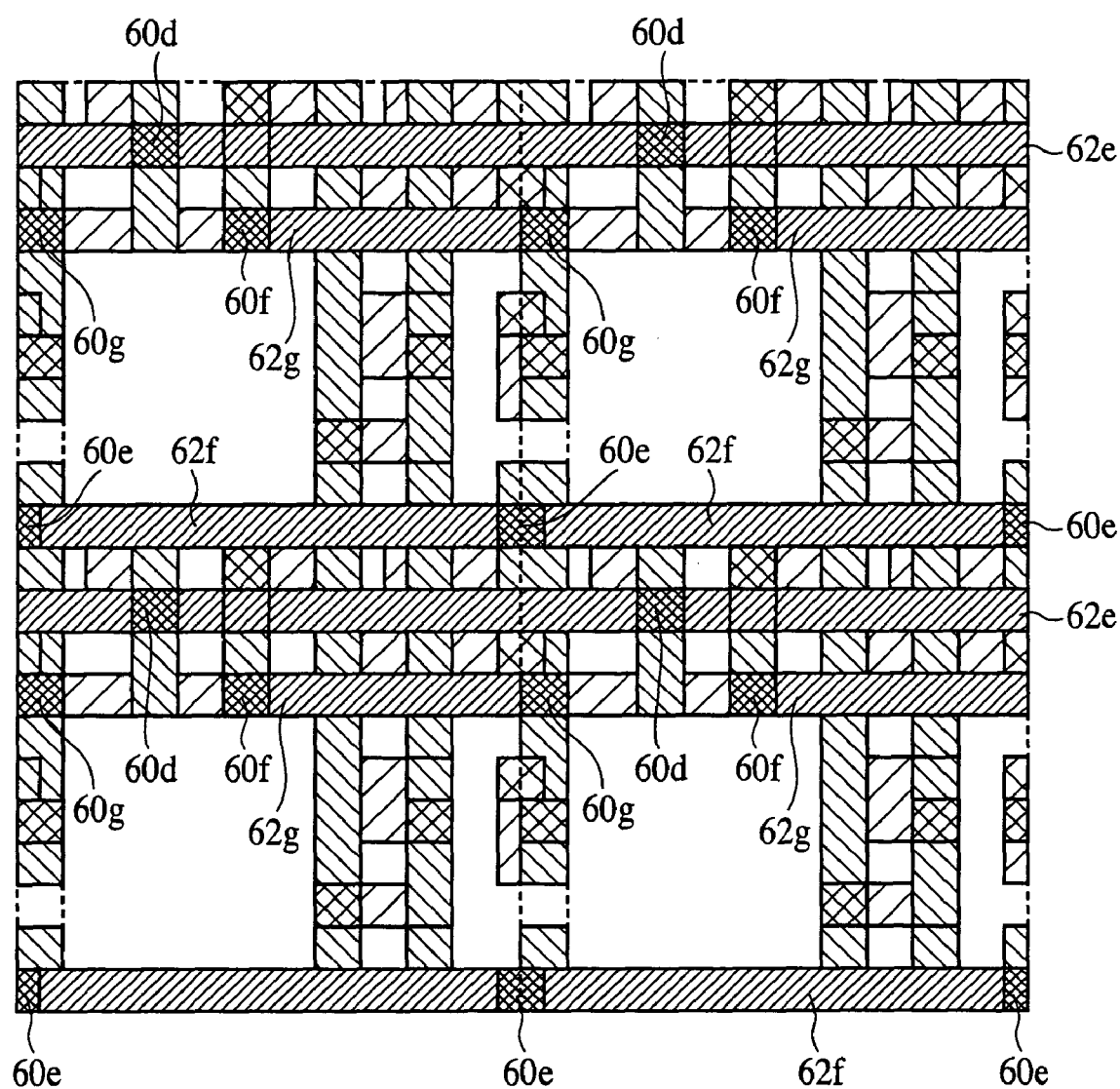
Figure 62:
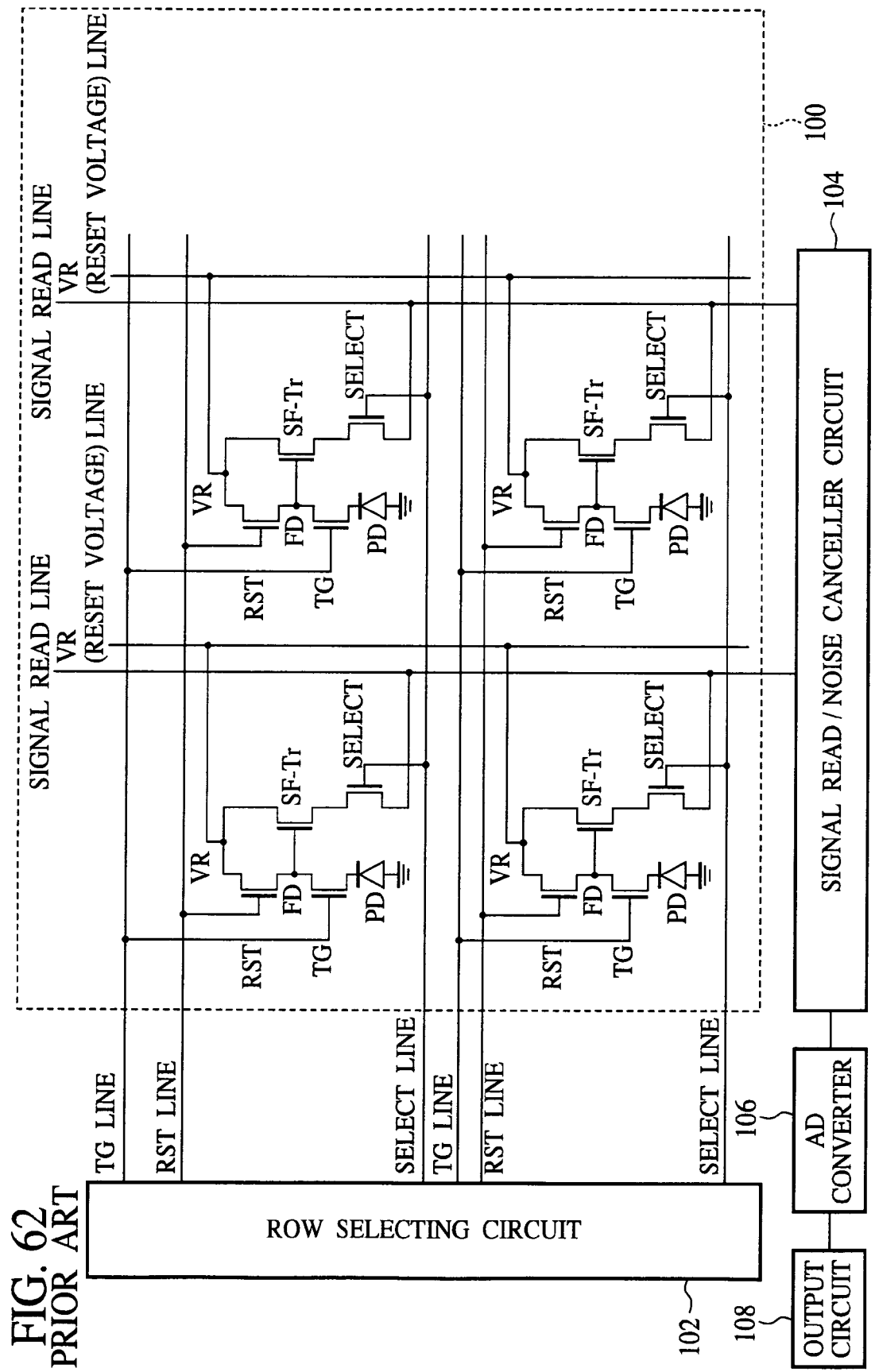
FIG. 62 is a circuit diagram of the conventional solid-state image sensor.

In the solid-state image sensor according to the present embodiment which includes 4-Tr-pixels having no common signal lines, a plane layout which allows the floating diffusions FD to have the area increased will be explained. FIG. 58 is a plan view of a layout of the active regions and the gate interconnection in a pixel array unit. FIG. 59 is a plan view of a layout of the first metal interconnection in the pixel array unit. FIG. 60 is a plan view of a layout of the second metal interconnection in the pixel array unit. FIG. 61 is a plan view of a layout of the third metal interconnection in the pixel array unit.

As shown in FIG. 58, active regions are defined on a silicon substrate 20 by a device isolation film 22. Each active region contains a wide rectangular region as a photodiode region, and a substantially L-shaped region continuous to the photodiode region.

Four gate electrodes 28 are formed bridging above the active region. These gate electrodes 28 are, from the side of the photodiode PD region, the gate electrode $28_{TG}$ of the transfer transistor TG, the gate electrode $28_{RST}$ of the reset transistor RST, the gate electrode $28_{SF}$ of the source follower transistor SF-Tr and the gate electrode $28_{SEL}$ of the select transistor SELECT.

As shown in FIG. 59, a first metal interconnection layer 50 includes a RST line 50f connected to the gate electrode $28_{RST}$ via a contact plug 48d, and outgoing lines 50h, 50m, 50o, 50l, 50d, and 50e respectively connected to the gate electrode $28_{TG}$, the gate electrode $28_{SF}$, the gate electrode $28_{SEL}$, the floating diffusion FD, the drain regions of the reset transistor RST and the source follower transistor SF-Tr, and the source region of the select transistor SELECT respectively via a contact plugs 48g, 48c, 48h, 48b, 48e, 48f.

As shown in FIG. 60, a second metal interconnection layer 56 includes a VR line 56a electrically connected to the drain regions of the reset transistor RST and the source follower transistor SF-Tr via a contact plug 54a, a signal read line 56b electrically connected to the source region of the select transistor SELECT via a contact plug 54b, and outgoing interconnection layers 56g, 56k, 56l electrically connected respectively to the gate electrode $28_{TG}$, the floating diffusion FD, the gate electrode $28_{SF}$ respectively via a contact plugs 54f, 54g, 54h.

As shown in FIG. 61, a third metal interconnection layer 62 includes a TG line 62e electrically connected to the gate electrode $28_{TG}$ via a contact plug 60d, a select line 62f electrically connected to the gate electrode $28_{SEL}$ via a contact plug 60e, and an interconnection layer 62g electrically connected to the floating diffusion FD and the gate electrode $28_{SF}$ via a contact plug 60f and a contact plug 60g.

Here, the solid-state image sensor according to the present embodiment is characterized mainly in that the active region is formed, bridging an adjacent pixel region. That is, in terms of the pixel region of the solid-state image sensor according to the first or the ninth embodiment, the photodiode FD and the gate electrode $28_{TG}$ are positioned in one pixel region, and the rest constituent part is positioned in an adjacent pixel region. The active region is thus laid out, whereby the transfer transistor TG can have the channel width readily increased.

As described above, according to the present embodiment, the active region of one pixel is formed, bridging a unit of two pixels, whereby the floating diffusion can have the area readily increased, and the transfer transistor can have the channel width readily increased.

Modifications

The present invention is not limited to the above-described embodiment and can cover other various modifications.

For example, in the above-described embodiments, the global shutter mode is described as the image reading method, but the image read may be performed by the rolling shutter mode.

In the solid-state image sensor according to the sixth embodiment, the self-aligned contact is used as the substrate contact, but the self-aligned contact may be used in the other embodiments.

What is claimed is:

1. A solid-state image sensor comprising:
a plurality of pixel units arranged in a row direction and a column direction, each of the plurality of pixel units including a photoelectric converter, a first transistor for transferring a signal generated by the photoelectric converter, a second transistor for amplifying the signal, a third transistor for resetting an input terminal of the second transistor, and a fourth transistor for reading the signal outputted by the second transistor;
a plurality of first signal lines extended in the row direction, each of the first signal lines being connected to gate electrodes of the first transistors of the pixel units arranged in the row direction; and
a plurality of second signal lines extended in the row direction, each of the second signal lines being connected to gate electrodes of the fourth transistors of the pixel units arranged in the row direction,
the first signal line connected to the gate electrodes of the first transistors of the pixel units of an $n^{th}$ row, and the second signal line connected to the gate electrodes of the fourth transistors of the pixel units of an n+1$^{th}$ row being formed of a common signal line, in each pair of the pixel units of the n$^{th}$ row and the n+1$^{th}$ row corresponding to each other, the gate electrode of the first transistor of the pixel unit of the n$^{th}$ row and the gate electrode of the fourth transistor of the pixel unit of the n+1$^{th}$ row being formed in one continuous pattern of a same conducting layer, wherein the photoelectric converter and the first transistor being adjacent to each other in the row direction, the second transistor and the third transistor being adjacent to each other in the column direction, the gate electrode of the first transistor and the gate electrode of the fourth transistor being arranged so that a gate width direction thereof corresponds to the column direction.

2. A solid-state image sensor according to claim 1, further comprising:

a plurality of third signal lines extended in the row direction, each of the third signal lines being connected to gate electrodes of the third transistors of the pixel units arranged in the row direction;

a plurality of fourth signal lines extended in the column direction, each of the fourth signal lines being for applying a reset voltage to the second transistors and the third transistors of the of pixel units arranged in the column direction; and a plurality of fifth signal lines extended in the column direction, each of the fifth signal lines being for reading the signals from the fourth transistors of the pixel units arranged in the column direction, the common signal lines of the first signal lines and the second signal lines being formed of a first metal interconnection layer, the third signal lines being formed of a second metal interconnection layer, the fourth signal lines and the fifth signal lines being formed of a third metal interconnection layer.

3. A solid-state image sensor according to claim 1, wherein the first signal line connected to the pixel units of the n$^{th}$ row, and the second signal line connected to the pixel units of the n+1$^{th}$ row, the gate electrodes of the first transistors of the pixels of the n$^{th}$ row and the gate electrodes of the fourth transistors of the n+1$^{th}$ row are formed in one continuous pattern of said conducting layer.

4. A solid-state image sensor according to claim 3, further comprising:

a plurality of third signal lines extended in the row direction, each of the third signal lines being connected to gate electrodes of the third transistors of the pixel units arranged in the row direction;

a plurality of fourth signal lines extended in the column direction, each of the fourth signal lines being for applying a reset voltage to the second transistors and the third transistors of the of pixel units arranged in the column direction; and a plurality of fifth signal lines extended in the column direction, each of the fifth signal lines being for reading the signals from the fourth transistors of the pixel units arranged in the column direction, the third signal lines being formed of a first metal interconnection layer, and the fourth signal lines and the fifth signal lines being formed of a second metal interconnection layer.

5. A solid-state image sensor according to claim 1, wherein a contact hole opened onto a source region of the third transistor and/or a contact hole opened onto a drain region of the third transistor are formed by self-alignment with a gate electrode of the third transistor.

6. A solid-state image sensor according to claim 1, wherein a contact hole opened onto a source region of the fourth transistor is formed by self-alignment with the gate electrode of the fourth transistor.

7. A solid-state image sensor comprising:

a plurality of pixel units arranged in a row direction and a column direction, each of the plurality of pixel units including a photoelectric converter, a first transistor for transferring a signal generated by the photoelectric converter, a second transistor for amplifying the signal, a third transistor for resetting an input terminal of the second transistor, and a fourth transistor for reading the signal outputted by the second transistor;

a plurality of first signal lines extended in the row direction, each of the first signal lines being connected to gate electrodes of the first transistors of the pixel units arranged in the row direction;

a plurality of second signal lines extended in the row direction, each of the second signal lines being connected to gate electrodes of the fourth transistors of the pixel units arranged in the row direction, a plurality of third signal lines extended in the row direction, each of the third signal lines being connected to gate electrodes of the third transistors of the pixel units arranged in the row direction;

a plurality of fourth signal lines extended in the column direction, each of the fourth signal lines being for applying a reset voltage to the second transistors and the third transistors of the pixel units arranged in the column direction; and a plurality of fifth signal lines extended in the column direction, each of the fifth signal lines being for reading the signals from the fourth transistors of the pixel units arranged in the column direction, the first signal line connected to the gate electrodes of the first transistors of the pixel units of an n$^{th}$ row, and the second signal line connected to the gate electrodes of the fourth transistors of the pixel units of an n+1$^{th}$ row being formed of a common signal line, in each pair of the pixel units of the n$^{th}$ row and the n+1$^{th}$ row corresponding to each other, the gate electrode of the first transistor of the pixel unit of the n$^{th}$ row and the gate electrode of the fourth transistor of the pixel unit of the n+1$^{th}$ row being formed in one continuous pattern of a same conducting layer, the common signal lines of the first signal lines and the second signal lines being formed of a first metal interconnection layer, the third signal lines being formed of a second metal interconnection layer, the fourth signal lines and the fifth signal lines being formed of a third metal interconnection layer.

\* \* \* \* \*